(12) United States Patent
Hanazaki et al.

(10) Patent No.: US 6,287,980 B1
(45) Date of Patent: Sep. 11, 2001

(54) PLASMA PROCESSING METHOD AND PLASMA PROCESSING APPARATUS

(75) Inventors: Minoru Hanazaki; Takayuki Ikushima; Kenji Shirakawa; Shinji Yamaguchi; Masakazu Taki, all of Tokyo (JP)

(73) Assignees: Mitsubishi Denki Kabushiki Kaisha; Mitsubishi Electric Engineering Co., Ltd., both of Tokyo (JP)

( * ) Notice: Subject to any disclaimer, the term of this patent is extended or adjusted under 35 U.S.C. 154(b) by 0 days.

(21) Appl. No.: 09/415,910

(22) Filed: Oct. 12, 1999

(30) Foreign Application Priority Data

Apr. 22, 1999 (JP) .................................................. 11-114885

(51) Int. Cl.$^7$ ................................................. H01L 21/00
(52) U.S. Cl. ......................... 438/726; 156/345; 216/69; 438/728; 438/732
(58) Field of Search ............................. 438/9, 710, 712, 438/726, 727, 728, 730, 732; 156/345, 345 P, 345 MT, 345 MW; 216/67, 69

(56) References Cited

U.S. PATENT DOCUMENTS

| | | | |
|---|---|---|---|
| 4,780,169 | * 10/1988 | Stark et al. | 156/345 |
| 5,102,523 | * 4/1992 | Beisswenger et al. | 156/345 X |
| 5,575,883 | * 11/1996 | Nishikawa | 156/345 |

FOREIGN PATENT DOCUMENTS

| | | |
|---|---|---|
| 4-73287 | 11/1992 | (JP) . |
| 7-263353 | 10/1995 | (JP) . |
| 10-223607 | 8/1998 | (JP) . |
| 10-270429 | 10/1998 | (JP) . |
| 10-270430 | 10/1998 | (JP) . |

* cited by examiner

Primary Examiner—William Powell
(74) Attorney, Agent, or Firm—Oblon, Spivak, McClelland, Maier & Neustadt, P.C.

(57) ABSTRACT

A plasma processing apparatus mainly comprises a processing chamber (10) formed by a vacuum vessel, a magnetic field forming coil (80) arranged around the processing chamber for forming a rotating magnetic field and gas supply means (101) supplying various gases to the processing chamber (10). The processing chamber (10) is divided into a reaction chamber (44) forming plasma with a partition wall (43) and a buffer chamber (45) discharging externally supplied gases with pressure difference. The reaction chamber (44) includes a high-frequency electrode arranged oppositely to the buffer chamber (45). The gas supply means (101) includes pulse gas valves (63a and 63b) for pulsatively supplying gases to the processing chamber (10). Thus provided are a plasma processing method and a plasma processing apparatus capable of uniformly processing a wafer having a large diameter and reducing RIE lag with respect to a fine etching pattern.

40 Claims, 35 Drawing Sheets

WAFER CENTER         WAFER EDGE

WAFER CENTER         WAFER EDGE

WAFER CENTER    WAFER EDGE

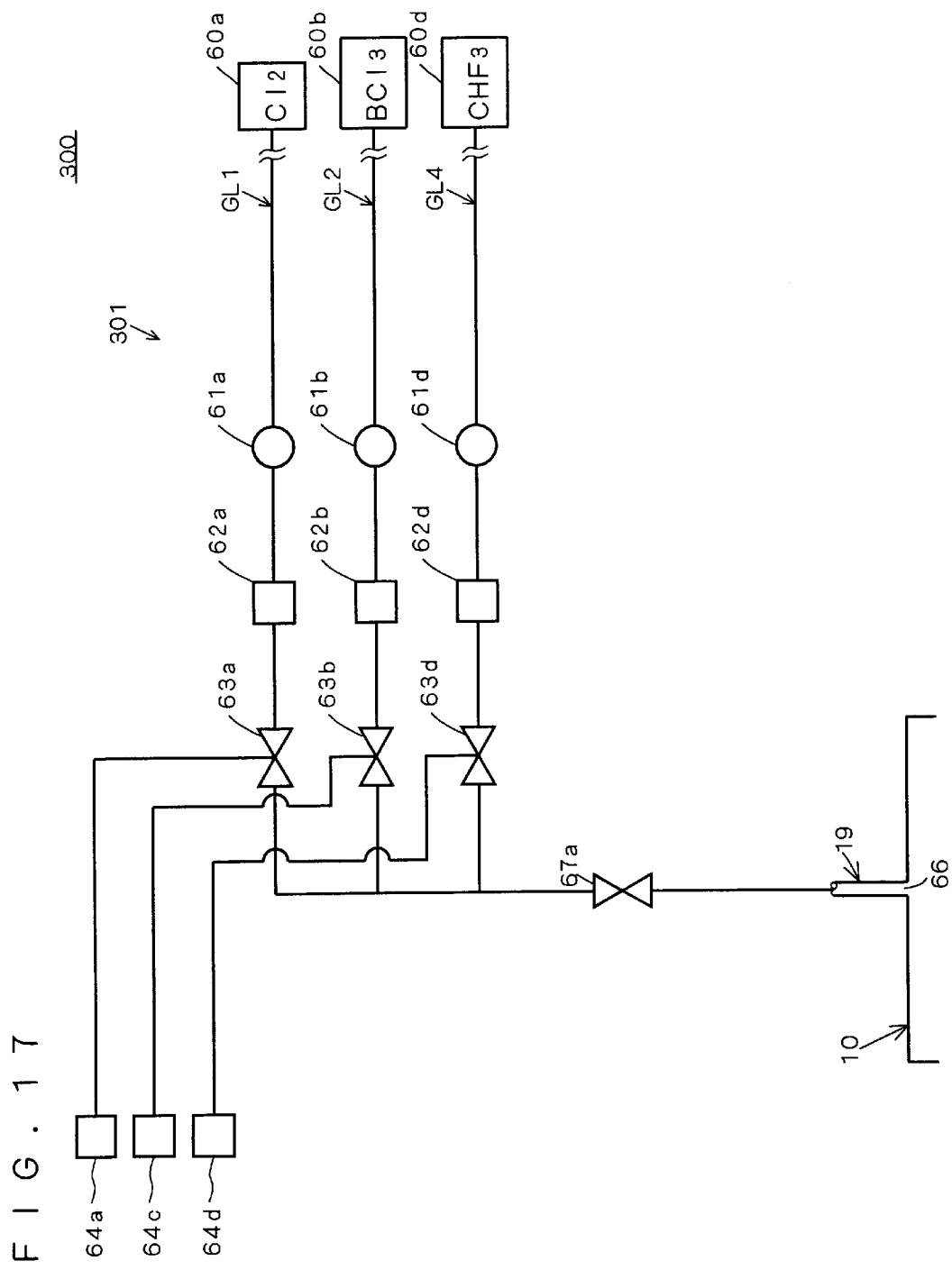

PLASMA PROCESSING METHOD AND PLASMA PROCESSING APPARATUS

BACKGROUND OF THE INVENTION

1. Field of the Invention

The present invention relates to a method of processing the surface of a semiconductor substrate with plasma for manufacturing a semiconductor device and a plasma processing apparatus.

2. Description of the Background Art

Electronics has remarkably developed in recent years, considerably owing to development of semiconductor devices, i.e., progress of semiconductor equipment and semiconductor technology in the final analysis.

In a series of steps for completing a semiconductor device from a semiconductor substrate such as a silicon wafer, i.e., in the so-called wafer process, various processing is sequentially performed so that a semiconductor wafer (hereinafter simply referred to as a wafer) is processed in various semiconductor equipment and completed as a product.

As the degree of integration of a semiconductor device is increased to require processing of a fine shape, the necessity for a method of and an apparatus for correctly controlling various wafer processing steps (hereinafter simply referred to as a process) respectively are increased.

Particularly in etching employing plasma, process control comprehending its reaction mechanism is now becoming indispensable, and it is an important subject to process a fine pattern in high anisotropy while maintaining uniformity of an etching rate in a wafer plane, an etching shape and the like following diameter enlargement of the wafer.

With reference to FIG. 47, the structure of an etching apparatus disclosed in Japanese Patent Publication No. 4-73287 (1992) is now described as a conventional etching apparatus employing plasma.

In the etching apparatus shown in FIG. 47, an upper electrode 4 and a lower electrode 2 are arranged on an upper portion and a lower portion of a processing chamber 1 formed by a vacuum vessel so that main surfaces thereof are opposed to each other, while the upper electrode 4 is grounded and the lower electrode 2 is connected with a high-frequency (e.g., 13.56 MHz) power source 9 through a blocking capacitor 8.

The lower electrode 2 also serves as an object mounting base mounting an object (wafer) 5 thereon, and is electrically insulated from the processing chamber 1 by an insulator 3.

A gas inlet port 6 of the processing chamber 1 is connected with a gas supply system GL supplying wafer processing gases (may be liquids) for dry etching. The gas supply system GL includes gas sources GS1 and GS2 and needle valves V1 and V2 for controlling the gas flow rates mounted on the respective gas sources GS1 and GS2. A controller VC controls the needle valves V1 and V2, for adjusting the gas supply quantities.

The processing chamber 1 is connected with an evacuation port 7 evacuating the processing chamber 1 to a prescribed pressure level and a pressure measurer (not shown) measuring the pressure of a discharge space in the processing chamber 1.

An etching operation is now described. A wafer 5 introduced into the processing chamber 1 by a transfer unit (not shown) is placed on the lower electrode 2. Then, the wafer processing gases are introduced into the processing chamber 1 through the gas inlet port 6 while controlling the needle valves V1 and V2 with the controller VC to attain prescribed gas flow rates.

In general, the pressure measurer and a discharge conductance controller (not shown) regulate the pressure in the processing chamber 1 to a prescribed level while introducing the wafer processing gases.

After the pressure regulation, high-frequency power is applied to the lower electrode 2 from the high-frequency power source 9, to cause RF glow discharge between the lower electrode 2 and the upper electrode 4. The wafer processing gases in the processing chamber 1 are converted to plasma due to the RF glow discharge, and active gas particles (hereinafter referred to as radicals) and ions generated in the plasma react with the wafer 5 to progress etching. Volatile etching reaction products resulting from the reaction with the wafer 5 are discharged from the evacuation port 7.

If the ions and radicals are ununiformly supplied to the wafer 5, therefore, the etching rate in the wafer plane is not uniform. Thus, uniformity of the plasma generating ions and radicals (hereinafter referred to as ions.radicals) is important. If the etching reaction products are ununiformly discharged on the wafer surface, further, the ions.radicals are ununiformly supplied to the wafer 5, consequently the etching rate in the wafer plane is non uniform.

The etching process is now described with reference to an aluminum alloy (e.g., Al—Si, Al—Cu, Al—Si—Cu or the like) most generally employed as a metal wire material in a semiconductor device at present.

In general, such an aluminum alloy is subjected to dry etching with a gas (chloric gas) mainly composed of chlorine. Aluminum readily spontaneously reacts with chlorine, and etching progresses chemically and anisotropically. This reaction requires no ions.radicals in plasma.

In order to obtain an anisotropic shape required for a fine pattern, therefore, a method of forming a protective film (hereinafter referred to as a side wall protective film) on a side wall of a wire during etching reaction thereby preventing isotropic (transverse) etching with the chloric gas is employed in general.

The side wall protective film may be formed through a decomposition product from photoresist forming an etching mask. The decomposition product from the photoresist results from physical sputtering of the photoresist with ions in plasma or chemical reaction between radicals (active species) in the plasma and the photoresist. Thus, it follows that the side wall protective film is automatically formed during etching.

The side wall protective film may alternatively be formed through a deposits formed during etching. In this case, a sedimentary gas suitable for forming a protective film is added to wafer processing gases thereby prompting formation of a deposits and automatically forming a side wall protective film with the deposits.

The former method has such advantages that the number of types of used gases (generally combination of $Cl_2/BCl_3$) may be small and the amount of the reaction products adhering to the inner wall of the processing chamber 1 is relatively small. However, the side wall protective film is formed while consuming the photoresist forming the mask, and hence this method has such disadvantages that etching must be performed under conditions remarkably consuming the photoresist, the etching selection ratio between the photoresist and the aluminum alloy is reduced and the performance is deteriorated in view of refinement.

In the latter method, on the other hand, the reaction products from the sedimentary gas facilitate formation of the side wall protective film, which is formed also when etching is performed under conditions consuming only a small amount of photoresist. Thus, isotropic etching with the chloric gas is prevented to enable anisotropic etching, while the etching selection ratio of the photoresist and the aluminum alloy can be improved. Along with the chloric gas, however, a sedimentary gas such as $N_2$, $CHF_3$ or $CH_2F_2$ must be employed singularly or in combination. Thus, this method has disadvantages such as reduction of the etching rate, occurrence of foreign matter resulting from adhesion of the reaction products to the inner wall of the processing chamber, occurrence of a side wall residue after anticorrosion treatment.

In the etching process with the conventional etching apparatus, as hereinabove described, isotropic etching with the chloric gas is prevented by forming the side wall protective film through the decomposition product from the photoresist or the deposits formed during etching. As the diameter of the wafer 5 is increased, however, the distance between the central portion of the wafer 5 and the evacuation port 7 is so increased that the evacuate efficiency for the reaction products resulting from etching reaction is remarkably lowered at the wafer central portion as compared with the peripheral portion of the wafer, the reaction products reside and ions.radicals or the like hardly reach the wafer surface.

On the peripheral portion of the wafer 5, on the other hand, the reaction products are efficiently evacuated regardless of the diameter of the wafer 5, and ions.radicals or the like readily reach the wafer surface.

As the diameter of the wafer 5 is increased, therefore, the component ratio, the absolute amount etc. of ions.radicals or the like reaching the wafer surface remarkably vary with the central portion and the peripheral portion of the wafer 5 to often result in such a phenomenon that the etching rate, the etching shape and the like remarkably vary with the central portion and the peripheral portion of the wafer 5, leading to a problem in manufacturing of a semiconductor device with a wafer having a large diameter. This is the first problem.

Further, refinement of the etching pattern progresses following increase of the diameter of the wafer, to cause a new problem. When the aspect ratio (a/b: a stands for the etching depth and b stands for the etching width) is increased, the reaction products are hardly separated (evacuated) on the bottom portion of the pattern to inhibit etching reaction, to result in a phenomenon reducing the etching rate (a phenomenon called microloading or RIE lag, hereinafter simply referred to as RIE lag for the purpose of simplification). This is the second problem.

The first and second problems remarkably depend on the uniformity of plasma, and efforts are being made to uniformly the plasma concentration (in other words, ion.radical concentration) in the vicinity of the wafer. When etching an aluminum alloy with chloric gas, however, aluminum readily spontaneously reacts with chlorine as hereinabove described, and the etching reaction progresses with no requirement for ions.radicals in plasma. Thus, it is difficult to solve the aforementioned problems due to remarkable dependency on the gas concentration in the vicinity of the wafer surface.

SUMMARY OF THE INVENTION

According to a first aspect of the present invention, a plasma processing apparatus comprises a reaction chamber generating plasma and storing an object for processing the object with the plasma, a buffer chamber separated from the reaction chamber through a partition wall, and a gas supply system supplying a prescribed gas to the buffer chamber, in which the gas supply system has a pulse gas valve pulsatively controlling supply and stoppage of supply of the prescribed gas and the partition wall has a plurality of gas feeding holes passing the prescribed gas therethrough, for pulsatively supplying the prescribed gas from the buffer chamber into the reaction chamber through the plurality of gas feeding holes by operation of the pulse gas valve, generating the plasma in the reaction chamber and processing the object.

According to the first aspect, it is possible to prevent discharge efficiency for etching reaction products from remarkably varying with the central portion and the peripheral portion of the object by pulsatively introducing an etching gas, for example, into the buffer chamber and fluctuating the gas pressure in the reaction chamber in the range of about 0.1 mTorr to about 200 mTorr, for example, whereby it is possible to prevent difference in the etching rate and the etching shape for homogeneizing the etching rate and the etching shape. Further, RIE lag resulting from refinement of the etching pattern can be reduced. Further, the gas is supplied to the reaction chamber from the plurality of gas feeding holes of the buffer chamber with pressure difference, whereby the gas can be uniformly discharged toward the object, the plasma can be uniformly formed, and the etching rate as well as the etching shape can be homogenized.

According to a second aspect of the present invention, the partition wall is arranged to face a mounting base for mounting the object.

According to the second aspect, a buffer chamber facing the object can be obtained, for effectively performing homogeneous plasma processing on the object surface.

According to a third aspect of the present invention, the partition wall is formed by a conductor, and the plasma is generated by a high frequency applied between the mounting base and the partition wall using as electrodes.

According to the third aspect, the plasma is formed with the base and the partition wall facing the same serving as electrodes, whereby homogeneous plasma can be readily obtained.

According to a fourth aspect of the present invention, the plasma processing apparatus further comprises magnetic field forming means arranged to form a magnetic field having a component perpendicular to the electric field direction of the high frequency.

According to the fourth aspect, a dischargeable pressure can be reduced by forming a magnetic field perpendicular to the electric field direction of the high frequency, for effective refinement of the object.

According to a fifth aspect of the present invention, the plasma processing apparatus has an automatic impedance matching apparatus connected with a high frequency power source supplying the high frequency, and the automatic impedance matching apparatus operates to have a dead time performing no impedance matching operation for the high frequency.

According to the fifth aspect, it is possible to prevent such a malfunction that the pressure in the reaction chamber is reduced to make discharge maintenance difficult and automatic control of the impedance matching apparatus is disabled or impedance change is so excessively quick that an automatic matching operation of the impedance matching apparatus cannot follow this change but the impedance matching apparatus enters an uncontrollable state and a control element for capacitance or inductance operates up to a control limit. Also when the pulse gas valve is turned on again to increase the pressure of the reaction chamber, therefore, the impedance matching operation is readily performed at a high speed to prevent etching processing from occurrence of inconvenience. Further, the control element in the impedance matching apparatus is not driven to the control limit, whereby a mechanical operation range of the control element is narrowed, damage is reduced and the life can be elongated.

According to a sixth aspect of the present invention, the dead time is provided in correspondence to a period when the pressure of the reaction chamber is not more than a prescribed level.

According to the sixth aspect, the dead time can be practically set.

According to a seventh aspect of the present invention, the plasma processing apparatus has current measuring means and voltage measuring means measuring an output current and an output voltage of a high-frequency power source supplying the high frequency, for controlling high-frequency power generating the plasma on the basis of an integral value of the product of the output current and the output voltage per unit time.

According to the seventh aspect, RF power applied to the plasma can be correctly estimated.

According to an eighth aspect of the present invention, the plasma processing apparatus further comprises a ring-shaped dielectric plate arranged to form part of a reaction chamber side wall perpendicular to the mounting base for mounting the object, and a high-frequency coil wound on the outer periphery of the dielectric plate, and the plasma is generated by an induction field induced on the inner side of the dielectric plate.

According to the eighth aspect, a space potential is low, loss of electrons from the plasma resulting from electric field drifting is small and the plasma can be formed with relatively low RF power in a high vacuum (low pressure).

According to a ninth aspect of the present invention, the plasma processing apparatus has an automatic impedance matching apparatus connected with a high-frequency power source supplying the high frequency, and the automatic impedance matching apparatus operates to have a dead time performing no impedance matching operation for the high frequency.

According to the ninth aspect, it is possible to prevent such a malfunction that the pressure in the reaction chamber is reduced to make discharge maintenance difficult and automatic control of the impedance matching apparatus is disabled or impedance change is so excessively quick that an automatic matching operation of the impedance matching apparatus cannot follow this change but the impedance matching apparatus enters an uncontrollable state and a control element for capacitance or inductance operates up to a control limit. Also when the pulse gas valve is turned on again to increase the pressure of the reaction chamber, therefore, the impedance matching operation is readily performed at a high speed to prevent etching processing from occurrence of inconvenience. Further, the control element in the impedance matching apparatus is not driven to the control limit, whereby a mechanical operation range of the control element is narrowed, damage is reduced and the life can be elongated.

According to a tenth aspect of the present invention, the dead time is provided in correspondence to a period when the pressure of the reaction chamber is not more than a prescribed level.

According to the tenth aspect, the dead time can be practically set.

According to an eleventh aspect of the present invention, the plasma processing apparatus has current measuring means and voltage measuring means measuring an output current and an output voltage of a high-frequency power source supplying the high frequency, for controlling high-frequency power generating the plasma on the basis of an integral value of the product of the output current and the output voltage per unit time.

According to the eleventh aspect, RF power applied to the plasma can be correctly estimated.

According to a twelfth aspect of the present invention, the plasma processing apparatus further comprises a ring-shaped dielectric plate arranged to form part of a reaction chamber side wall perpendicular to the mounting base for mounting the object, and a ring-shaped waveguide arranged to cover at least the dielectric plate, and the plasma is generated by a microwave supplied to the waveguide.

According to the twelfth aspect, the plasma can be uniformly formed in a region of a relatively high pressure of about 1 Torr to several Torr, for example, for effectively processing a wafer having a large diameter.

According to a thirteenth aspect of the present invention, the waveguide also covers a ring-shaped conductor plate arranged to form part of the reaction chamber side wall along with the dielectric plate.

According to the thirteenth aspect, the ring-shaped conductor plate serves as an iris and the microwave is disturbed to form a higher order mode other than a basic mode in the waveguide. A high electric field is formed by this higher order mode in the vicinity of the iris, and penetrates into the reaction chamber thereby simplifying discharge. The iris functions also as an impedance element, and impedance matching can be simplified when the pressure of the reaction chamber extremely fluctuates.

According to a fourteenth aspect of the present invention, the waveguide also covers part of the reaction chamber side wall along with the dielectric plate.

According to the fourteenth aspect, the part of the reaction chamber side wall covered with the waveguide defines an iris, whereby the structure is simplified.

According to a fifteenth aspect of the present invention, the buffer chamber is formed by a plurality of independent buffer chambers, and the plurality of independent buffer chambers are arranged to cover the previously separated plurality of gas feeding holes every section.

According to the fifteenth aspect, different gases can be discharged from the gas feeding holes every section by supplying different types of gases to the plurality of independent buffer chambers, for example. Thus, the respective gas supply states can be readily simulated for correctly controlling the amount of gas supply to the reaction chamber, the pressure thereof and the like.

According to a sixteenth aspect of the present invention, the plurality of gas feeding holes are concentrically arranged in a plurality of lines inclusive of the feeding hole at the center of the partition wall, and the plurality of independent buffer chambers include a first independent buffer chamber arranged to cover alternate ones of the concentric lines of the gas feeding holes, and a second independent buffer chamber covering the first independent buffer chamber and the plurality of gas feeding holes not covered with the first independent buffer chamber together.

According to the sixteenth aspect, different types of gases can be supplied in units of the plurality of concentrically arranged gas feeding holes.

According to a seventeenth aspect of the present invention, the plurality of independent buffer chambers are arranged in one-to-one correspondence to the plurality of gas feeding holes.

According to the seventeenth aspect, the plurality of independent buffer chambers are arranged in one-to-one correspondence to the plurality of gas feeding holes respectively, whereby the gases can be more uniformly supplied to the object surface. Further, it is possible to correspond to a larger number of types of gases.

According to an eighteenth aspect of the present invention, the buffer chamber is arranged to enclose a reaction chamber side wall perpendicular to the mounting base for mounting the object, and the partition wall forms part of the reaction chamber side wall.

According to the eighteenth aspect, the reaction chamber upper wall facing the base can be effectively utilized by arranging the buffer chamber to enclose the reaction chamber side wall.

According to a nineteenth aspect of the present invention, the plasma processing apparatus further comprises a dielectric plate arranged to form part of a reaction chamber upper wall facing the mounting base for mounting the object, and a waveguide arranged to cover at least the dielectric plate, and the plasma is generated by a microwave supplied to the waveguide.

According to the nineteenth aspect, plasma can be efficiently formed in the reaction chamber by microwave discharge by introducing the microwave from the reaction chamber upper wall.

According to a twentieth aspect of the present invention, the plasma processing apparatus further comprises magnetic field forming means arranged to form a magnetic field having a component perpendicular to the electric field direction of the microwave.

According to the twentieth aspect, a magnetic field perpendicular to the electric field direction of the microwave is formed to enable electron cyclotron resonance (ECR) discharge, and anisotropic etching in a finer pattern is enabled since ECR plasma can maintain discharge at a degree of vacuum of not more than 1 mTorr.

According to a twenty-first aspect of the present invention, reaction chamber upper wall facing the mounting base for mounting the object is formed by a dielectric plate, and the plasma processing apparatus further comprises a cavity resonance chamber arranged to cover the dielectric plate and having an inlet for a microwave on a position facing the dielectric plate.

According to the twenty-first aspect, the cavity resonance chamber is provided on the side of the reaction chamber upper wall facing the base, whereby the electric field strength of the microwave can be improved in the reaction chamber by cavity resonance, to simplify starting of discharge and stably maintain discharge.

According to a twenty-second aspect of the present invention, the dielectric plate is flat.

According to the twenty-second aspect, the dielectric plate forming the cavity resonance chamber is flat, whereby the structure is simplified and the cost is reduced.

According to a twenty-third aspect of the present invention, the dielectric plate is semispherical and arranged to project toward the inlet.

According to the twenty-third aspect, the dielectric plate is rendered semispherical thereby increasing the structural strength and reducing the thickness. When a part having high microwave strength is formed in the space inside the semispherical dielectric plate, the object can be approached to a portion close to the dielectric plate and the volume of the reaction chamber can be reduced.

According to a twenty-fourth aspect of the present invention, the plasma processing apparatus further comprises magnetic field forming means arranged to form a magnetic field having a component perpendicular to the electric field direction of the microwave.

According to the twenty-fourth aspect, a magnetic field perpendicular to the electric field direction of the microwave is formed to enable electron cyclotron resonance (ECR) discharge, and anisotropic etching in a finer pattern is enabled since ECR plasma can maintain discharge at a degree of vacuum of not more than 1 mTorr.

According to a twenty-fifth aspect of the present invention, the prescribed gas is a plurality of types of gases, and the buffer chamber is arranged in a number responsive to the number of the types of the gases.

According to the twenty-fifth aspect, the respective gas supply states can be readily simulated by arranging the buffer chambers in the number responsive to the number of the types of the gases, for correctly controlling the amount of gas supply to the reaction chamber, the pressure thereof and the like.

According to a twenty-sixth aspect of the present invention, the gas supply system further includes an air storage chamber arranged on an upstream position in the vicinity of the pulse gas valve for temporarily storing the prescribed gas.

According to the twenty-sixth aspect, the air storage chamber is formed to have a sufficiently large volume as compared with the gas flow rate so that the back pressure of the pulse gas valve is hard to change, the flow rate of the gas introduced from the pulse gas valve into the buffer chamber can be maintained under prescribed conditions, and the pressure in the reaction chamber can be maintained under prescribed conditions for stably performing dry etching.

According to a twenty-seventh aspect of the present invention, the gas supply system further includes a gas pressure regulator arranged upstream the air storage chamber for regulating the gas pressure on the basis of the gas pressure of the air storage chamber.

According to the twenty-seventh aspect, the gas pressure can be kept constant by the gas pressure regulator regulating the gas pressure on the basis of the gas pressure in the air storage chamber.

According to a twenty-eighth aspect of the present invention, the prescribed gas is a plurality of types of gases, the gas supply system is arranged in a plurality of systems in correspondence to the plurality of types of gases, and the plasma processing apparatus further includes gas backflow prevention means downstream the pulse gas valve every plurality of gas supply systems.

According to the twenty-eighth aspect, gas backflow between the gas systems is prevented to enable etching having excellent controllability.

According to a twenty-ninth aspect of the present invention, the gas supply system further includes heating means heating a gas pipe between the pulse gas valve and the buffer chamber.

According to the twenty-ninth aspect, the gas pipe can be prevented from closure when the gas discharged from the pulse gas valve has a low vapor pressure cooled by adiabatic expansion due to abrupt change of the gas pressure in an intermediate portion of the pipe reaching the buffer chamber even if the gas is liquefied on the intermediate portion of the pipe, whereby the gas of a low vapor pressure can be stably introduced into the buffer chamber with no liquefaction in the intermediate portion of the pipe.

According to a thirtieth aspect of the present invention, the plasma processing apparatus further comprises a light transmission window arranged on a reaction chamber side wall perpendicular to the mounting base for mounting the object, a photodetector capturing radiation from the plasma through the light transmission window and detecting the intensity of light of a prescribed wavelength, and plasma processing end determination means determining ending of plasma processing on the basis of an output from the photodetector, and the plasma processing end determination means determines ending of the plasma processing in synchronization with an ON operation of the pulse gas valve or on the basis of a mean value of the intensity of light during a prescribed period from a detection start point for the intensity of the light of the prescribed wavelength after a lapse of a prescribed time from the ON operation.

According to the thirtieth aspect, stable etching end determination is enabled even if the pulsative gas supply to the reaction chamber is stopped, the pressure in the reaction chamber is reduced, etching is substantially stopped and the amount of emission from active species in the plasma is reduced.

A plasma processing method according to a thirty-first aspect of the present invention, using a reaction chamber generating plasma and storing an object for performing processing with the plasma on the object, a buffer chamber separated from the reaction chamber through a partition wall and a gas supply system supplying a prescribed gas to the buffer chamber, comprises the steps of: supplying the prescribed gas from the buffer chamber to the reaction chamber through a plurality of gas feeding holes provided on the partition wall; generating the plasma in the reaction chamber and processing the object, wherein the step of supplying the prescribed gas comprises the step of (a) of pulsatively introducing the prescribed gas into the buffer chamber so that a pressure fluctuation area of the reaction chamber is between about 0.1 mTorr and about 200 mTorr.

According to the thirty-first aspect, the central portion and the peripheral portion of the object can be prevented from remarkable difference in discharge efficiency for the etching reaction product by pulsatively introducing an etching gas, for example, into the buffer chamber and fluctuating the gas pressure in the reaction chamber in the range of about 0.1 mTorr to about 200 mTorr, whereby the etching rate and the etching shape can be prevented from difference and can be homogeneized. Further, RIE lag resulting from refinement of the etching pattern can be reduced. In addition, the gases supplied into the reaction chamber from the plurality of gas feeding holes of the buffer chamber with pressure difference can be uniformly discharged toward the object, the plasma can be uniformly formed and the etching rate as well as the etching shape can be homogenized.

According to a thirty-second aspect of the present invention, the prescribed gas is periodically supplied to the buffer chamber at prescribed time intervals, and the step (a) includes a step of performing flow rate control of the prescribed gas on the basis of an integral value per unit time.

According to the thirty-second aspect, the flow rate of the prescribed gas can be practically controlled.

According to a thirty-third aspect of the present invention, the prescribed gas includes a plurality of types of gases, and the method further comprises a step (b) of continuously introducing at least one type of gas among the plurality of gases into the buffer chamber.

According to the thirty-third aspect, a gas remarkably side-etching the object if the pressure is instantaneously increased, for example, is continuously introduced into the buffer chamber, so that a fine pattern can be anisotropically etched with excellent uniformity at a practical etching rate.

According to a thirty-fourth aspect of the present invention, the prescribed gas includes a plurality of types of gases, and the step (a) includes a step of synchronously starting and stopping introduction of the plurality of types of gases.

According to the thirty-fourth aspect, introduction of the plurality of types of gases is synchronously started and stopped, thereby simplifying the control.

According to a thirty-fifth aspect of the present invention, the step (a) includes a step of introducing all of the plurality of types of gases in the same period.

According to the thirty-fifth aspect, the plurality of types of gases are introduced in the same period, whereby the control is simplified.

According to a thirty-sixth aspect of the present invention, the step (a) includes a step of introducing the plurality of types of gases in periods varying with the gases.

According to the thirty-sixth aspect, an etching gas, for example, is introduced before a sedimentary gas having the possibility of inhibiting etching reaction and continuously introduced for a long period, thereby preventing excess side wall protection. Thus, the etching reaction product readily residues, and the etching property at the central portion of the wafer where supply of an active gas is insufficient and the etching rate is reduced can be improved. On the other hand, the etching property at the peripheral portion of the wafer where discharge of the etching reaction product is so easy that the sedimentary gas is also discharged at the same time to readily result in a side etching shape due to insufficient side wall protection can be improved by reducing the time for introducing a gas contributing to the etching reaction and increasing the time for introducing the sedimentary gas.

According to a thirty-seventh aspect of the present invention, the prescribed gas includes a plurality of types of gases, and the step (a) includes a step of synchronously performing only starting of introduction of the plurality of types of gases.

According to the thirty-seventh aspect, anisotropy is so excellent that occurrence of a residue or the like can be suppressed.

According to a thirty-eighth aspect of the present invention, the step (a) includes a step of introducing all of the plurality of types of gases in the same period.

According to the thirty-eighth aspect, the plurality of types of gases are introduced in the same period, whereby the control is simplified.

According to a thirty-ninth aspect of the present invention, the step (a) includes a step of introducing the plurality of types of gases in periods varying with the gases.

According to the thirty-ninth aspect, an etching gas, for example, is introduced before a sedimentary gas having the possibility of inhibiting etching reaction and continuously introduced for a long period, thereby preventing excess side wall protection. Thus, the etching reaction product readily residues, and the etching property at the central portion of the wafer where supply of an active gas is insufficient and the etching rate is reduced can be improved. On the other hand, the etching property at the peripheral portion of the wafer where discharge of the etching reaction product is so easy that the sedimentary gas is also discharged at the same time to readily result in a side etching shape due to insufficient side wall protection can be improved by reducing the time for introducing a gas contributing to the etching reaction and increasing the time for introducing the sedimentary gas.

According to a fortieth aspect of the present invention, the prescribed gas includes a plurality of types of gases, and the step (a) includes a step of asynchronously performing starting and stoppage of introduction of the plurality of types of gases.

According to the fortieth aspect, anisotropy is so excellent that occurrence of a residue or the like can be suppressed.

According to a forty-first aspect of the present invention, the step (a) includes a step of introducing all of the plurality of types of gases in the same period.

According to the forty-first aspect, the plurality of types of gases are introduced in the same period, whereby the control is simplified.

According to a forty-second aspect of the present invention, the step (a) includes a step of introducing the plurality of types of gases in periods varying with the gases.

According to the forty-second aspect, an etching gas, for example, is introduced before a sedimentary gas having the possibility of inhibiting etching reaction and continuously introduced for a long period, thereby preventing excess side wall protection. Thus, the etching reaction product readily residues, and the etching property at the central portion of the wafer where supply of an active gas is insufficient and the etching rate is reduced can be improved. On the other hand, the etching property at the peripheral portion of the wafer where discharge of the etching reaction product is so easy that the sedimentary gas is also discharged at the same time t readily result in a side etching shape due to insufficient side wall protection can be improved by reducing the time for introducing a gas contributing to the etching reaction and increasing the time for introducing the sedimentary gas.

An object of the present invention is to provide a plasma processing method and a plasma processing apparatus which can uniformly process a wafer having a large diameter and reduce RIE lag for a fine etching pattern.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 17 illustrates the structure of gas supply means of a plasma processing apparatus according to an embodiment 3 of the present invention;

DESCRIPTION OF THE PREFERRED EMBODIMENTS

<A. Embodiment 1>

A plasma processing method according to an embodiment 1 of the present invention is described with reference to FIGS. 1 to 10. First, the structure of a dry etching apparatus 100 for carrying out the plasma processing method according to this embodiment is described with reference to FIG. 1.

<A-1. Structure of Apparatus>

Figure 1:
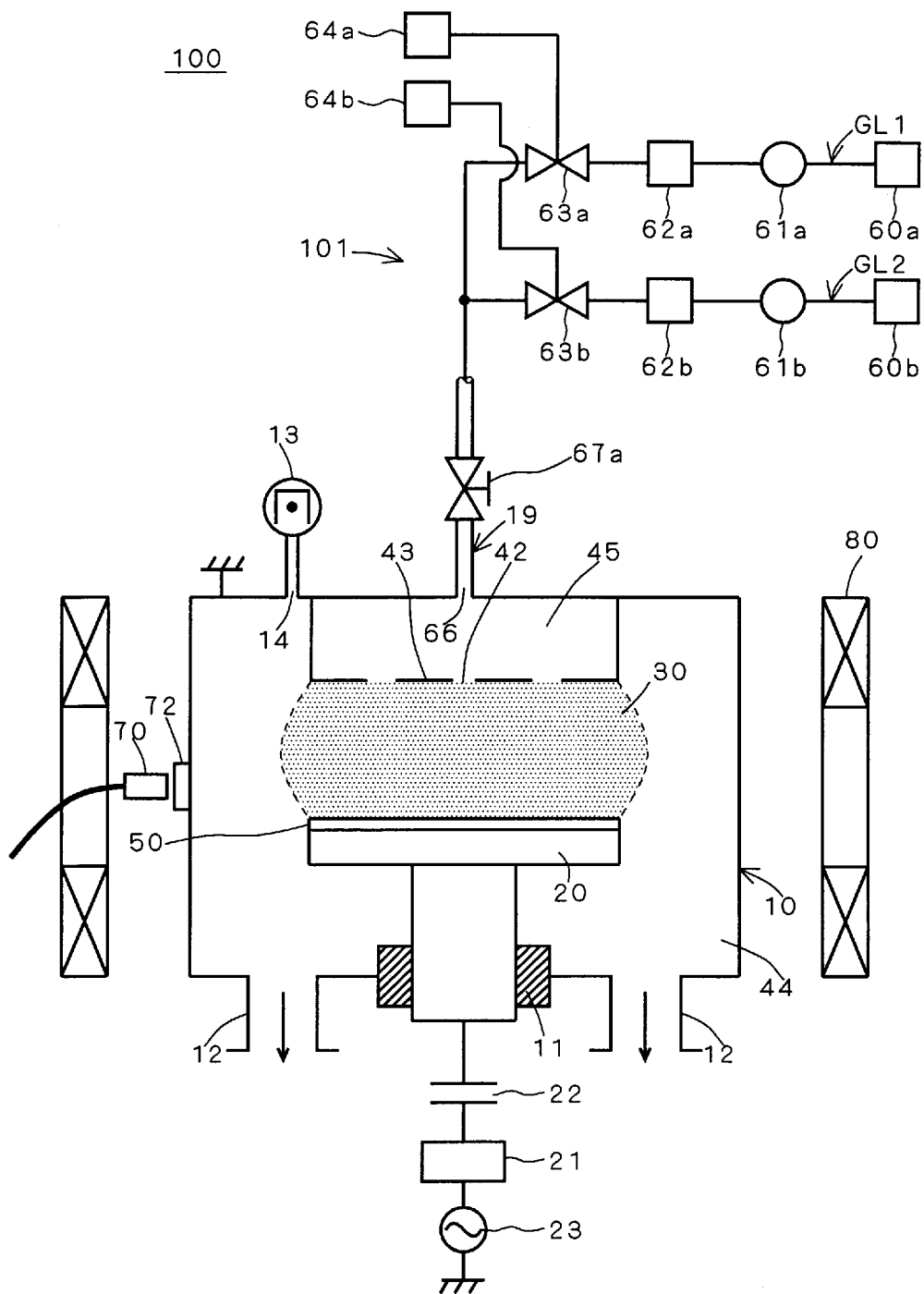
FIG. 1 illustrates the structure of a plasma processing apparatus according to an embodiment 1 of the present invention.

The dry etching apparatus 100 shown in FIG. 1 utilizes magnetron discharge by an electric field and a magnetic field perpendicular to each other as plasma generating means, and mainly comprises a processing chamber 10 formed by a vacuum vessel, magnetic field forming coils 80 arranged around the processing chamber 10 for forming a rotating magnetic field, and gas supply means 101. supplying various gases to the processing chamber 10.

The processing chamber 10 is divided into a reaction chamber 44 forming plasma with a partition wall 43 and a buffer chamber 45 discharging externally supplied gases with pressure difference, and the reaction chamber 44 comprises a high-frequency electrode 20 arranged oppositely to the buffer chamber 45.

The high-frequency electrode 20 serves also as a base for receiving a wafer (object) 50 thereon, and is electrically isolated from the reaction chamber 44 by an insulator 11. The high-frequency electrode 20 is connected with a high-frequency (e.g., 13.56 MHz) power source 23 through a blocking capacitor 22 and an impedance matching apparatus 21 connected in series with each other.

Evacuation ports 12 connected with an evacuator (not shown) are provided on a wall surface of the reaction chamber 44 closer to the high-frequency electrode 20, i.e., the bottom surface. While the evacuation ports 12 are located on two positions under the lower edge portion of the high-frequency electrode 20 in FIG. 1, the number of the evacuation ports 12 is not restricted to two.

The buffer chamber 45 is formed by a wall surface of the processing chamber provided with a gas inlet port 66 for introducing the gases from the gas supply means 101 and a box-shaped partition wall 43. The partition wall 43 opposed to the gas inlet port 66 is provided with a plurality of gas feeding holes 42. The partition wall 43, made of a conductive material, serves also as a counter electrode for the high-frequency electrode 20.

The reaction chamber 44 is connected with a pressure measurer 13 for measuring its internal pressure and a detection window 72 for optically monitoring ending of etching. The distance between a pressure measuring hole 14 provided on the wall surface connected with the pressure measurer 13 and the pressure measurer 13 is set as short as possible, and the inner diameter of a pipe connecting the pressure measuring hole 14 and the pressure measurer 13 is set as large as possible.

Figure 2:
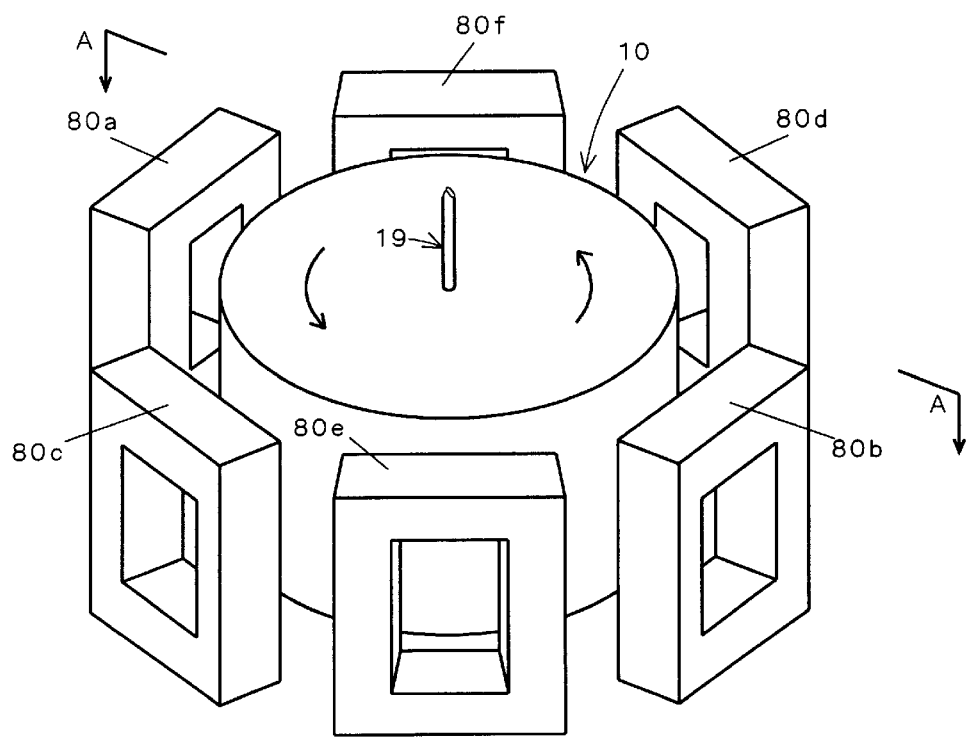
FIG. 2 is a perspective view illustrating arrangement of magnetic field forming coils.

FIG. 2 typically shows the arrangement of the magnetic field forming coils 80 formed by three pairs of air-core coils. As shown in FIG. 2, six air-core coils 80a to 80f are arranged to enclose the processing chamber 10, while the oppositely arranged air-core coils 80a and 80b, 80c and 80d and 80e and 80f are electrically paired with each other. Operations of the magnetic field forming coils 80 are described later. FIG. 1 corresponds to a sectional view taken along the line A—A in FIG. 2.

The gas supply means 101 comprises a gas pulse supply system GL1 formed by a gas supply source 60a supplying Cl$_2$ (chlorine) gas, a gas pressure regulator 61a, a mass flow meter 62a monitoring the gas flow rate and a pulse gas valve 63a and a gas pulse supply system GL2 formed by a gas supply source 60b supplying BCl$_3$ (boron trichloride) gas, a gas pressure regulator 61b, a mass flow meter 62b monitoring the gas flow rate and a pulse gas valve 63b. The gas pulse supply systems GL1 and GL2 are connected in common with a cut valve 67a, which is connected with the gas inlet port 66 through a gas pipe 19.

The gas pulse supply systems GL1 and GL2 may alternatively be independently connected with separate cut valves, which are individually connected with the processing chamber 10. Or, such cut valve(s) may be omitted.

Valve drivers 64a and 64b pulsatively control open/close operations of the pulse gas valves 63a and 63b. Driving sequences of the valve drivers 64a and 64b and the gas flow rates can be arbitrarily changed by an external control mechanism (not shown) or the like. A gas pressure sensor (not shown) is provided for monitoring the gas pressure in the pipe 19, and the gas pressure regulators 61a and 61b regulate the gas pressure on the basis of the value of this sensor.

The pulse gas valves 63a and 63b, which can be prepared from electromagnetic coil type or piezoelectric element type pulse gas valves, are formed by electromagnetic coil type ones in this embodiment. An electromagnetic coil type pulse gas valve controls flow of a gas by closing and opening a gas passage with a needle moving in the direction of the gas flow and a direction opposite thereto. A gas output can be pulsated by pulsating a current supplied to the electromagnetic coil. Japanese Patent Laying-Open Gazette No. 7-263353 (1995) describes an exemplary structure of the pulse gas valve.

<A-2. Basic Operation of Apparatus>

Basic operations of the dry etching apparatus 100 are now described. Etching gases supplied from the gas pulse supply systems GL1 and GL2 enter the buffer chamber 45 through the gas inlet port 66 and are introduced into the reaction chamber 44 through the gas feeding holes 42 provided on the partition wall 43 in the form of showers, and finally evacuated from the evacuation ports 12.

When applying a high-frequency voltage of 13.56 MHz to the high-frequency electrode 20 of the reaction chamber 44 from the high-frequency power source 23 through the impedance matching apparatus 21 and the blocking capacitor 22 and forming a magnetic field having a component perpendicular to the high-frequency electric field in the reaction chamber 44 with the magnetic field forming coils 80, plasma 30 is formed by magnetron discharge so that etching of the wafer 5 progresses with ions.radicals in the plasma 30.

Currents having different phases such as three-phase alternating currents having phase difference of 120°, for example, are applied to the three pairs of air-core coils 80a and 80b, 80c and 80d and 80e and 80f respectively. Thus, the three pairs of air-core coils 80a and 80b, 80c and 80d and 80e and 80f form a rotating composite magnetic field. It is possible to prevent the plasma 30 from distortion resulting from E×B drifting caused by the electric field (E) and the magnetic field (B) perpendicular to each other by rotating the magnetic field, for maintaining the plasma 30 uniform and ensuring uniformity of etching. The magnetic field coils 80, which may simply form a uniform magnetic field of about 100 to 200 G on the wafer surface, may not necessarily be rectangular, and may not be air-core coils.

When the plasma 30 is generated, etching of the object 50 progresses with the ions.radicals. <A-3. Description of Concept of Action by Plasma Processing>

The action of the plasma processing method according to this embodiment is now conceptually described.

The following description is made with reference to aluminum or an aluminum alloy (Al—Cu, Al—Si—Cu or the like) employed as a target material.

The pulse gas valves 63a and 63b are pulsatively turned on (open) or off (close) by control signals from the valve drivers 64a and 64b. The etching gases are supplied while the pulse gas valves 63a and 63b are open in ON states, and supply of the etching gases is stopped while the pulse gas valves 63a and 63b are closed in OFF states.

In general, the evacuation ability of an evacuation system including the evacuator is constant, and hence the pressure of the buffer chamber 45 is increased beyond that of the reaction chamber 44 in association with the ON operations of the pulse gas valves 63a and 63b.

Figure 3:
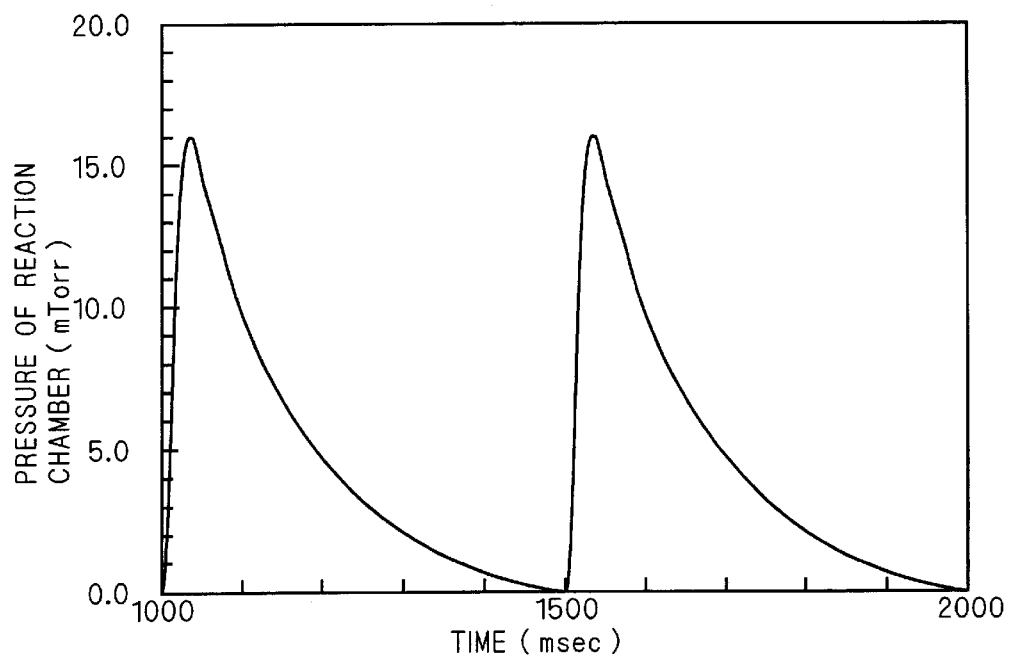
FIG. 3 illustrates pressure change in a reaction chamber.
Figure 4:
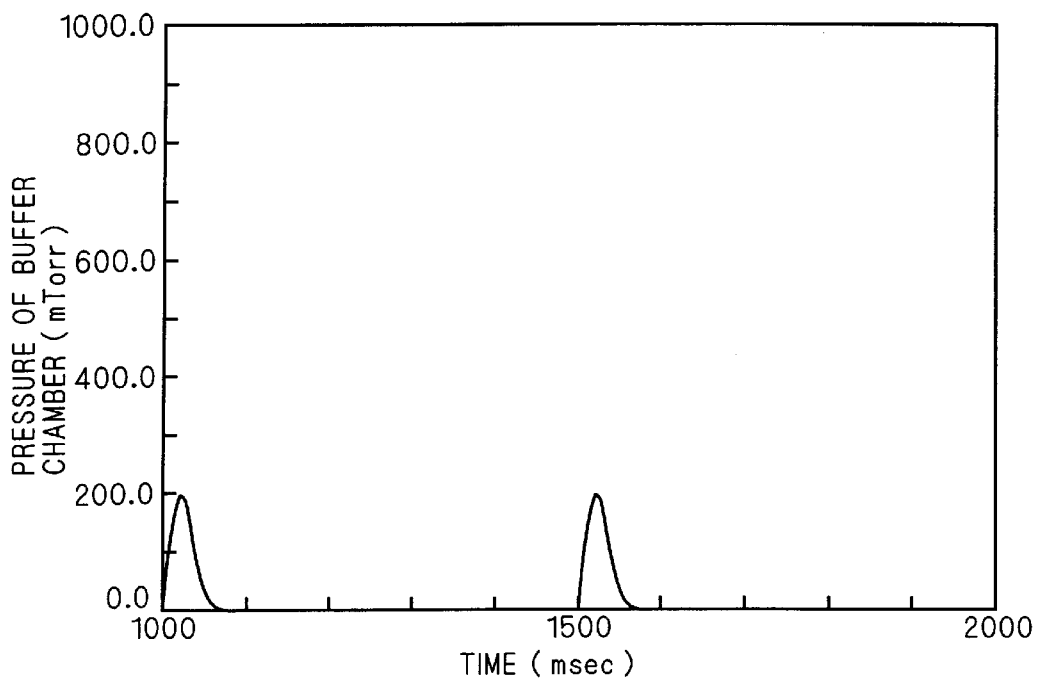
FIG. 4 illustrates pressure change in a buffer chamber.
Figure 5:
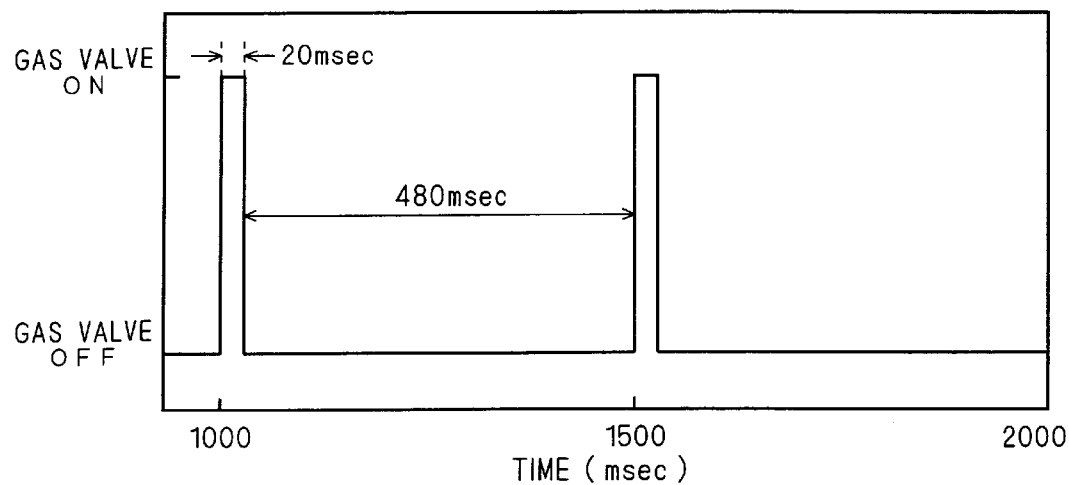
FIG. 5 is a timing chart showing operations of a pulse gas valve.

FIGS. 3 and 4 show the pressures of the reaction chamber 44 and the buffer chamber 45 pulsatively supplied with the etching gas. FIG. 5 is a timing chart showing operations of the pulse gas valve 63a pulsatively supplying the etching gas.

FIGS. 3 and 4 are graphs showing results obtained by calculating pressure change in reaction chamber 44 and the buffer chamber 45 caused by the pulsatively introduced etching gas under conditions of ideal gas, isoentropy and one-dimensional flow, with times (msec.) on the horizontal axes and the pressures (mTorr) of the reaction chamber 44 and the buffer chamber 45 on the vertical axes respectively. FIG. 5 shows the time (msec.) on the horizontal axis and ON/OFF states of the pulse gas valve 63a on the vertical axis.

The supplied etching gas is $Cl_2$ gas, the gas temperature is ordinary, the gas pressure is 1 atm., the diameter of the pulse gas valve 63a is 0.5 mm, the volume of the buffer chamber 45 is 0.8 l, the volume of the processing chamber 10 is 19 l, the effective evacuation speed is 200 l/sec., the area of the gas feeding holes 42 of the partition wall 43 is about 7.1 $cm^2$, and the operating conditions of the pulse gas valve 63a are an ON period of 20 msec., an OFF period of 480 msec. and a repetition frequency of 2 Hz, as shown in FIG. 5.

As shown in FIG. 3, the pressure of the reaction chamber 44 periodically changes in the range of about 15 mTorr to not more than 0.1 mTorr from the point of time of 1000 msec. when the pulse gas valve 63a is turned on.

As shown in FIG. 4, the pressure of the buffer chamber 45 periodically changes between the minimum at the point of time of 1000 msec. when the pulse gas valve 63a is turned on and the maximum of about 200 mTorr. Dissimilarly to the reaction chamber 44, the time required for reaching the minimum pressure again from the maximum pressure is about 100 msec. It is understood that the difference between the maximum pressures of the reaction chamber 44 and the buffer chamber 45 is in excess of one digit.

Figure 6A:
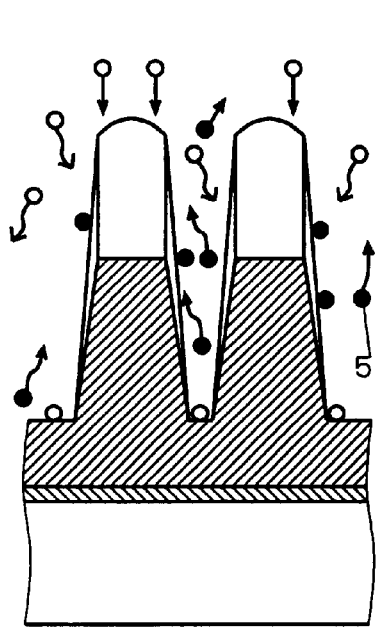
FIGS. 6A and 6B illustrate etching states of wafers.
Figure 6B:
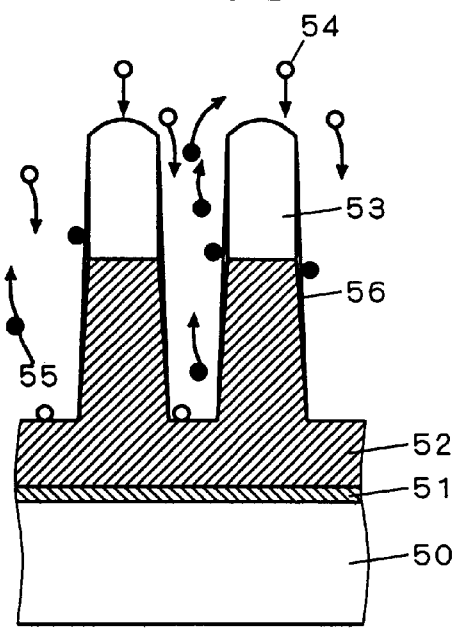

The function/effect of the pulsative supply of the etching gas is described with reference to FIGS. 6A and 6B to 8A and 8B. FIGS. 6A and 6B typically show the state of an object etched by the conventional method, and FIGS. 7A and 7B and 8A and 8B typically show the states of an object pulsatively supplied with an etching gas.

FIGS. 6A and 6B to 8A and 8B show central portions and edge portions of wafers 50 formed by silicon substrates successively provided with silicon oxide films 51 and aluminum alloy films 52 defining wires thereon.

In etching, resist materials are applied onto the aluminum alloy films 52 to form resist films 53, which in turn are thereafter formed with patterns consisting of residual parts and opening parts through photolithography steps.

FIGS. 6A and 6B show the surface state of the wafer 50 continuously supplied with an etching gas similarly to the conventional method. Etchants 54 consisting of ions.radicals are incident upon the aluminum alloy film 52 not covered with the resist film 53 and adsorb to the surface of the aluminum alloy film 52, to form volatile etching reaction products 55 by chemical reaction. The formed etching reaction products 55 uncouple from the wafer surface, to progress etching.

At this time, ions forming the etchants 54 sputter the resist film 53, adhere to/sediment on the side walls of the aluminum alloy film 52 to prevent the aluminum alloy film 52 from transverse etching (side etching), and are incident upon the surface of the aluminum alloy film 52 to which chlorine adsorbs to facilitate etching reaction, thereby prompting anisotropic etching.

On the central portion of the wafer 50 separate from the evacuation ports 12, however, the etching reaction products 55 are not sufficiently evacuated but residue to inhibit new etchants 54 from adsorbing to the surface of the aluminum alloy film 52, re-enter the wafer 50 or adhere to the side walls. On the central portion of the wafer 50, therefore, the etching rate is reduced, the side wall protective films 56 are excessively increased in thickness as shown in FIG. 6A, and the etching progresses in a forward tapered shape having a wide lower portion and a narrow upper portion.

On the edge portion of the wafer 50 close to the evacuation ports 12, on the other hand, the etching reaction products 55 are efficiently evacuated and the etchants 54 sufficiently reach the aluminum alloy film 52, whereby the side wall protective films 56 are not excessively increased in thickness but the etching rate is increased as compared with the central portion. Consequently, the central portion and the edge portion of the wafer 50 have different etching shapes. In the prior art, therefore, it is difficult to ensure uniformity of the etching rate and the etching shape as the diameter of the wafer 50 is increased.

Figure 7A:
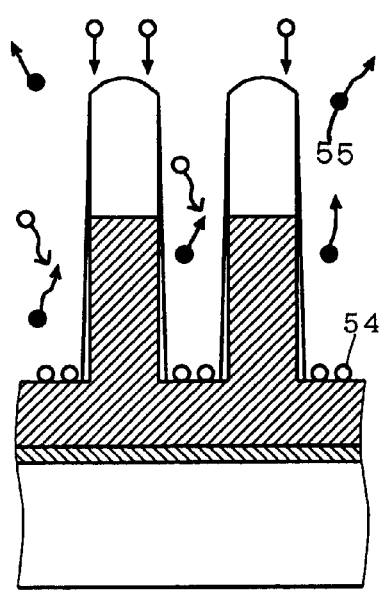
FIGS. 7A and 7B illustrate etching states of wafers.
Figure 7B:
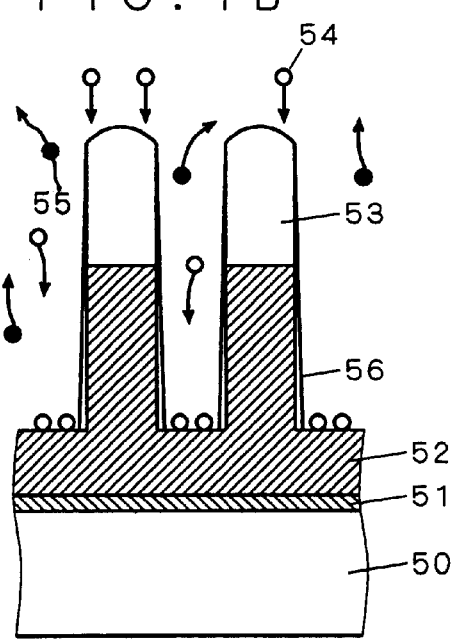

FIGS. 7A and 7B show the surface state of the wafer 50 when the pulse gas valve 63*a* is in an ON state. Etchants 54 adsorb to the surface of the aluminum alloy film 52 and form volatile etching reaction products 55 uncoupling from the wafer surface to facilitate etching by chemical reaction, similarly to the prior art. In this case, however, the etching reaction products 55 do not reside but the etchants 54 sufficiently reach the aluminum alloy film 52 on the central portion of the wafer 50 as shown in FIG. 7A, whereby side wall protective films 56 are not excessively increased in thickness but the etching rate remains similar to that on the edge portion. As shown in FIGS. 7A and 7B, therefore, the central portion and the edge portion of the wafer 50 have the same etching shape.

Figures 8A, 8B:
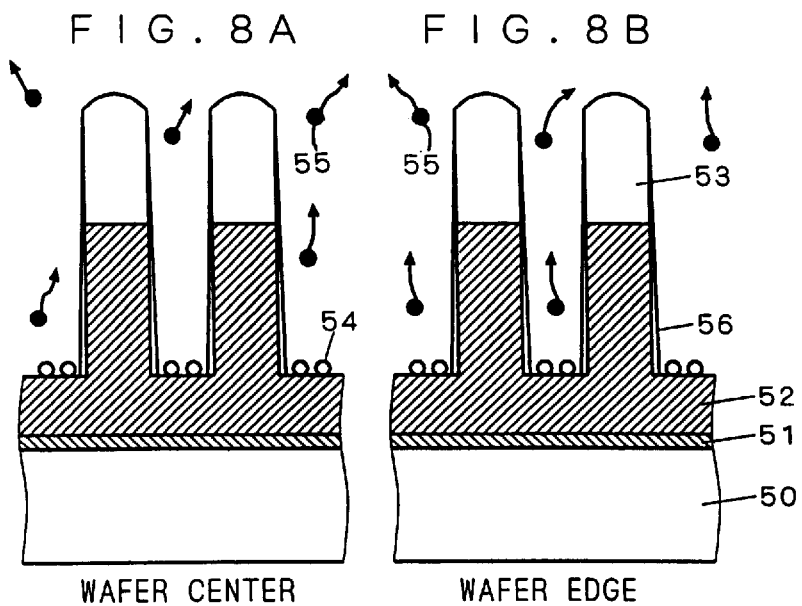
FIGS. 8A and 8B illustrate etching states of wafers.

FIGS. 8A and 8B show the surface state of the wafer 50 when the pulse gas valve 63*a* is in an OFF state. No etching gas is supplied to supply new etchants 54 to the wafer surface, and hence no new etching reaction products 55 are formed. Therefore, the etching reaction products 55 formed in the ON state of the pulse gas valve 63*a* are efficiently removed (discharged) on the central portion and the edge portion of the wafer 50 as shown in FIGS. 8A and 8B, so that discharge of the etching reaction products 55 on the central portion is completed during the OFF period of the pulse gas valve 63*a*.

While new etchants 54 are supplied to the wafer surface when the pulse gas valve 63*a* is turned on again in this state, the etching reaction products 55 formed in the previous etching have been evacuated and hence no etching reaction products 55 residue on the central portion of the wafer 50 as shown in FIG. 7A.

The area of about 7.1 cm$^2$ of the gas feeding holes 42 of the partition wall 43 employed in the aforementioned calculation corresponds to the total area of about 36 gas feeding holes of 5 mm in diameter. When properly arranging about 36 gas feeding holes of 5 mm in diameter in the range of a diameter of 250 mm, a wafer having a large diameter of 300 mm can be uniformly etched.

<A-4. Function/Effect>

The function/effect of the plasma processing method according to this embodiment is now described.

<A-4-1. Uniformity of Etching Rate and Etching Shape>

Exemplary uniformity of the etching rate and the etching shape is described.

The diameter of the processed wafer 50 is 8 inches, and an oxide film of 0.85 $\mu$m in thickness, a barrier metal film formed by a titanium nitride film of 0.12 $\mu$m in thickness and an aluminum alloy (Al—Cu) film of 0.8 $\mu$m in thickness and a titanium nitride film of 0.02 $\mu$m in thickness serving as an antireflection film are successively formed on the silicon substrate in this order. A resist film of 1.5 $\mu$m in thickness is formed on the uppermost part with various patterns of L|S=0.25 $\mu$m to 1 $\mu$m, where L and S represent the widths of parts covered and uncovered with the resist film, i.e., unetched and etched parts, respectively. When L/S=1 $\mu$m, patterns having widths L and S of 1 $\mu$m are aligned with each other.

RF power for etching is 600 W, and the magnetic field coils 80 form a magnetic field of 150 Gauss at the center of the wafer 50. The magnetic field coils 80 are supplied with three-phase alternating currents so that the three pairs of coils 80*a* to 80*f* form a magnetic field rotating at 0.75 Hz.

The temperature of the high-frequency electrode 20 receiving the wafer 50 thereon is 40° C., and the wall surface temperature of the reaction chamber 44 is controlled at a constant level of 70° C.

$Cl_2$ gas and $BCl_3$ gas serving as etching gases were introduced into the buffer chamber 45 from the pulse valves 63*a* and 63*b* at mean gas flow rates of 50 sccm and 50 sccm respectively. The mass flow meters 62*a* and 62*b* provided on the respective gas supply systems GL1 and GL2 measure dynamic change of the gas flow rates to regard integral values of the calculated values as the mean gas flow rates. The pressure regulators 61*a* and 61*b* arranged upstream the pulse gas valves 63*a* and 63*b* regulate the gas pressures, thereby controlling the gas flow rates. The pulse gas valves 63*a* and 63*b* are synchronously turned on and off for periods of 100 msec. and 900 msec. (duty ratio: 10%) respectively, with a repetition frequency of 1 Hz. The reaction chamber 44 has a mean gas pressure of 24 mTorr.

While it has been described with reference to FIG. 3 that the pressure of the reaction chamber 44 periodically fluctuates in association with the ON/OFF operations of the pulse gas valves 63*a* and 63*b* due to pulsative introduction of the gases, the fluctuation range is about 7 mTorr to about 90 mTorr in this etching. The aforementioned mean gas pressure of the reaction chamber 44 was calculated from an integral value of the fluctuation range.

The pressure of the reaction chamber 44 is measured by the pressure measurer 13 of a diaphragm system measuring the pressure from displacement of a flexible partition wall. A pipe connecting the pressure measuring hole 14 and the pressure measurer 13 is about 3 cm in length and 1 inch (2.54 cm) in inner diameter.

The buffer chamber 45 has a single gas inlet port 66, and the distances between the pulse gas valves 63*a* and 63*b* and the gas inlet port 66 are minimized to about 5 cm in this embodiment. If the gas pipe 19 has a large length and small conductance, one of the gases may flow backward into the other valve depending on small difference between the gas pressures of the pulse gas valves 63*a* and 63*b* or the timing of the valve operations.

Etching results under the aforementioned conditions are as follows:

Etching Rate: 0.41 $\mu$m/min.

Selection Ratio to Resist: 2.0

Etching Rate Uniformity: ±4.3%

Etching results obtained by continuously introducing gases similarly to the prior art under the same process conditions are as follows:

Etching Rate: 0.65 $\mu$m/min.

Selection Ratio to Resist: 2.5

Etching Rate Uniformity: ±10.2%

Comparing the etching results obtained by employing the method according to this embodiment with those obtained by employing the conventional method, the etching rate is reduced by about 33% and the selection ratio to resist is slightly reduced, while the etching rate uniformity is remarkably improved. The etching rate uniformity is calculated from etching rates on nine portions of the main surface of the wafer 50 by a general method.

Figure 9:
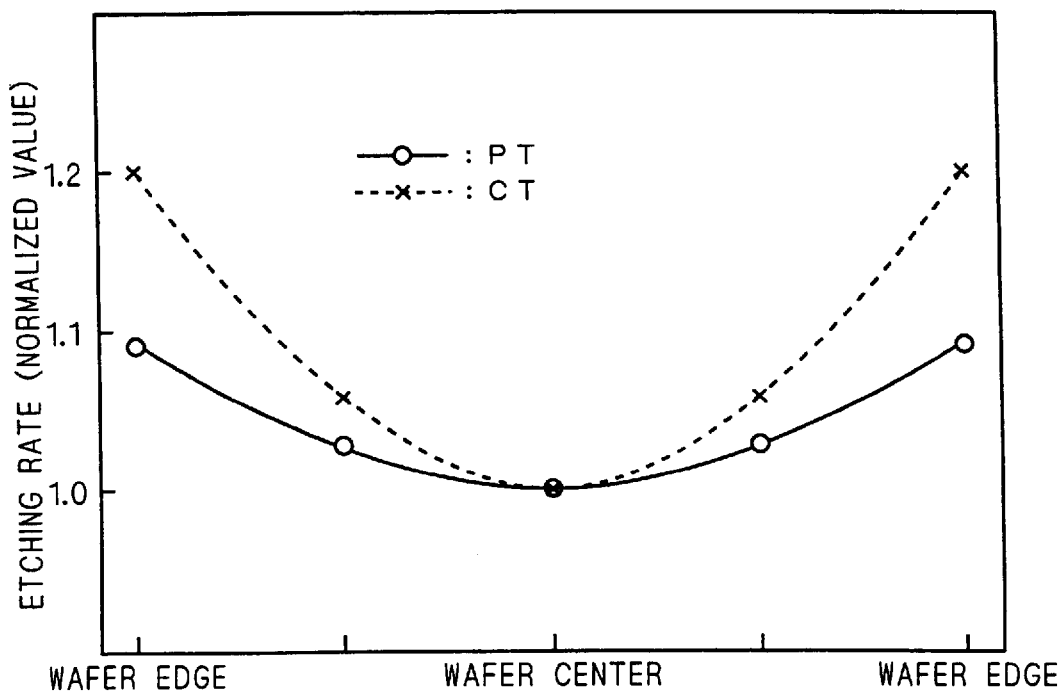
FIG. 9 illustrates difference of etching properties on wafers.

FIG. 9 shows wafer position dependency of the etching rates in the case of employing the method of this embodiment and in the case of employing the conventional method.

Referring to FIG. 9, data of patterns of about 1 μm in size are employed and the etching rates are shown in normalized values normalized with reference to the etching rates at the centers of the wafers 50. The horizontal axis shows measured positions on the wafers 50, and the vertical axis shows the normalized etching rates. The results obtained by the method of this embodiment are plotted with ○, and those obtained by the conventional method are plotted with ×.

It is understood from FIG. 9 that the etching rates on edge portions of the wafer 50 are suppressed so that the etching rates are substantially uniformalized over the entire wafer 50 to improve the uniformity of etching when employing the method of this embodiment, as compared with the case of employing the conventional method.

It is possible to prevent occurrence of etching rate difference in the wafer plane resulting from simple gas supply from part of the wall of the processing chamber, by temporarily introducing reactive gases such as etching gases into the buffer chamber 45 into the processing chamber 1 and thereafter supplying the same to the wafer 50 in the form of showers from the plurality of gas feeding holes 42 provided on the partition wall 43.

The pressure difference between the buffer chamber 45 and the reaction chamber 44 is at least one digit and the gases are blown toward the wafer 50 with this pressure difference, whereby gas molecules substantially perpendicularly enter the wafer 50 effectively for fine anisotropic etching.

While the distances between the pulse gas valves 63a and 63b and the gas inlet port 66 are minimized as described above, the pulse gas valves 63a and 63b may be corroded by reverse diffusion of active reactive gases or radicals in the plasma formed in the reaction chamber 44 or reaction products may adhere to result in a malfunction when the pulse gas valves 63a and 63b are directly mounted on the wall of the processing chamber 10. In order to prevent this, the cut valve 67a is provided and the pulse gas valves 63a and 63b are connected with the gas inlet port 66 by the gas pipe 19.

Therefore, the gases pulsatively flowing out from the pulse gas valves 63a and 63b are subjected to abrupt change of the gas pressure in the gas pipe 19 reaching the gas inlet port 66. If the vapor pressures of the gases are low, the gases may be cooled by adiabatic expansion and liquefied in an intermediate portion of the gas pipe 19 to block the gas pipe 19.

In this regard, a heater may be provided for heating the gas pipe 19 between the pulse gas valves 63a and 63b and the gas inlet port 66, in order to stably pulsatively introduce the gases of low vapor pressures into the processing chamber 10 with no liquefaction in the intermediate portion of the gas pipe 19.

This heater is not restricted to that employing Joule heat of electric resistance but may be formed by a lamp or the like so far as the same can heat the gas pipe 19.

In this embodiment, the heater temperature was set at 70° C. for preventing adhesion of contains aluminum reaction products from the processing chamber 10.

<A-4-2. Reduction of RIE Lag>

Exemplary reduction of RIE lag is now described.

The RIE lag has been described as such a phenomenon that the etching rate depends on the pattern size (aspect ratio) and varies with the pattern. As a phenomenon similar to the RIE lag, there is such microloading that etching rates vary when patterns of the same size are present in different density. Such difference of the etching rates must be reduced. Both phenomena are referred to as RIE lag, as described above.

Figure 10:
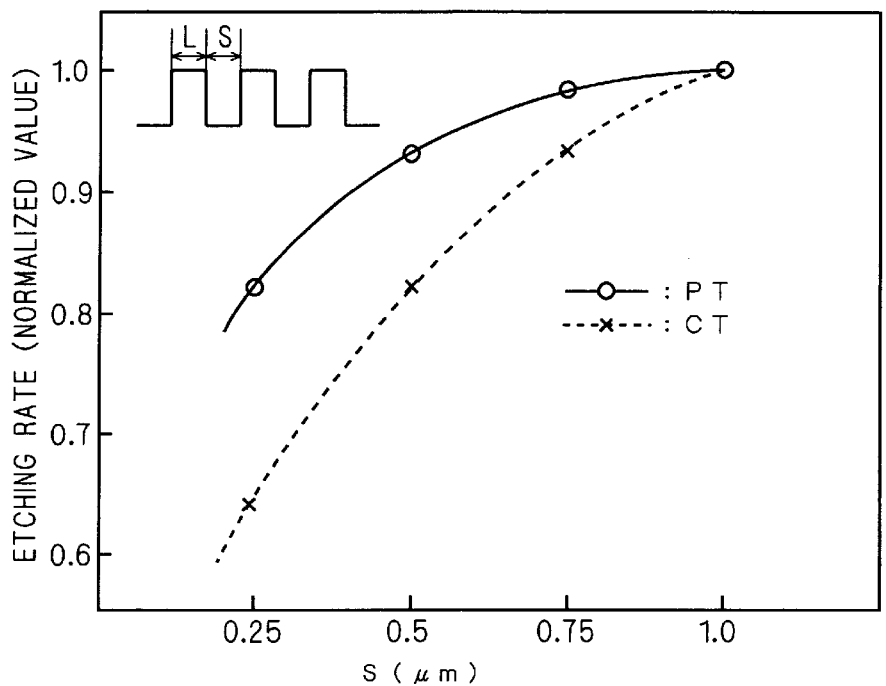
FIG. 10 illustrates improvement of RIE lag.

FIG. 10 shows data of pattern size dependency of etching rates in the case of employing the method of this embodiment and in the case of employing the conventional method, for illustrating the effect of reducing RIE lag. FIG. 10 shows etching rates of various patterns with pattern sizes, i.e., widths S of etched parts of 0.25 μm, 0.5 μm, 0.75 μm and 1.0 μm.

Referring to FIG. 10, the etching rates are shown in normalized values normalized with reference to the etching rates for the pattern size of 1.0 μm, in order to facilitate easy understanding of tendencies. The horizontal axis shows the pattern sizes S (μm), and the vertical axis shows the normalized etching rates. The results PT obtained by the method of this embodiment are plotted with ○, and the results CT obtained by the conventional method are plotted with ×.

As shown in FIG. 10, the etching rate was remarkably improved on the wafer edge portion when pulsatively introducing the etching gases, and in the pattern having the narrowest size of 0.25 μm, the etching rate, which had been 0.65 in the case of employing the conventional method (continuous introduction of etching gases), was improved to 0.83. The degree of improvement of the etching rate is reduced as the pattern size is increased, and substantially no difference is recognized when the pattern size is in excess of 1.0 μm. While the aforementioned data have been those related to wafer edge portions, no remarkable difference has been recognized between the case of employing the method of this embodiment and the case of employing the conventional method at the wafer central portions.

It is understood from the above that the etching property at the wafer central portion, particularly that against RIE lag coming into question in a fine pattern, is remarkably improved although the mean etching rate is reduced when pulsatively introducing the gases into the processing chamber 10. This proves that a time for sufficiently evacuating the etching reaction products 55 from the wafer central portion due to pulsative introduction of the etching gases into the processing chamber 10 and the etchants 54 are consequently sufficiently supplied to the wafer surface.

While the aforementioned results have been obtained under such conditions that the pressure fluctuation range of the reaction chamber 44 was about 7 mTorr to about 90 mTorr, it has been recognized through evaluation along with other results obtained in another pressure fluctuation range that an excellent etching result can be obtained when the pressure fluctuation range of the reaction chamber 44 is between about 0.1 mTorr and about 200 mTorr.

It has been recognized that side walls of aluminum wires are generally roughened to cause side etching if the pressure of the reaction chamber 44 exceeds 200 mTorr even if the etching time is relatively short, while the etching rate is extremely reduced to an unpractical level, the selection ratio to resist is reduced and stability of discharge is deteriorated if the pressure falls below 0.1 mTorr.

While this is not unconditional in consideration of the ratio (duty ratio) of the ON and OFF periods of the pulse gas valves 63a and 63b and the gas evacuate speed, the evacuate efficiency for the etching reaction products 55 is generally reduced to increase the RIE lag or non-uniformity the etching shape while side walls of aluminum wires are generally roughened to cause side etching when the lower limit of pressure fluctuation of the reaction chamber 44 exceeds 10 mTorr.

Therefore, the etching rate and the etching shape can be optimized following increase of the aspect ratio of the etching pattern by setting the pressure fluctuation range of the reaction chamber 44 so that the upper limit is not more than 200 mTorr and the lower limit is at least 0.1 mTorr and lower than 10 mTorr.

According to this embodiment, as hereinabove described, the etching rate for the wafer 50 and the etching shape can be uniform and RIE lag can be reduced by pulsatively introducing the etching gases into the buffer chamber 45 coupled with the reaction chamber 44 and fluctuating the gas pressure in the reaction chamber 44 in the range of about 0.1 mTorr and about 200 mTorr.

<A-5. Modifications>

While the pulse gas valves 63a and 63b are synchronously turned on and off in the aforementioned embodiment 1, either or both may be asynchronously used. Examples thereof are now described.

<A-5-1. Asynchronous OFF Operation>

Figure 11A:
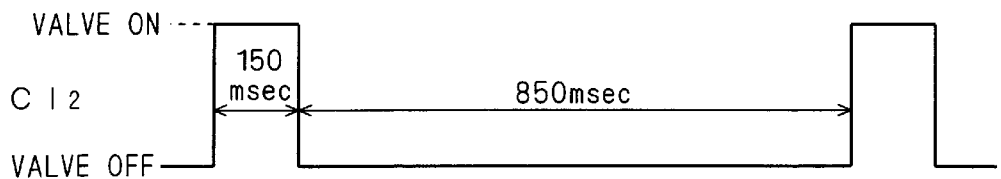
FIGS. 11A and 11B are timing charts showing operations of pulse gas valves.
Figure 11B:
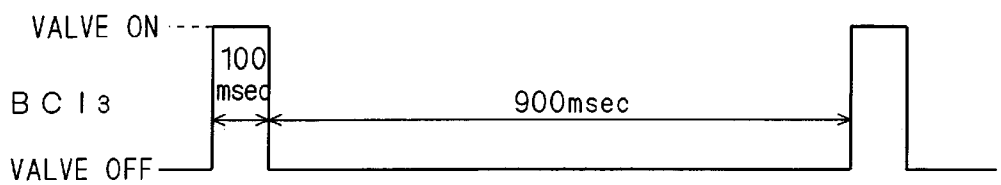

FIGS. 11A and 11B show timing charts of synchronous ON operations and asynchronous OFF operations of the pulse gas valves 63a and 63b, respectively.

Referring to FIGS. 11A and 11B, the ON period of the pulse gas valve 63a of the gas pulse supply system GL1 supplying $Cl_2$ gas is 150 msec. and the ON period of the pulse gas valve 63b of the gas supply system GL2 supplying $BCl_3$ gas is 100 msec. and only ON timings for the pulse gas valves 63a and 63b are synchronized The OFF periods are so set that the repetition frequency is 1 Hz in each valve.

Etching was performed under etching conditions such as RF power and conditions for the wafer 50 similar to those in the embodiment 1.

In this case, the mean gas flow rates for $Cl_2$ gas and $BCl_3$ gas are 150 sccm and 50 sccm respectively, and the mean gas pressure of the reaction chamber 44 is 45 mTorr. The pressure fluctuation range of the reaction chamber 44 is about 13 mTorr to about 200 mTorr.

The results of etching under the aforementioned conditions are as follows:

Etching Rate: 0.74 μm/min.

Selection Ratio to Resist: 3.1

Etching Rate Uniformity: ±6.3%

The etching shape was anisotropic with no residue or the like. The thickness of side wall protective films on side walls of aluminum wires was small as compared with that in the embodiment 1 and the side walls were slightly rough, but not at a practically problematic level.

<A-5-2. Asynchronous ON and OFF Operations>

Figure 12A:
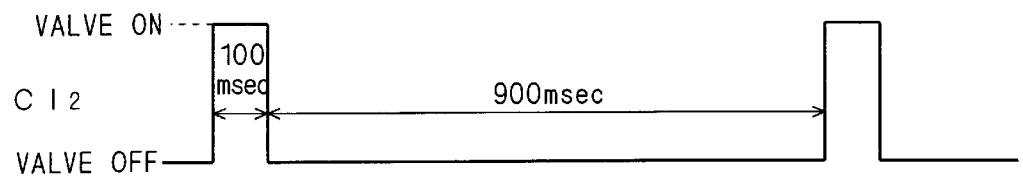
FIGS. 12A and 12B are timing charts showing operations of pulse gas valves.
Figure 12B:
Figure 13A:
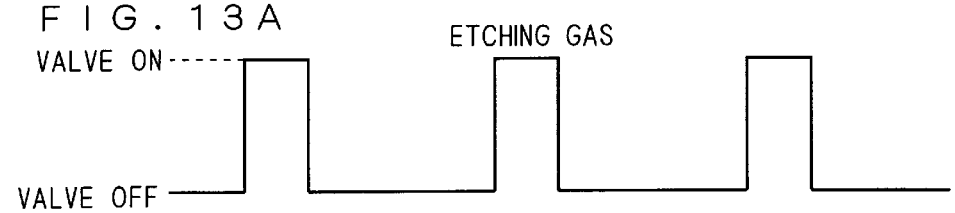
FIGS. 13A and 13B are timing charts showing operations of pulse gas valves.
Figure 13B:
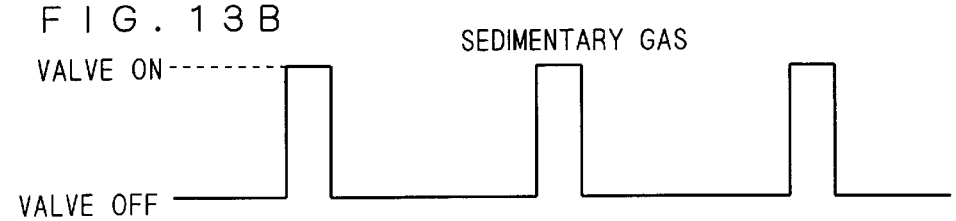
Figure 14A:
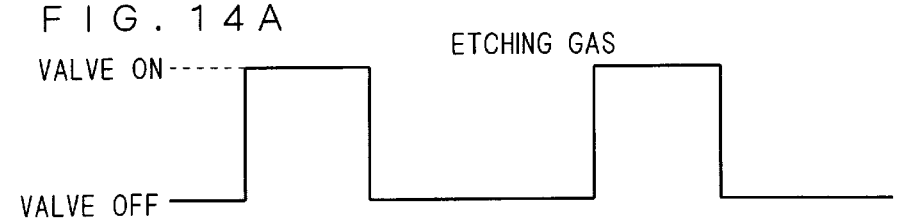
FIGS. 14A and 14B are timing charts showing operations of pulse gas valves.
Figure 14B:
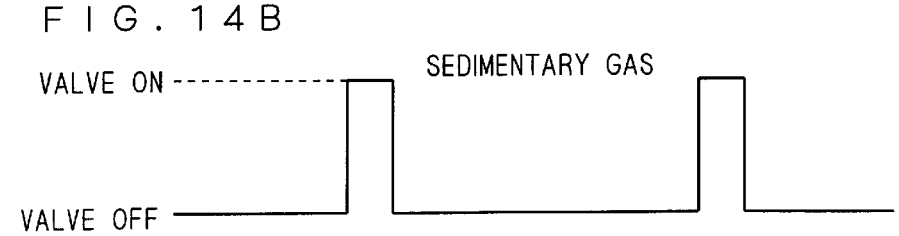

FIGS. 12A and 12B show timing charts of asynchronous ON and OFF operations of the pulse gas valves 63a and 63b, respectively.

Referring to FIGS. 12A and 12B, ON periods of both of the pulse gas valves 63a and 63b are 100 msec., while ON and OFF timings therefore are different from each other. The OFF periods are so set that the repetition frequency is 1 Hz in each valve.

Etching was performed under etching conditions such as RF power and conditions for the wafer 50 similar to those in the embodiment 1. Consequently, no difference from the etching results in the embodiment 1 was observed.

While the pulse gas valves 63a and 63b have the same ON periods in FIGS. 12A and 12B, the ON periods may be different from each other. FIGS. 13A and 13B and 14A and 14B show exemplary timing charts of operations of such pulse gas valves 63a and 63b, respectively.

Referring to each of FIGS. 13A and 13B and 14A and 14B, the ON period of the pulse gas valve 63a is longer than that of the pulse gas valve 63b, and the ON timing for the former is quicker than that for the latter. $BCl_3$ gas supplied from the pulse gas valve 63b has a property serving as an etching gas as well as a property for serving as such a sedimentary gas that boron (B) reacts with oxygen and nitrogen to form a vitreous film and a boron nitride film. Therefore, it is possible to prevent excess side wall protection and improve the etching property at the wafer central portion where etching reaction products readily residue to cause insufficient supply of an active gas and reduction of the etching rate by introducing $Cl_2$ gas serving as an etching gas in advance of the sedimentary gas having the possibility of inhibiting etching reaction and continuously introducing the same for a long period.

In order to improve the etching property on the wafer peripheral portion where the etching reaction products are so readily evacuated that the sedimentary gas is also evacuated at the same time to cause insufficient side wall protection and side etching, it is effective to reduce the time for introducing the gas contributing to the etching reaction while increasing the time for introducing the sedimentary gas.

Figure 15A:
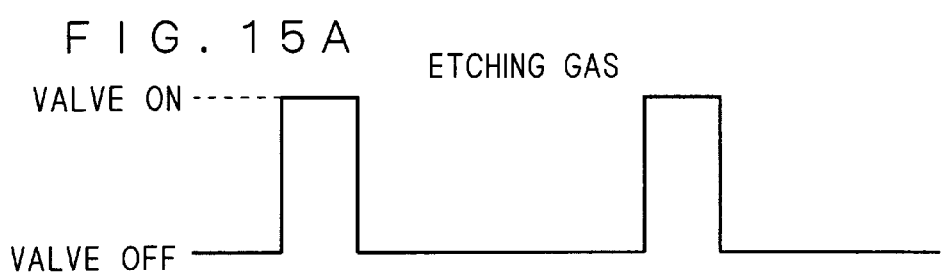
FIGS. 15A and 15B are timing charts showing operations of pulse gas valves.
Figure 15B:
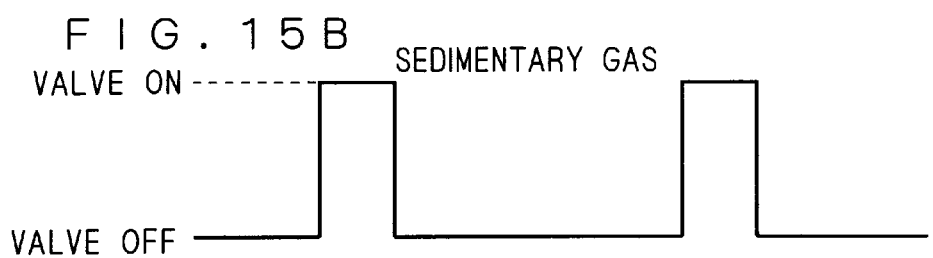

While the ON periods of the pulse gas valves 63a and 63b do not overlap in FIGS. 12A and 12B, the ON periods may alternatively overlap with each other. FIGS. 15A and 15B show exemplary timing charts of operations of such pulse gas valves 63a and 63b, respectively.

A structure for varying the gas supply state with the wafer central portion and the wafer peripheral portion is described with reference to an embodiment 6.

<B. Embodiment 2>

Figure 16:
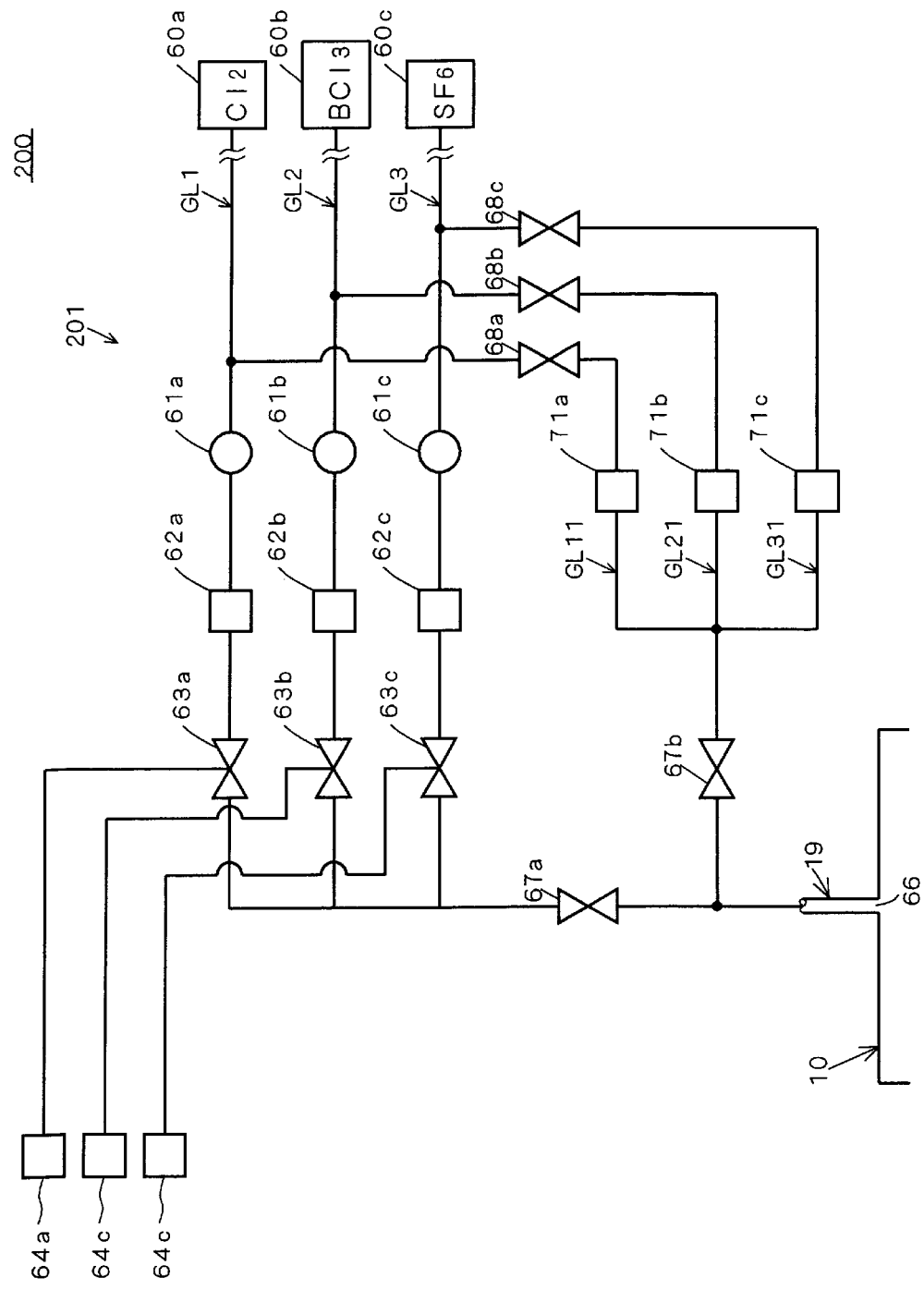
FIG. 16 illustrates the structure of gas supply means of a plasma processing apparatus according to an embodiment 2 of the present invention.

A plasma processing method according to an embodiment 2 of the present invention is described with reference to FIG. 16. FIG. 16 shows the structure of a dry etching apparatus 200 for carrying out the plasma processing method according to this embodiment.

<B-1. Structure of Apparatus>

As shown in FIG. 16, the main structure of the dry etching apparatus 200 is basically identical to that of the dry etching apparatus 100 described with reference to FIG. 1, while gas supply means 201 is arranged in place of the gas supply means 101 supplying various gases to the processing chamber 10. The gas supply means 201 comprises a gas pulse supply system GL1 formed by a gas supply source 60a supplying $Cl_2$ gas, a gas pressure regulator 61a, a mass flow meter 62a monitoring the gas flow rate and a pulse gas valve 63a, a gas pulse supply system GL2 formed by a gas supply source 60b supplying $BCl_3$ gas, a gas pressure regulator 61b, a mass flow meter 62b monitoring the gas flow rate and a pulse gas valve 63b, and a gas pulse supply system GL3 formed by a gas supply source 60c supplying $SF_6$ (sulfur hexafluoride) gas, a gas pressure regulator 61c, a mass flow meter 62c monitoring the gas flow rate and a pulse gas valve 63c.

The gas pulse supply systems GL1 to GL3 are connected in common to a cut valve 67a, which is connected with a gas inlet port 66 through a gas pipe 19. Valve drivers 64a to 64c pulsatively control open/close operations of the pulse gas valves 63a to 63c respectively.

The gas supply means 201 further comprises continuous gas supply systems GL11, GL21 and GL31 for continuously supplying $Cl_2$ gas, $BCl_3$ gas and $SF_6$ gas to a processing chamber 10. The continuous gas supply system GL11 is connected with the gas supply source 60a similarly to the gas pulse supply system GL1, and has a cut valve 68a and a mass flow controller 71a serially connected successively from the side of the gas supply source 60a.

The continuous gas supply system GL21 is connected with the gas supply source 60b similarly to the gas pulse supply system GL2, and has a cut valve 68b and a mass flow controller 71b serially connected successively from the side of the gas supply source 60b.

The continuous gas supply system GL31 is connected with the gas supply source 60c similarly to the gas pulse supply system GL3, and has a cut valve 68c and a mass flow controller 71c serially connected successively from the side of the gas supply source 60c.

The cut valves 68a to 68c are provided for parting the continuous gas supply systems GL11 to Gl31 from the gas pulse supply systems GL1 to GL3 respectively.

The continuous supply systems GL11 to GL31 are connected in common to a cut valve 67b, which is connected with the gas inlet port 66.

<B-2. Operation of Apparatus>

Operations of the dry etching apparatus 200 are now described. A wafer 50 processed in this apparatus 200 has a silicon substrate, on which an oxide film of 0.85 $\mu$m in thickness, a barrier metal film formed by a tungsten titanium film (TiW film: 0.15 $\mu$m in thickness) and an aluminum alloy (Al—Cu) film of 0.8 $\mu$m in thickness and a tungsten titanium film (TiW film: 0.02 $\mu$m in thickness) serving as an antireflection film are formed successively from below. The thickness of a resist film formed on the uppermost part is 1.5 $\mu$m, and various patterns of L/S=0.25 $\mu$m to 1 $\mu$m are formed as patterns thereof.

The processed wafer 50 is formed by a plurality of films having different compositions and thicknesses, and hence $Cl_2$ gas and $BCl_3$ gas were first pulsatively introduced from the gas supply systems GL1 and GL2 under the same etching conditions ($Cl_2$ gas flow rate: 50 sccm, $BCl_3$ gas flow rate: 50 sccm, ON periods of the pulse gas valves 63a and 63b: 100 msec., OFF period: 90 msec., repetition frequency: 1 Hz) as those in the embodiment 1, for etching the titanium nitride film forming the antireflection film and the aluminum alloy film. This process is referred to as a first process.

Ending of etching of the aluminum alloy film was determined with reference to the emission intensity of aluminum radicals.

While the aluminum alloy film is present as the object of etching, radicals of aluminum are present in the plasma and emit light when making transition to a ground state. The wavelength thereof is 396.2 nm, and a photodetector 70 mounted on a detection window 72 detects the intensity of the light. When the etching ends and the aluminum alloy film to be etched disappears, the emission intensity of the radicals of aluminum is reduced. Therefore, etching ending can be determined on the basis of change of the emission intensity such as the amount or rate of change of emission intensity obtained every pulse, for example.

After ending of the etching for the aluminum alloy film, the cut valve 67a was closed, the cut valves 68b, 68c and 67b were opened and $BCl_3$ gas and $SF_6$ gas were continuously introduced into the processing chamber 10 with the mass flow controllers 71b and 71c for $BCl_3$ gas and $SF_6$ gas at flow rates of 10 to 30 sccm, for etching the TiW film forming a barrier metal film. This process is called a second process.

The intensity of emission (wavelength: 430.2 $\mu$m) from tungsten was detected through the photodetector 70, to determine ending of etching on the TiW film. As to the etching conditions in this case, the mean gas pressure of the reaction chamber 44 was 24 mTorr similarly to that for the pulsative introduction of the etching gases described with reference to the embodiment 1, and the gas flow rates for $BCl_3$ gas and $SF_6$ gas were 20 sccm and 80 sccm respectively.

<B-3. Function/Effect>

Results of etching under the aforementioned conditions are as follows:

Etching Rate: 0.62 $\mu$m/min.
Selection Ratio to Resist: 2.8
Etching Rate Uniformity: ±5.8%

The etching rate was calculated from the total of the first and second process times and the thickness of the three-layer film.

Comparing these results with those obtained by pulsatively introducing the etching gases as described with reference to the embodiment 1, it is understood that all of the etching rate, the selection ratio to resist and the etching rate uniformity were slightly improved.

The reason for this is now described. The etching gases $Cl_2$ and $BCl_3$ which are chlorine gases cause no spontaneous etching reaction with respect to tungsten, dissimilarly to aluminum. With the chloric gases, therefore, the etching rate is remarkably reduced as compared with that for etching aluminum although high-density plasma 30 can be supplied.

On the other hand, tungsten has spontaneous reactivity with respect to contains fluorine gas, and employment of $SF_6$ gas containing fluorine (F) enables etching at a higher speed as compared with the chloric gases.

If the pressure of the fluorine gas in the reaction chamber 44 is increased, however, side etching to wire side walls becomes remarkable. Therefore, not pulsative introduction instantaneously increasing the pressure but continuous introduction continuously keeping a constant pressure was employed.

The $BCl_3$ gas having the property of an etching gas also has a property of such a sedimentary gas that boron (B) reacts with oxygen and nitrogen to form a vitreous film and a boron nitride film, which are deposited on the wire side walls to protect the side walls against side etching. Thus, the $BCl_3$ gas is added for controlling the amount of side etching.

Thus, anisotropic etching of a fine pattern can be performed with excellent uniformity at a practical etching rate by introducing the etching gases into the processing chamber 10 with combination of pulsative introduction and continuous introduction in response to the chemical composition and the thickness of the film subjected to etching.

<B-4. Modifications>

While ON/OFF operations of the pulse gas valves 63a and 63b are synchronized for pulsatively introducing two types of chlorine gases in the above description, the pulse gas valves 63a and 63b may alternatively be asynchronously turned on/off for introducing the gases, as a matter of course.

While $BCl_3$ gas and $SF_6$ gas are continuously introduced through the continuous gas supply systems GL21 and GL31 for etching the barrier metal film, $BCl_3$ gas and $SF_6$ gas may alternatively be continuously introduced by employing the gas pulse supply systems GL2 and GL3 with no provision of the continuous gas supply systems GL11 to GL31, continuously turning on the pulse gas valves 63b and 63c by control from the valve drivers 64b and 64c and regulating the gas pressures and the gas flow rates with the mass flow meters 62b and 62c. Further, the ON periods of the pulse gas valves 63b and 63c may be increased for attaining an effect substantially similar to that of continuous gas introduction by pulsative introduction having an increased duty ratio.

<C. Embodiment 3>

A plasma processing method according to an embodiment 3 of the present invention is described with reference to FIG. 17. FIG. 17 illustrates the structure of a dry etching apparatus 300 for carrying out the plasma processing method according to this embodiment.

<C-1. Structure of Apparatus>

As shown in FIG. 17, the main structure of the dry etching apparatus 300 is basically identical to that of the dry etching apparatus 100 described with reference to FIG. 1, except that gas supply means 301 is provided in place of the gas supply means 101 supplying various gases to the processing chamber 10.

The gas supply means 301 includes a gas pulse supply system GL1 formed by a gas supply source 60$a$ supplying Cl$_2$ gas, a gas pressure regulator 61$a$, a mass flow meter 62$a$ monitoring the gas flow rate and a pulse gas valve 63$a$, a gas pulse supply system GL2 formed by a gas supply source 60$b$ supplying BCl$_3$ gas, a gas pressure regulator 61$b$, a mass flow meter 62$b$ monitoring the gas flow rate and a pulse gas valve 63$b$, and a gas pulse supply system GL4 formed by a gas supply source 60$d$ supplying CHF$_3$ gas, a gas pressure regulator 61$d$, a mass flow meter 62$d$ monitoring the gas flow rate and a pulse gas valve 63$d$.

The gas pulse supply systems GL1, GL2 and GL4 are connected in common to a cut valve 67$a$, which is connected with a gas inlet port 66 through a gas pipe 19. Valve drivers 64$a$, 64$b$ and 64$d$ pulsatively control open/close operations of the pulse gas valves 63$a$, 63$b$ and 63$d$ respectively.

<C-2. Operation of Apparatus>

Operations of the dry etching apparatus 300 are now described. CHF$_3$ gas is a gas (hereinafter referred to as a sedimentary gas) forming sedimentary products (hereinafter referred to as deposits), and exemplary etching employing such a sedimentary gas with etching gases is now described.

Etching conditions other than the types of the etching gases are basically similar to those in the embodiment 1. An oxide film, a titanium nitride film, an aluminum alloy film and a titanium nitride film are successively formed on a wafer 50 of eight inches in diameter, and various patterns of L/S=0.25 $\mu$m to 1 $\mu$m are formed as those of a resist pattern formed on the uppermost part.

The mean gas flow rates of Cl$_2$ gas, BCl$_3$ gas and CHF$_3$ gas are 50 sccm, 50 sccm and 10 sccm respectively, ON and OFF periods of the pulse gas valves 63$a$, 63$b$ and 3$d$ are 100 msec. and 900 msec. (duty ratio: 10%) respectively, the repetition frequency is 1 Hz, and the mean gas pressure of a reaction chamber 44 is 27 mTorr. Operations of all pulse gas valves 63$a$, 63$b$ and 63$d$ are synchronized.

<C-3. Function/Effect>

Results of etching under the aforementioned conditions are as follows:

Etching Rate: 0.32 $\mu$m/min.

Selection Ratio to Resist: 2.7

Etching Rate Uniformity: ±4.2%

Comparing these results with those of the etching employing no sedimentary gas (CHF$_3$ gas) described with reference to the embodiment 1, the etching rate was reduced and the selection ratio to resist was only slightly increased, while the etching rate was remarkably improved at the wafer center such that the etching rate normalized with reference to that in the pattern of S=1 $\mu$m reached 0.91 in the pattern of S=0.25 $\mu$m having the narrowest pattern size, i.e., increased as compared with the normalized etching rate of 0.83 in the embodiment 1 described with reference to FIG. 9. Such approximation of the normalized etching rate to 1 indicates that the etching rate becomes constant regardless of the pattern size and RIE lag is reduced.

Such results were conceivably obtained due to an effect of C—H deposits formed from CHF$_3$, and the mechanism of reduction of RIE lag is explainable as follows:

The C—H deposits are supplied to the wafer surface from plasma 30, to reduce the etching rate for aluminum.

The plasma 30 supplies the C—H deposits to a flat part or a part having a small aspect ratio in a larger amount as compared with a part having a large aspect ratio. This is the same mechanism as insufficient supply of etchants 54, one of factors causing RIE lag.

Therefore, supply of the C—H deposits inhibiting aluminum etching to the part having a large aspect ratio reducing the etching rate is small due to RIE lag, while a larger amount of deposits are supplied to the flat part or the part having a small aspect ratio causing small reduction of the etching rate.

Therefore, the etching rate for aluminum is remarkably reduced in the flat part or the part having a small aspect ratio as compared with the part having a large aspect ratio, and consequently the difference of the etching rate resulting from the aspect ratio is reduced.

Thus, RIE lag reducing the etching rate as the aspect ratio is increased are relaxed by adding CHF$_3$ gas which is a sedimentary gas, to improve uniformity of etching.

This effect is remarkably attained when pulsatively introducing the etching gases and the sedimentary gas as compared with continuous introduction. This is conceivably because etching reaction products 55 are efficiently evacuated from a portion close to the surface of the wafer 50 due to the pulsative introduction of the gases so that fresh gases are regularly supplied to the surface of the wafer 50.

The aforementioned effect is not restricted to CHF$_3$ gas but a similar effect can be attained with the so-called flon substance such as contains hydrofluorocarbon (FHC) gas such as CH$_2$F$_2$ or C$_2$HF$_5$, contains perfluorocarbon (PFC) gas such as CF$_4$, C$_2$F$_6$ or C$_4$F$_8$, or contains hydrofluoroether (HFE) gas such as CF$_3$OCH$_3$ or CF$_3$OCHF$_2$, SF$_6$ or N$_2$.

<C-4. Modification>

While RIE lag is reduced by pulsatively introducing CHF$_3$ gas which is a sedimentary gas in synchronization with the etching gases in the above description, the effect of reducing RIE lag can be rendered more remarkable by changing the timing for pulsatively introducing CHF$_3$ gas. Such an example is now described. Etching conditions except the timing for pulsative introduction of gases and etching patterns of a wafer are identical to those in the embodiment 1.

Figure 18A:
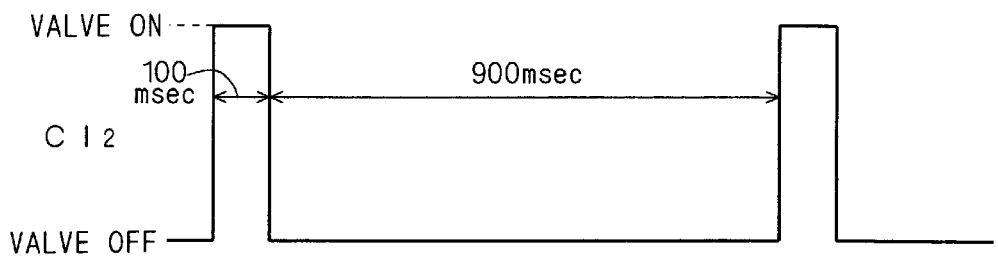
FIGS. 18A to 18C are timing charts showing operations of a pulse gas valve.
Figure 18B:
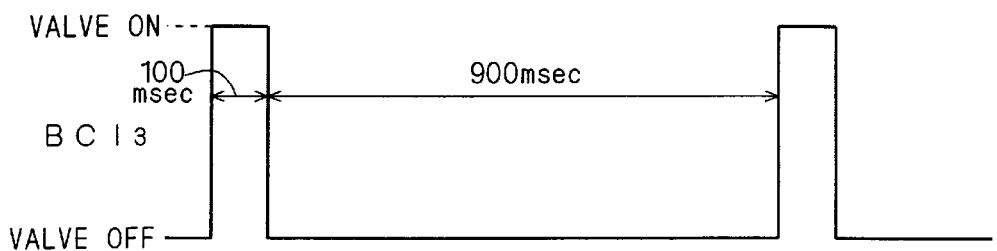
Figure 18C:
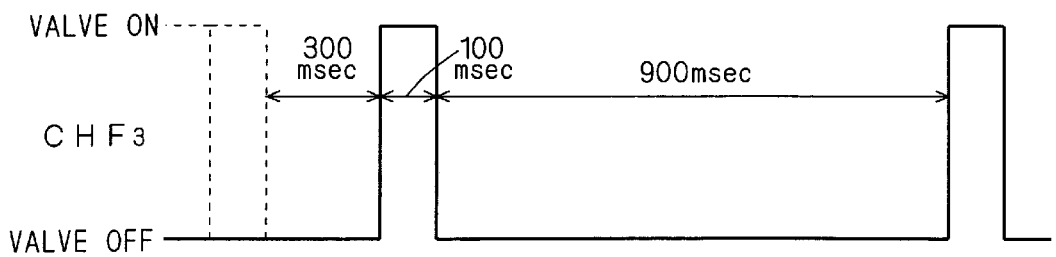

The ON and OFF periods of the pulse gas valves 63$a$, 63$b$ and 63$d$ are 100 msec. and 900 msec. (duty ratio: 10%) respectively, the repetition frequency is 1 Hz, and the mean gas pressure of the reaction chamber 44 is 27 mTorr. FIGS. 18A to 18C are timing charts of operations of the pulse gas valves 63$a$, 63$b$ and 63$d$. As shown in FIGS. 18A to 18C, Cl$_2$ gas and BCl$_3$ gas are synchronously introduced into a processing chamber 10, while CHF$_3$ gas is introduced into the processing chamber 10 in a delay by 300 msec. from the above gases.

Results of etching under the aforementioned conditions are as follows:

Etching Rate: 0.36 $\mu$m/min.

Selection Ratio to Resist: 2.6

Etching Rate Uniformity: ±4.5%

Comparing these results with those of the etching pulsatively introducing the sedimentary gas in synchronization with the etching gases described with reference to the embodiment 3, it is understood that the etching rate was increased. The etching rate normalized with reference to that in the pattern of S=1 $\mu$m reached 0.90 in the pattern of S=0.25 $\mu$m at the wafer central portion with no significant difference with respect to the case of the embodiment 3, while an effect of increasing the etching rate was attained.

Such results were obtained because etching reaction may conceivably be inhibited by C—H deposits resulting from the sedimentary gas if $CHF_3$ gas, which is a sedimentary gas, is introduced into the processing chamber 10 simultaneously with the chloric gases ($Cl_2$ and $BCl_3$), which are etching gases, but such inhibition of the etching reaction was conceivably suppressed and the etching rate was conceivably increased by introducing the etching gases and the sedimentary gas into the processing chamber 10 with time difference.

While the sedimentary gas ($CHF_3$) is introduced into the processing chamber 10 through the gas inlet port 66 similarly to the etching gases in each of the embodiment 3 and the modification thereof, a similar effect of reducing RIE lag can be attained also when continuously supplying the sedimentary gas into the processing chamber 10 from a gas inlet port different from that for the etching gases.

<D. Embodiment 4>
<D-1. Structure of Apparatus>

While a plurality of types of gases are pulsatively introduced for etching in each of the aforementioned embodiments 1 to 3, a single type of gas may be pulsatively introduced for etching. An example singly employing chlorine gas is now described.

As hereinabove described, etching of aluminum or an alloy containing aluminum progresses with no requirement for ions.radicals in plasma, due to spontaneous reaction between aluminum and chlorine. In this case, however, side etching results from isotropic progress of the etching reaction, to cause difficulty in etching of a fine pattern. In relation to an embodiment 4 of the present invention, a technique enabling anisotropic etching when singly employing chlorine gas is described.

Etching conditions and the etching pattern of a wafer are identical to those in the embodiment 1 except introduction of a single type of gas and conditions for introducing the same. The dry etching apparatus 100 shown in FIG. 1 was employed to operate only the gas pulse supply system GL1.

<D-2. Operation of Apparatus>

The mean flow rate of chlorine gas is 160 sccm, the ON and OFF periods of the pulse gas valve 63a are 108 msec. and 1225 msec. respectively, and the repetition frequency is 0.75 Hz. The pressure of the reaction chamber 44 fluctuated between about 1 mTorr and about 40 mTorr in a cycle of 0.75 Hz, and the mean pressure value thereof is about 10 mTorr.

<D-3. Function/Effect>

Results of etching under the aforementioned conditions are as follows:

Etching Rate: 0.43 $\mu$m/min.

Selection Ratio to Resist: 2.0

Etching Rate Uniformity: ±4%

The etching shape became anisotropic despite the employment of the single chlorine gas, and no side etching or the like was recognized on side walls although hardly confirmed due to no addition of a sedimentary gas to side wall protective films. The selection ratio to resist was similar to that in the embodiment 1, and no etching residue was observed.

In the conventional continuous gas introduction method, the gas pressure must be kept low for preventing an aluminum wire from side etching when chlorine gas is singly employed or the ratio of chlorine gas occupying total gases is large. Under this condition, however, a self-bias voltage (sheath voltage) generated on a substrate side (cathode side) is increased due to speed difference between electrons and ions in plasma to remarkably sputter resist, extremely reduce the selection ratio to resist and reduce the etching rate.

While the self-bias voltage is reduced, the selection ratio to resist is increased and the etching rate is also increased as the gas pressure is increased, side etching is caused on the aluminum wire and hence it is difficult to implement practical anisotropic etching of an aluminum wire when singly employing chlorine gas.

However, the aforementioned results were obtained in a method according to the embodiment 4 for the following reason:

When the pulse gas valve 63a is turned on for pulsatively introducing chlorine gas, the gas pressure in the reaction chamber 44 is abruptly increased to facilitate etching of aluminum.

When the pulse gas valve 63a is then turned off, the gas pressure in the reaction chamber 44 is abruptly reduced to substantially stop etching of aluminum while the self-bias voltage is increased, resist is remarkably sputtered and sputtering products adhere to the side walls to serve as protective films, thereby preventing occurrence of side etching. It was conceivably possible to implement anisotropic etching with no side etching by repeating these operations.

<Exemplary Application to Another Etching Apparatus>

While magnetron discharge is used for forming plasma and electromagnetic coils are employed for forming a magnetic field, which in turn is rotated, therefor in each of the aforementioned embodiments 1 to 4, the magnetic field forming means is not necessarily restricted to electromagnetic coils but permanent magnets may be employed, and the magnetic field may not be rotated.

Figure 47:
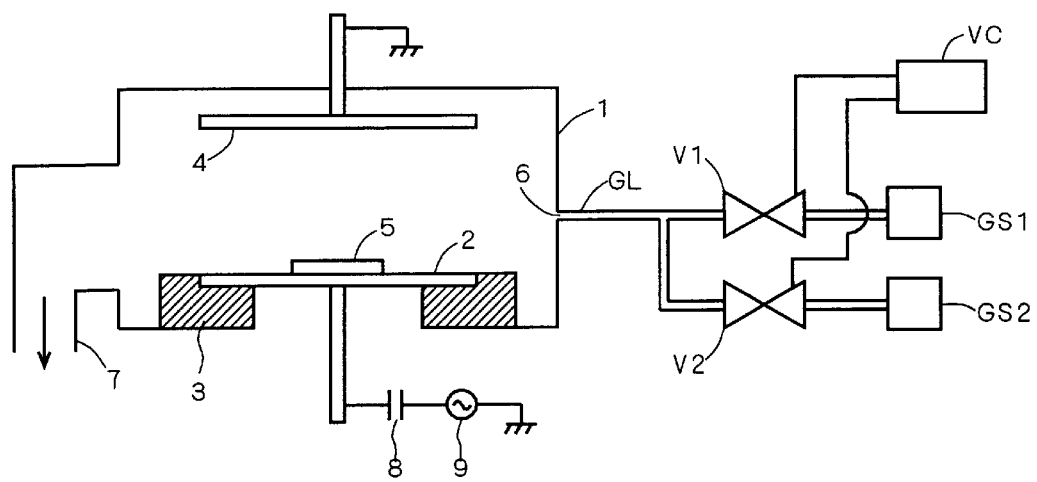
FIG. 47 illustrates the structure of a modification of a conventional plasma processing apparatus.

The plasma forming means is not restricted to magnetron discharge. For example, magnetron discharge has such an advantage that the discharge can be maintained under a relatively high-vacuum condition of not more than 100 mTorr, while ununiformity of the plasma such as the so-called E×B drifting may result from the magnetic field. When the discharge may not be maintained under a high-vacuum state, therefore, no magnetic field forming means may be provided but the plasma processing method according to the present invention may be applied to an RF discharge RIE apparatus performing discharge only with application of a high-frequency discharge pressure. For example, a parallel flat plate type RF discharge RIE apparatus such as the etching apparatus shown in FIG. 47 is suitable for such a plasma processing apparatus of a relatively low vacuum that the pressure of a processing chamber is in excess of 100 mTorr. In this case, no magnetic field forming coils are employed and hence uniformity of plasma is excellent, the apparatus is suitable for processing a wafer having a large diameter, and the apparatus is simple in structure and at a low cost.

The present invention is also applicable to an inductive coupling plasma etching apparatus having no discharge electrode in a processing chamber but forming plasma by inductive coupling, a microwave discharge etching apparatus forming plasma by microwave (2.45 GHz in general) discharge, an ECR (electron cyclotron resonance) discharge RIE apparatus employing a magnetic field resonating with a microwave, an RIE apparatus employing surface wave plasma (SWP) and the like. Concrete examples of these apparatuses are described with reference to embodiments 7 to 10.

When selecting the etching apparatus, a dischargeable pressure must be noted. In order to evacuate reaction products resulting from etching while pulse gas valves are in OFF states and perform etching while the pulse gas valves are in ON states, the dischargeable pressure for plasma must be set to about 200 mTorr at the maximum. A practical etching rate cannot be obtained in an apparatus forming plasma at a pressure exceeding 200 mTorr.

<E. Embodiment 5>

<E-1. Structure of Apparatus>

While the buffer chamber 45 is formed by the wall surface provided with the gas inlet port 66 introducing the gases from the gas supply means 101 among the wall surfaces of the processing chamber 10 and the box-shaped partition wall 43 in the dry etching apparatus 100 according to the embodiment 1 shown in FIG. 1, the partition wall 43 may be provided in the form of a plate having the same magnitude as the inner size of the processing chamber 10 for employing one of two spaces defined by parting the processing chamber 10 with the partition wall 43 provided with the gas inlet port 66 as a buffer chamber 45 while employing the other one as a reaction chamber 44.

Figure 19:
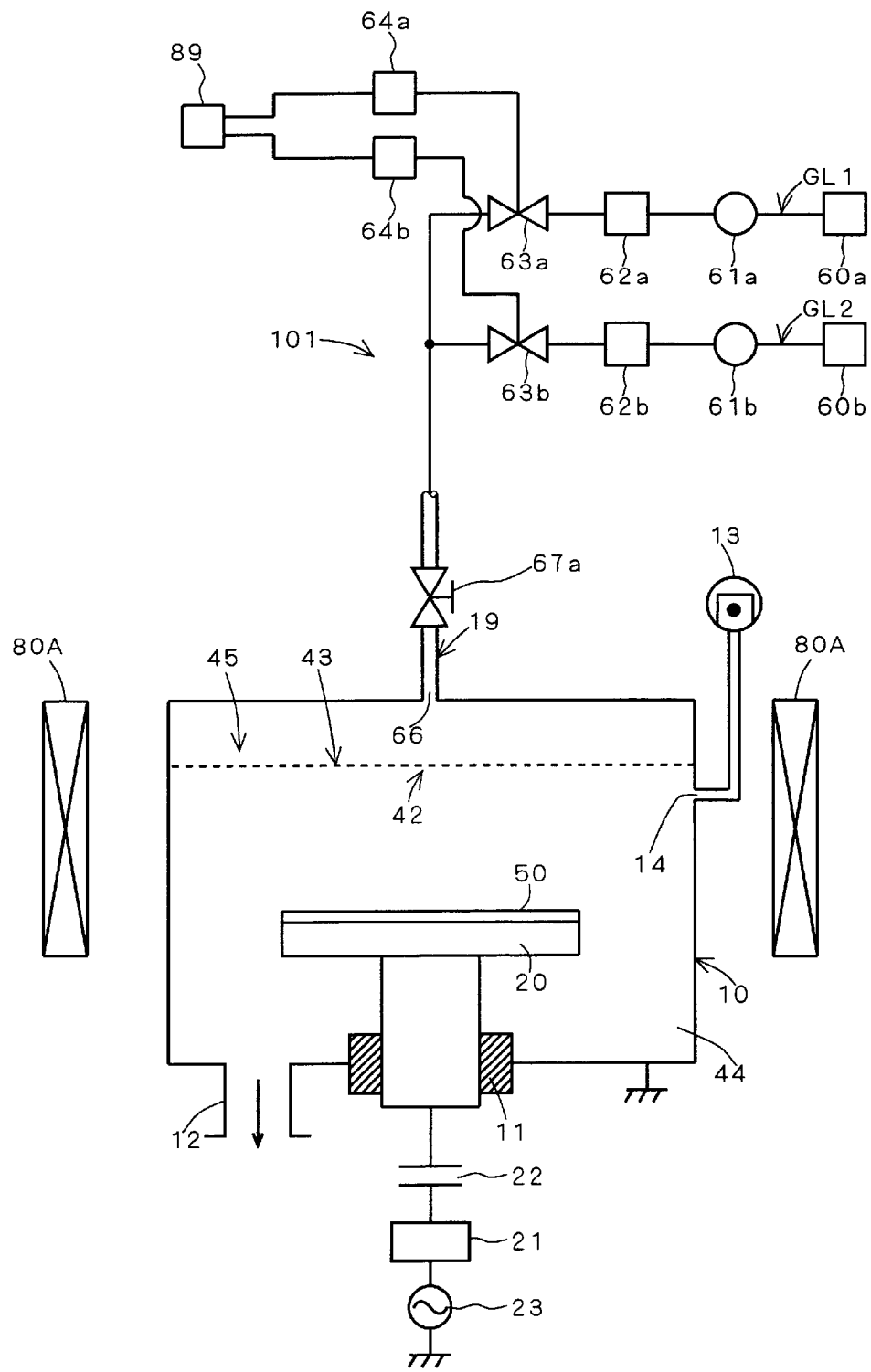
FIG. 19 illustrates the structure of a plasma processing apparatus according to an embodiment 4 of the present invention.

FIG. 19 shows a dry etching apparatus 400 having a buffer chamber 45 with a widened gas blow area according to an embodiment 5 of the present invention. The dry etching apparatus 400 is remarkably different from the dry etching apparatus 100 shown in FIG. 1 only in points that a partition wall 43 is in the form of a plate and a buffer chamber 44 is formed by a wall surface, among those of a processing chamber 10, provided with a gas inlet port 66, part of a side wall continuous with this wall surface and the partition wall 43. Parts similar to those of the dry etching apparatus 100 are denoted by the same reference numerals, to omit redundant description.

Following the aforementioned change of the buffer chamber 45, the position for arranging a pressure measurer 13 for measuring the internal pressure of the reaction chamber 44 is changed to the side wall of the processing chamber 10.

Magnetic field forming coils 80A which are iron core coils are employed in place of the magnetic field forming coils 80 which are air-core coils and an evacuation port 12 is provided only on one portion under an edge portion of a high-frequency electrode 20, while these are not essential change.

<E-2. Function/Effect>

As hereinabove described, the gas blow area of the buffer chamber 45 can be increased by arranging the buffer chamber 45 defined by parting the processing chamber with the plate-shaped partition wall 43, so that gases can be more uniformly supplied to a wafer for enabling more uniform etching in a wafer plane.

<E-3. Modification>

Each of the aforementioned dry etching apparatus 400 and the dry etching apparatuses 100 to 300 described with reference to the embodiments 1 to 4 is provided with a plurality of gas systems for pulsatively supplying a plurality of types of gases and the gas systems are connected with the common gas inlet port, while there is a possibility for occurrence of such a phenomenon that a gas discharged from one of the pulse gas valves flows backward into another pulse gas valve due to small difference between the pressures of the plurality of gas systems or the open/close timing for the valve operations if the length of the gas pipe 19 provided between the pulse gas valves and the gas inlet port is large and the conductance is small.

This phenomenon is particularly remarkable when the pulse gas valves are not provided in correspondence to the respective ones of the plurality of gas systems. This phenomenon is described with reference to FIG. 20.

Figure 20:
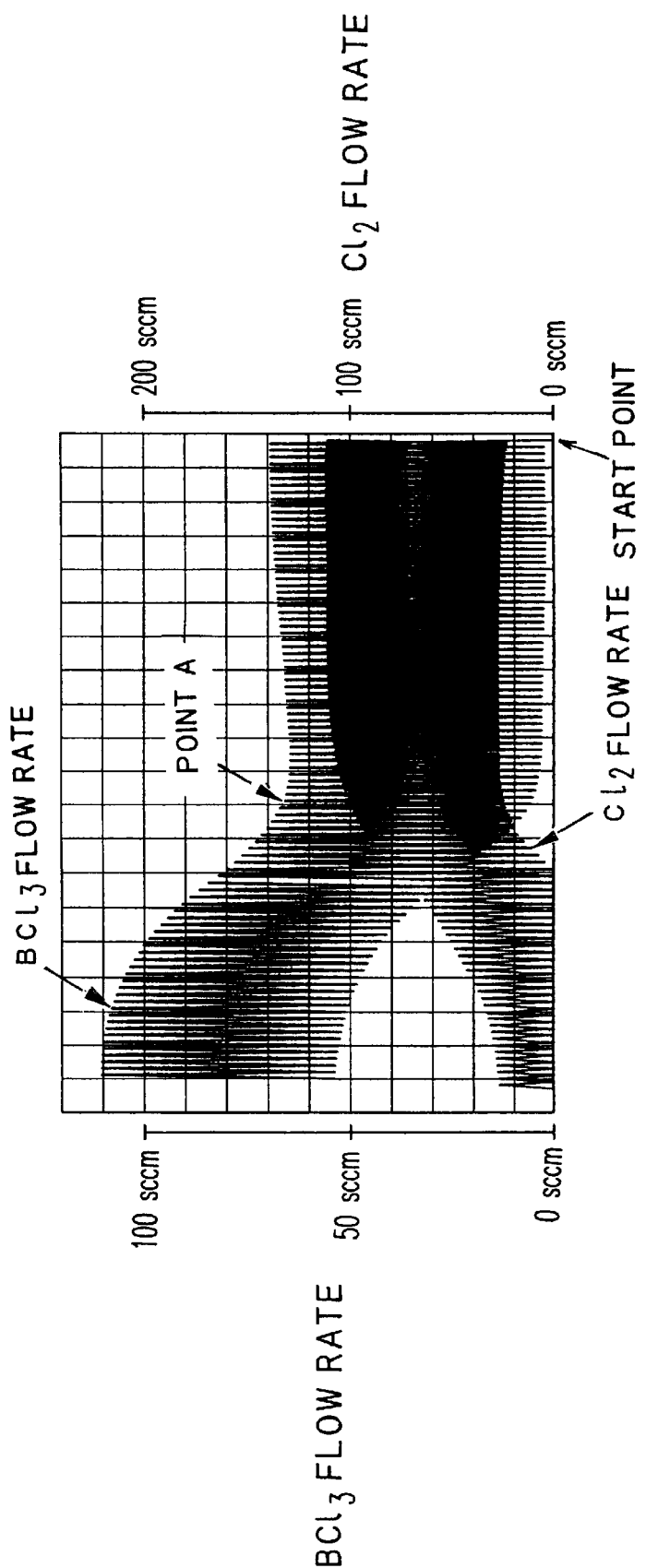
FIG. 20 illustrates a backflow phenomenon of a gas.

FIG. 20 shows fluctuation of flow rates of $Cl_2$ gas and $BCl_3$ gas when operating a single pulse gas valve connected in common with two gas systems supplying $Cl_2$ gas and $BCl_3$ gas at a repetition frequency of 1 Hz. The horizontal axis shows the time, and the vertical axis shows the flow rates. The gas flow rates were obtained from mass flow meters arranged upstream the pulse gas valves, i.e., closer to gas supply sources.

As shown in FIG. 20, the gas flow rates remained stable while periodically fluctuating at 1 Hz when operations of the pulse gas valves were started, while the gas flow rate of $BCl_3$ gas was gradually increased and the minimum value (output value of the mass flow meter) of the flow rate was shifted to a plus side with reference to zero and the gas flow rate of $Cl_2$ gas was gradually reduced and the minimum value (output value of the mass flow meter) of the flow rate was shifted to a minus side with reference to zero, to result in backflow of the gas (the $BCl_3$ gas flowed back into the $Cl_2$ gas system in this example) after a time (point A in FIG. 20) upon a lapse of about 60 seconds from the operation starting of the pulse gas valves.

Thus, the gas backflow phenomenon may take place not only when the number of pulse gas valves is smaller than that of a plurality of gas systems but also when the pulse gas valves are provided in correspondence to the gas systems.

In order to prevent such a phenomenon, a non-return valve may be provided on each respective gas system.

Figure 21:
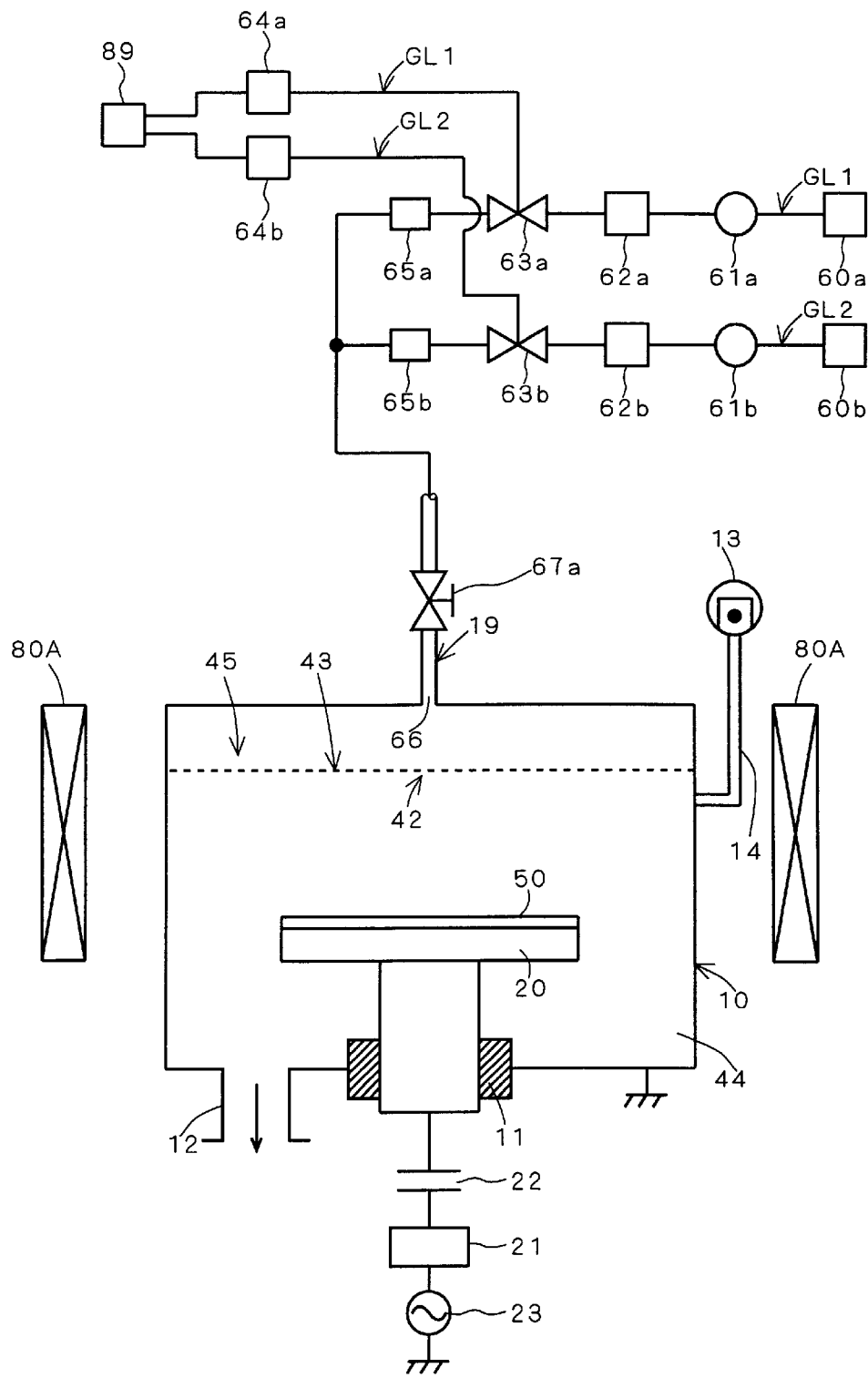
FIG. 21 illustrates the structure of a modification of the plasma processing apparatus according to the embodiment 4 of the present invention.

FIG. 21 shows a dry etching apparatus 400A having non-return valves 65a and 65b provided downstream gas pulse supply systems GL1 and GL2, i.e., behind pulse gas valves 63a and 63b respectively. The remaining structure of the dry etching apparatus 400A is identical to that of the dry etching apparatus 400 shown in FIG. 19.

Due to this structure, backflow of a gas to another gas system is prevented to enable etching having excellent controllability.

The non-return valve may be formed by a commercially available product. For example, it is possible to employ a poppet type stop valve by NUPRO company or the like, which has a connector for a pipe and is hence easy to mount.

<F. Embodiment 6>

The dry etching apparatus 400 according to the embodiment 5 shown in FIG. 19 is provided with the buffer chamber 45 formed by parting the processing chamber 10 with the plate-shaped partition wall 43 thereby increasing the gas blow area of the buffer chamber 45 and enabling more uniform gas supply to a wafer. When pulsatively introducing a plurality of gases into the reaction chamber 44 through the single buffer chamber 45, however, the manners of introduction into the reaction chamber 44 may vary with the properties of the gases to result in such a state that the gases are not synchronously supplied into the reaction chamber 44 even if a plurality of pulse gas valves are synchronously operated.

In order to solve this problem, a structure providing buffer chambers in correspondence to the types of gases is effective. This structure is now described.

<F-1. Structure of Apparatus>

Figure 22:
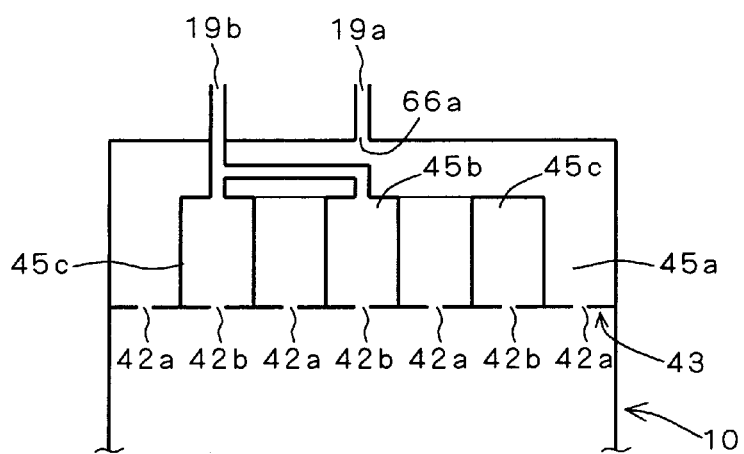
FIG. 22 illustrates the structure of a plasma processing apparatus according to an embodiment 5 of the present invention.

FIG. 22 shows a partial structure of a dry etching apparatus 500 having buffer chambers provided in correspondence to the types of gases according to an embodiment 6 of the present invention. FIG. 22 shows only a structure related to a characteristic part of the embodiment 6, while omitting a structure similar to that of the dry etching apparatus 400 shown in FIG. 19.

Figure 23:
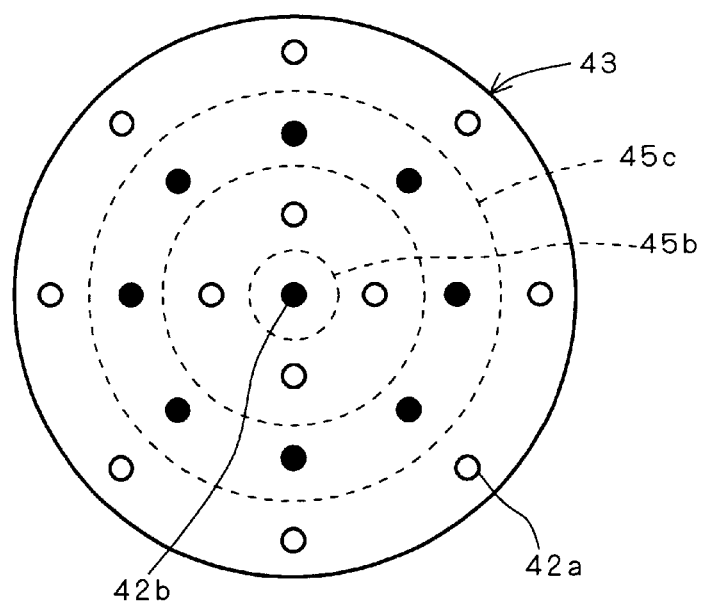
FIG. 23 illustrates the structure of a partition wall.

As shown in FIG. 23, a processing chamber 100 has a buffer chamber 45a formed by parting the processing chamber 10 with a plate-shaped partition wall 43 and independent buffer chambers 45b and 45c provided in this buffer chamber 45a. The buffer chamber 45a is connected with gas pipes 19a and 19b, so that a gas is supplied into the buffer chamber 45a from the gas pipe 19a through a gas inlet port 66a. The buffer chamber 45a can also be referred to as an independent buffer chamber.

The gas pipe 19b is branched to be connected with the buffer chambers 45b and 45c, for supplying a gas into the buffer chambers 45b and 45c.

The gas pipes 19a and 19b, which are connected with gas pulse supply systems GL1 and GL2 similar to those shown in FIG. 19, are not so restricted that the gas pipe 19a is connected with the gas pulse supply system GL1.

The buffer chambers 45b and 45c are provided to cover upper parts of gas feeding holes 42b among a plurality of gas feeding holes, so that the gas introduced into the buffer chambers 45b and 45c is discharged from the gas feeding holes 42b toward a reaction chamber 44. On the other hand, the gas introduced into the buffer chamber 45a is discharged from gas feeding holes 42a toward the reaction chamber 44.

FIG. 23 shows the partition wall 43 as viewed from the reaction chamber 44. For the purpose of clarification, FIG. 23 shows the gas feeding holes 42a and 42b with white circles and black circles respectively.

Figure 24:
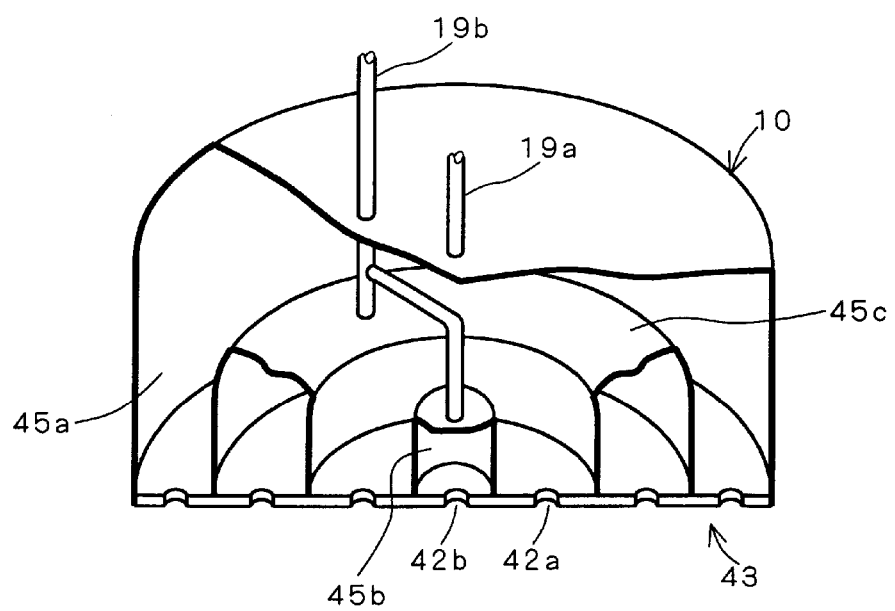
FIGS. 24 and 25 are perspective views illustrating the structure of the plasma processing apparatus according to the embodiment 5 of the present invention.

As shown in FIG. 23, the gas feeding holes 42a and 42b are concentrically alternately arranged, while the buffer chamber 45b has a cylindrical shape to cover only the central gas feeding hole 42b and the buffer chamber 45b has an annular shape to cover the third arrangement of gas feeding holes 42b from the central gas feeding hole 42b. FIG. 24 is a partially fragmented perspective view showing the buffer chamber 45a and the buffer chambers 45b and 45c.

Figure 25:
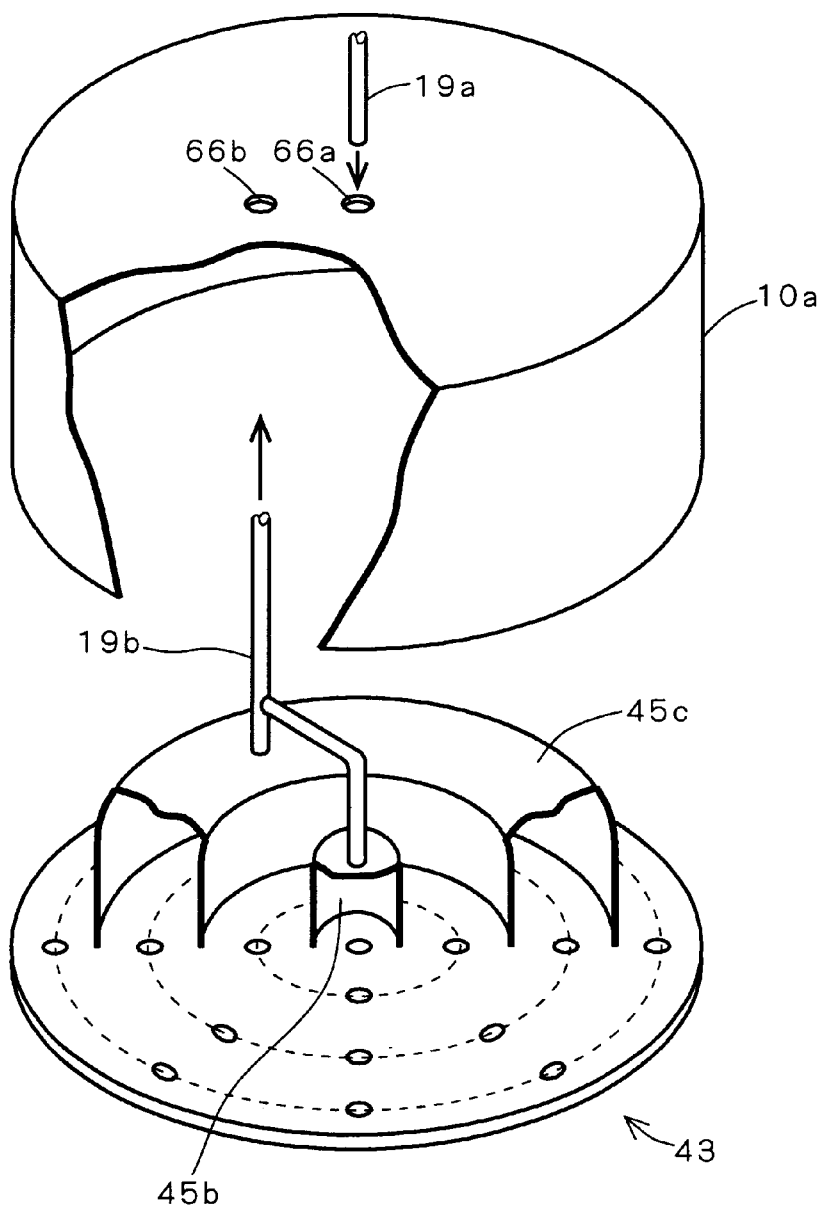

An exemplary procedure of forming the buffer chamber 45a and the buffer chambers 45b and 45c is described with reference to FIG. 25. The buffer chamber 45a and the buffer chambers 45b and 45c can be obtained by airtightly connecting cylindrical and hollow annular structures for defining the buffer chambers 45b and 45c (already connected with the gas pipe 19b) on the partition wall 43 having the gas feeding holes 42a and 42b and airtightly connecting the same with an upper processing chamber 10a defining the buffer chamber 45a. The upper processing chamber 10a is provided with the gas inlet port 66a and a gas inlet port 66d. The gas pipe 19a is inserted in the gas inlet port 66a, the gas pipe 19b is inserted to pass through the gas inlet port 66d, and thereafter the peripheries of the gas inlet ports 66a and 66d are airtightly welded or brazed. Airtight connection between a lower processing chamber (not shown) defining the reaction chamber 44 and the upper reaction chamber 10a is also necessary, as a matter of course.

<F-2. Function/Effect>

Thus, different gases can be discharged from two types of gas feeding holes by dividing a plurality of gas feeding holes concentrically arranged from the center of the partition wall 43 into two types and providing independent buffer chambers covering one of the two types of gas feeding holes. Thus, the respective gas supply states can be readily simulated and the amount of gas supply, the pressure of the reaction chamber 44 etc. can be correctly regulated.

Further, the respective gases can be uniformly supplied into a circular wafer plane by concentrically arranging the gas feeding holes.

<F-3. Modification 1>

Figure 26:
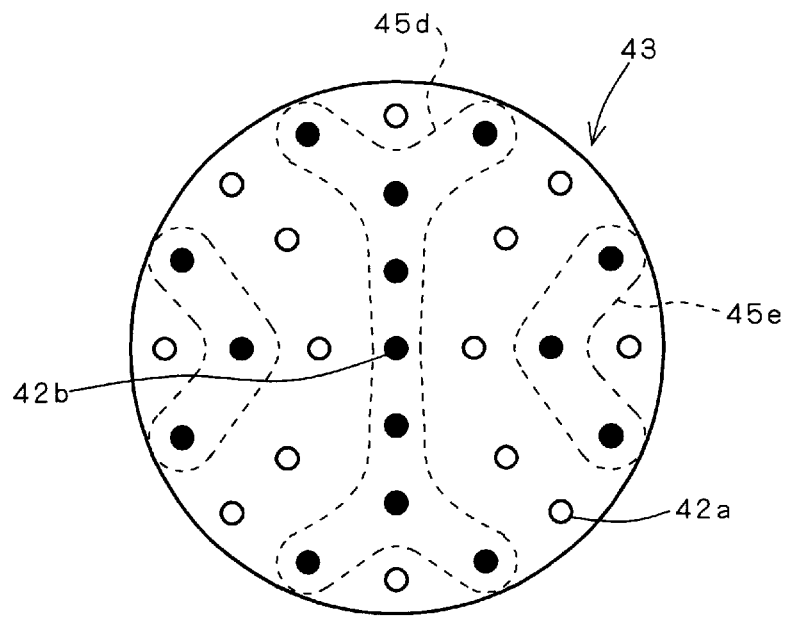
FIG. 26 illustrates the structure of the partition wall.

While the gas feeding holes are concentrically arranged for discharging the same type of gas in one of the arrangements in the above description, the present invention is not restricted to this so far as the gases can be uniformly supplied into a wafer plane. As shown in FIG. 26, gas feeding holes on the same concentric arrangement may alternately discharge different types of gases.

In this case, the shapes of buffer chambers covering gas feeding holes 42b are complicated as those of buffer chambers 45d and 45e shown by broken lines in FIG. 26, for example.

When the number of types of gases introduced into the reaction chamber 44 is increased, the number of the buffer chambers is also increased in correspondence to this, so that the plurality of types of gases are not mixed with each other in the buffer chambers.

<F-4. Modification 2>

While the number of the buffer chambers is identical to that of the types of the gases in the above description, independent buffer chambers may be provided in correspondence to gas feeding holes.

Figure 27:
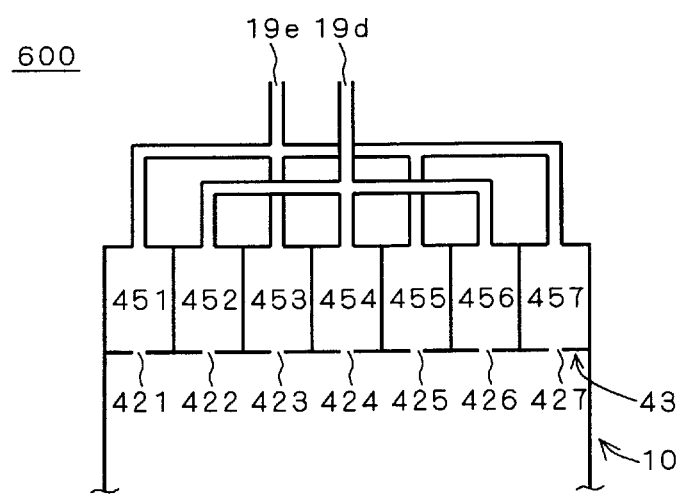
FIG. 27 illustrates the structure of a plasma processing apparatus according to an embodiment 6 of the present invention.

FIG. 27 shows a partial structure of a dry etching apparatus 600 having independent buffer chambers corresponding to gas feeding holes. FIG. 27 shows only a structure related to a characteristic part of this modification, while omitting a structure similar to that of the dry etching apparatus 400 shown in FIG. 19.

As shown in FIG. 27, a processing chamber 10 has a plurality of buffer chambers corresponding to respective ones of a plurality of gas feeding holes. FIG. 27 partially shows buffer chambers (independent buffer chambers) 451 to 457 arranged to cover respective ones of gas feeding holes 421 to 426 arranged on a center line of a partition wall 43. A gas pipe 19d is branch-connected with the buffer chambers 452, 454 and 456, while a gas pipe 19e is branch-connected with the buffer chambers 451, 453, 455 and 457. The gas pipes 19d and 19e, which are connected with gas pulse supply systems GL1 and GL2 similar to those shown in FIG. 19, are not so restricted that the gas pipe 19d is connected with the gas pulse supply system GL1.

Figure 28:
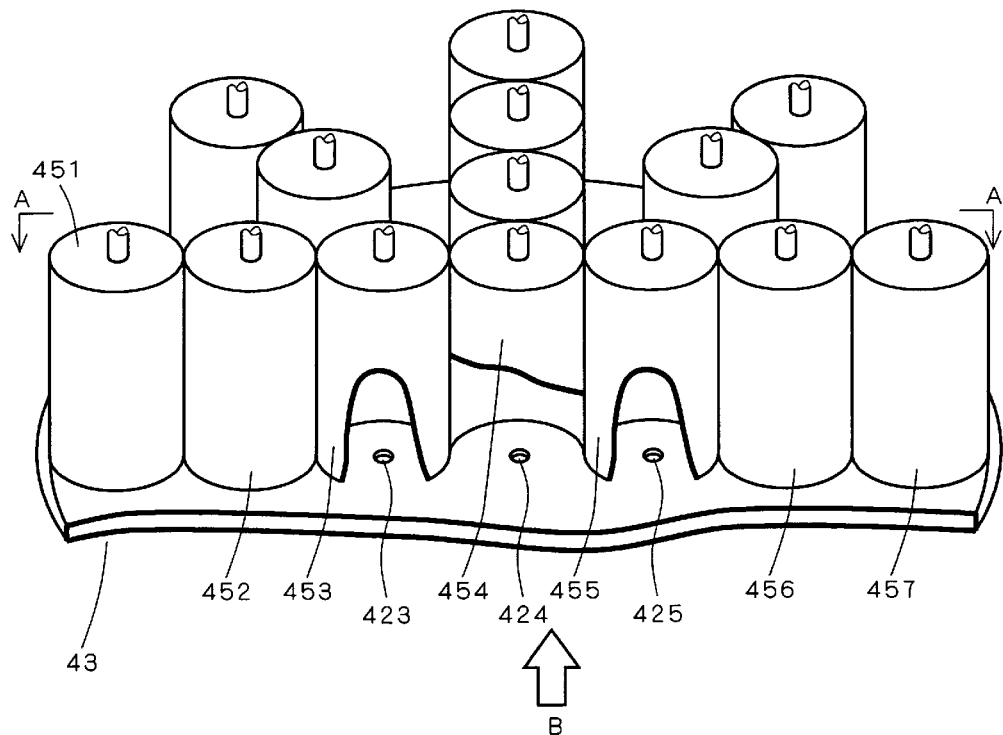
FIG. 28 is a perspective view illustrating the structure of the plasma processing apparatus according to the embodiment 6 of the present invention.

FIG. 28 is a perspective view of the dry etching apparatus 600 as viewed from the buffer chambers. The respective buffer chambers having cylindrical shapes are arranged on the partition wall 43 in one-to-one correspondence to the respective gas feeding holes to cover upper parts thereof. FIG. 27 is a sectional view taken along the line A—A in FIG. 28.

Figure 29:
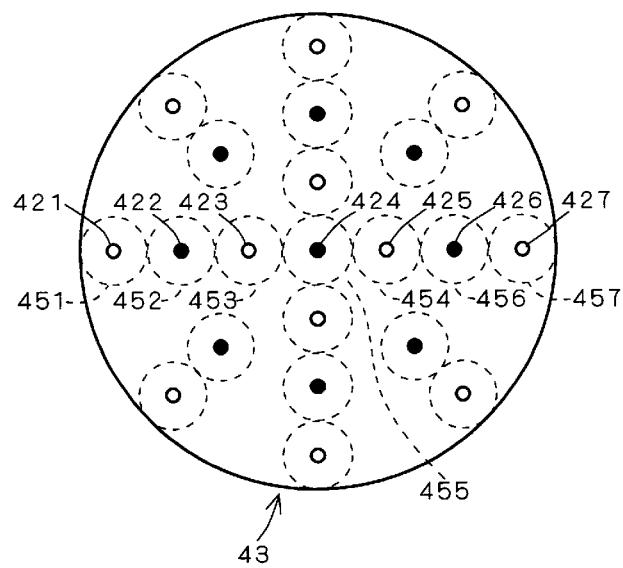
FIG. 29 illustrates the structure of a partition wall.

FIG. 29 shows the structure as viewed along arrow B in FIG. 28. Referring to FIG. 29, the gas feeding holes are concentrically arranged on the partition wall 43, so that those on each concentric arrangement discharge the same type of gas. For the purpose of clarification, FIG. 29 shows the gas feeding holes with white and black circles. The gas feeding holes (e.g., 421, 423, 425 and 427) shown by white circles discharge a gas supplied from the gas pipe 19e, and gas feeding holes (e.g., 422, 424 and 426) shown by black circles discharge a gas supplied from the gas pipe 19d.

Thus, the gases can be more uniformly supplied to a wafer plane due to the structure having the independent buffer chambers corresponding to the gas feeding holes.

When providing gas control means (flow controllers, pressure regulators and the like) in correspondence to the respective buffer chambers, the amounts of the gases discharged from the respective buffer chambers can be individually and correctly controlled.

<F-5. Modification 3>

While the diameters of the gas feeding holes are identical to each other in each of the embodiment 6 and the modifications 1 and 2 thereof, the diameters of the gas feeding holes may not necessarily be identical to each other but may be reduced from the center toward the periphery. When concentrically arranging the gas feeding holes at regular intervals, the effect of increasing the number of the gas feeding holes as approaching the periphery can be canceled and an effect of keeping uniformity of gas supply to the wafer can be attained by this structure.

It is also possible to improve uniformity of the etching rate and the etching shape by varying the diameters and numbers of the gas feeding holes with the types of the discharged gases.

When etching an aluminum wire in a wafer having a large diameter, for example, reaction products may reside at a central portion to inhibit supply of new etching gases, reduce the etching rate and cause excess adhesion of sedimentary substances to side walls.

On the outer peripheral portion, on the other hand, a gas substitution effect is so excessive as compared with the central portion that the amount of sedimentary substances adhering to the side walls is small although the etching rate is high, to result in side etching.

In this regard, the number of gas feeding holes discharging chlorine gas serving as an etching gas is increased or the diameter thereof is enlarged at the central portion. In the peripheral portion, on the other hand, the number of gas feeding holes discharging chlorine gas is reduced or the diameter thereof is reduced. As to a sedimentary gas such as $BCl_3$, $CF_4$, $CHF_3$ or $CH_4$, for example, the number of gas feeding holes discharging the same is increased or the diameter thereof is enlarged at the central portion while the number of the gas feeding holes is reduced or the diameter thereof is reduced at the peripheral portion. Thus, it is possible to improve uniformity of the etching rate and the etching shape of a wafer having a large diameter.

The shape of the gas feeding holes is not restricted to a circular one so far as the same has no possibility for abnormal electric discharge resulting from field concentration on end portions of the feeding holes.

When a single buffer chamber has a plurality of gas feeding holes, the plurality of gas feeding holes may not have the same shape but the shapes of the gas feeding holes may vary with the positions, to be capable of uniformly supplying a gas into a wafer plane.

<G. Embodiment 7>

Each of the aforementioned embodiments 1 to 6 generates the plasma 30 by capacitance coupling discharge with RF power supplied from the high-frequency power source 23 through the high-frequency electrode 20 and the partition wall 43 serving as electrodes as in the dry etching apparatus 400 shown in FIG. 19, for example, the method of generating plasma by RF discharge is not restricted to this but the plasma may be generated by inductive coupling discharge, for example.

A dry etching apparatus 700 according to an embodiment 7 of the present invention comprising plasma generating means by inductive coupling discharge is now described with reference to FIG. 30.

<G-1. Structure of Apparatus>

Figure 30:
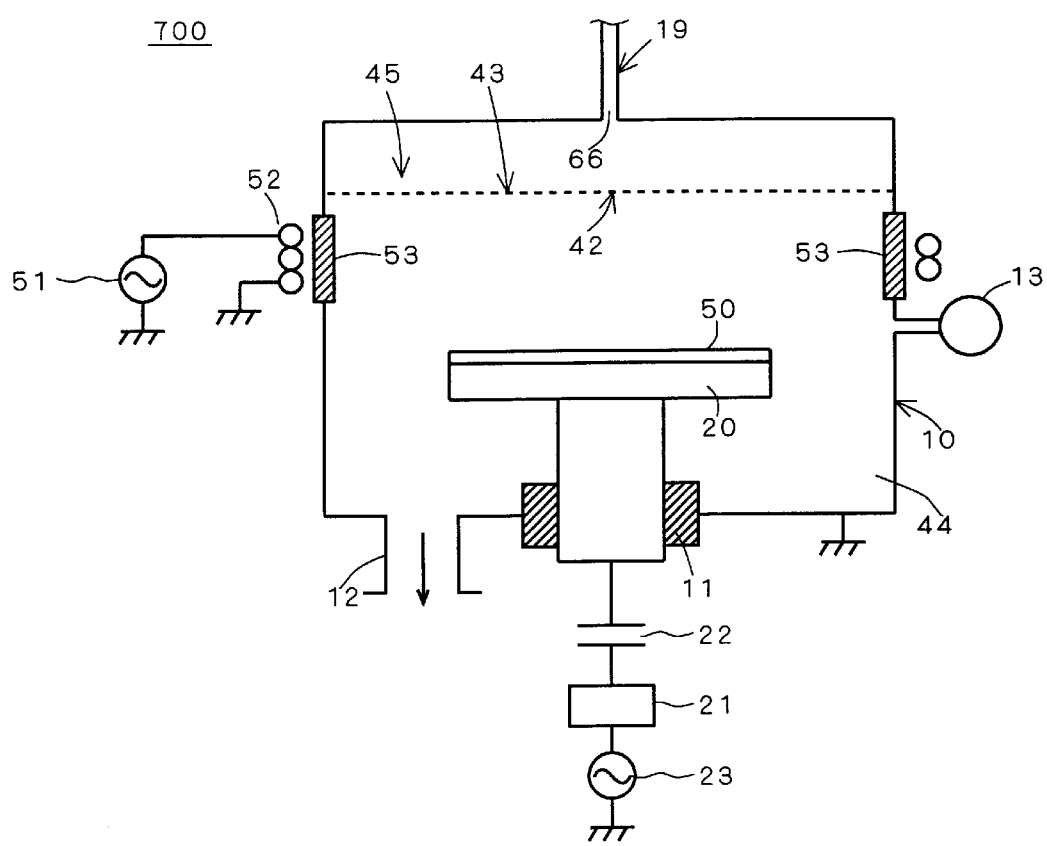
FIG. 30 illustrates the structure of a plasma processing apparatus according to an embodiment 7 of the present invention.

In the dry etching apparatus 700, part of side walls of a reaction chamber 44 of a processing chamber 10 is formed by a ring-shaped dielectric plate 53 of quartz or ceramic, for example, a high-frequency coil 52 is wound around the dielectric plate 53 and a high-frequency power source 51 supplies a high-frequency current to the high-frequency coil 52 for forming an induction electromagnetic field in the vicinity of the coil 52, thereby generating plasma in the reaction chamber 44 and employing the same for inductive coupling discharge and etching, as shown in FIG. 30. Parts identical to those of the dry etching apparatus 400 shown in FIG. 19 are denoted by the same reference numerals, to omit redundant description.

RF power supplied from the high-frequency power source 23 to a high-frequency electrode 20 is employed not for generating plasma but for generating a bias voltage for attracting ions and the like to a wafer from plasma generated by inductive coupling discharge, and its frequency is set to such a degree (about several 100 kHz) that ions can follow change of the voltage.

No high-frequency power source 23, blocking capacitor 22 and impedance matching apparatus 21 may be provided but the high-frequency electrode 20 may be at a ground potential.

The high-frequency coil 52 may not necessarily have a circular section but its section may be rectangular.

A coolant such as water may be fed into the coil 52 for cooling the coil 52 and preventing the same from heat generation so that a large current is applicable to the coil 52, in order to process a wafer having a large diameter.

<G-2. Function/Effect>

Plasma generated by such a method has a low space potential and loss of electrons from the plasma caused by field drifting is reduced, whereby the plasma can be generated with relatively low RF power in a high vacuum state as compared with the dry etching apparatus 400 shown in FIG. 19.

Further, no external magnetic field is required for forming the plasma, whereby the apparatus is simplified in structure and the cost therefor is reduced.

<H. Embodiment 8>

While the dry etching apparatus utilizing plasma generated by RF discharge is described with reference to each of the embodiments 1 to 7, formation of plasma is not restricted to RF discharge but the plasma may be generated by microwave discharge, for example.

A dry etching apparatus 800 comprising means for generating plasma with microwave discharge according to an embodiment 8 of the present invention is now described with reference to FIGS. 31 and 32.

<H-1. Structure of Apparatus>

Figure 31:
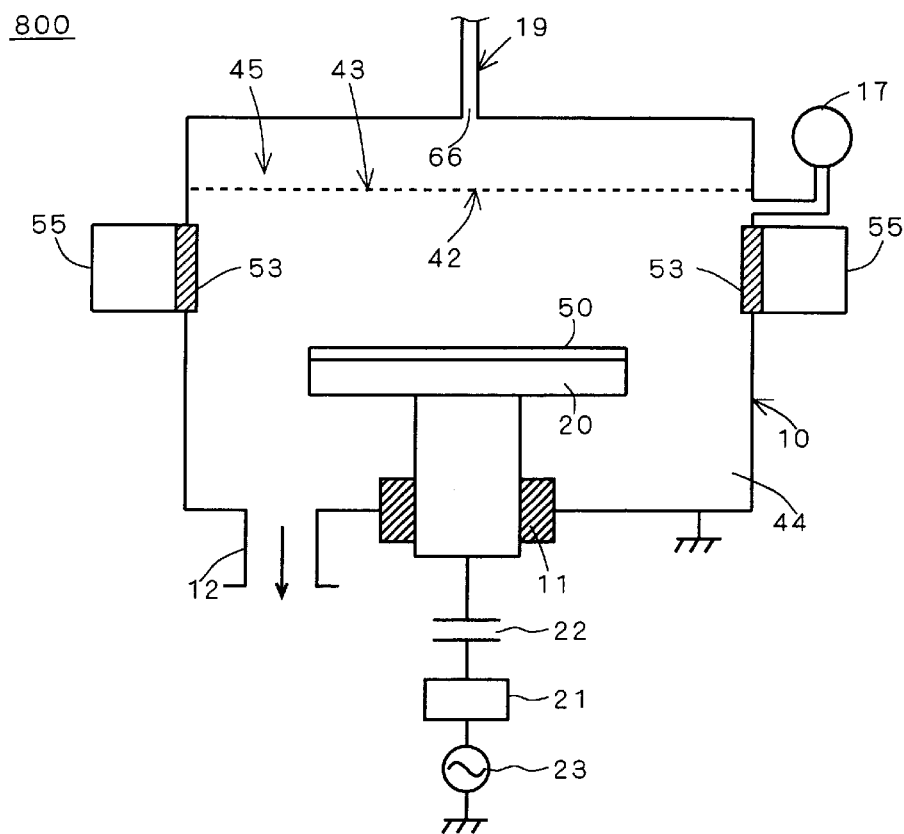
FIG. 31 illustrates the structure of a plasma processing apparatus according to an embodiment 8 of the present invention.

In the dry etching apparatus 800, part of side walls of a reaction chamber 44 of a processing chamber 10 is formed by a dielectric plate 53 of quartz or ceramic, for example, and a waveguide 55 transmitting a microwave is arranged around the processing chamber 10 to cover the dielectric plate 53, as shown in FIG. 31. A microwave is transmitted from a microwave power source (not shown) through the waveguide 55 and a microwave electric field is introduced into the reaction chamber 44 through the dielectric plate 53 for generating plasma in the reaction chamber 44 and employing the same for etching. Parts identical to those of the dry etching apparatus 400 shown in FIG. 19 are denoted by the same reference numerals, to omit redundant description.

Figure 32:
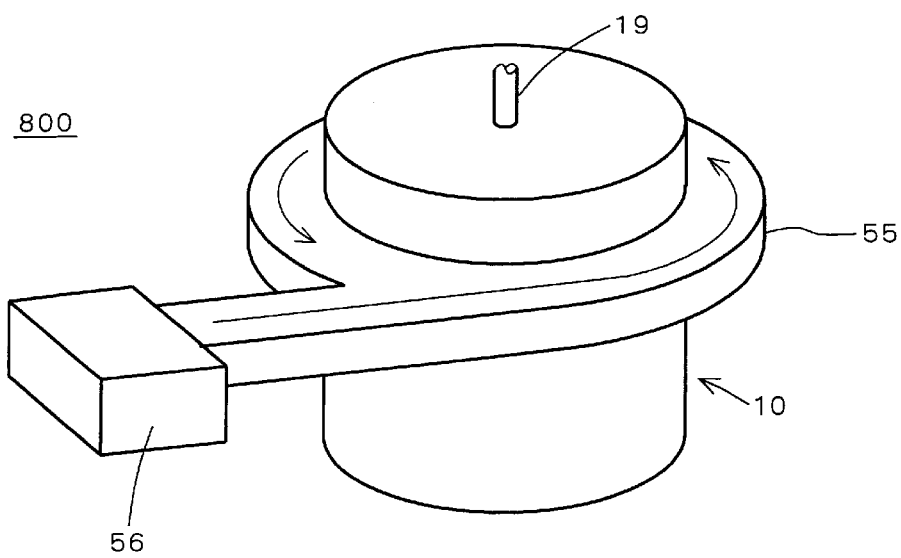
FIG. 32 is a perspective view illustrating the structure of the plasma processing apparatus according to the embodiment 8 of the present invention.

FIG. 32 is a perspective view of the dry etching apparatus 800. As shown in FIG. 32, the waveguide 55 encloses the processing chamber 10, and a microwave power source 56 is connected with an end thereof. A partition plate is provided on another end along the travelling direction of the microwave shown by arrows in FIG. 32. As understood from this, the dielectric plate 53 is in the form of a ring having a rectangular sectional shape shown in FIG. 31. FIGS. 31 and 32 show neither an evacuation port of the processing chamber 10 nor a high-frequency electrode.

<H-2. Function/Effect>

With a microwave electric field, plasma having excellent uniformity can be generated in an area having a relatively high pressure of about 1 Torr to several Torr, for effectively processing a wafer having a large diameter.

<H-3. Modification>

While the dielectric plate 53 has a magnitude (area) substantially identical to an opening area of the waveguide 55 in the aforementioned dry etching apparatus 800, the area of the dielectric plate 53 may be smaller than the opening area of the waveguide 55 for increasing the strength of the microwave electric field. Such a structure is described with reference to FIG. 33 showing a dry etching apparatus 800A.

Figure 33:
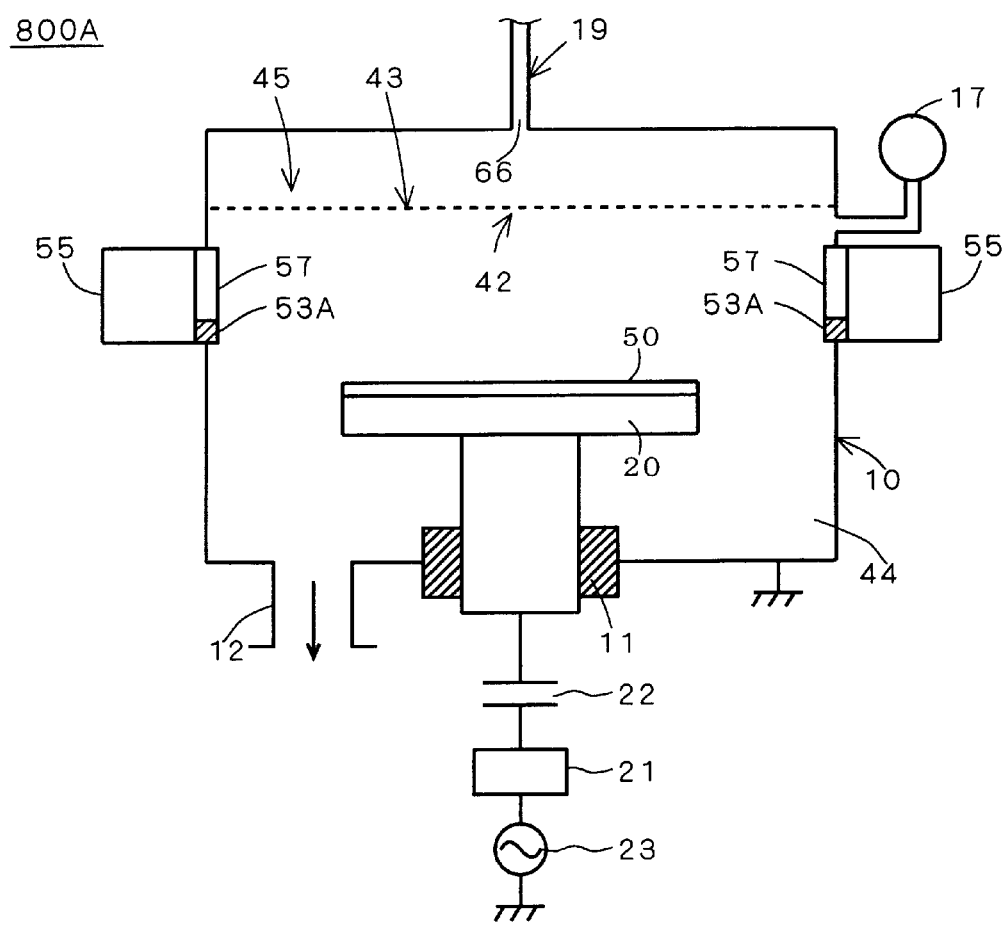
FIG. 33 illustrates the structure of a modification of the plasma processing apparatus according to the embodiment 8 of the present invention.

Referring to FIG. 33, part of side walls of a reaction chamber 44 covered with a waveguide 55 is formed by a dielectric plate 53A having an area smaller than an opening area of the waveguide 55, while the remaining part is formed by a shield (referred to as an iris) 57 of a conductor (metal). The dielectric plate 53A as well as the iris 57 are in the form of rings. The iris 57 may alternatively be defined by part of the wall surfaces of the reaction chamber 44.

In general, the dimensions of a waveguide are so designed that a transmission mode for a microwave is the basic mode and a microwave of the basic mode is introduced by rendering the area of a dielectric member defining its outlet substantially identical to the opening area of the waveguide, while the microwave is disturbed to form a higher mode other than the basic mode in the waveguide 55 when the area of the dielectric plate 53A is rendered smaller than the opening area of the waveguide 55 while defining the iris 57 by the remaining part as in the dry etching apparatus 800. This modification has such a characteristic that a high electric field is formed in the vicinity of the iris 57 due to the higher mode and introduced into the reaction chamber 44 to simplify discharge.

The iris 57 serves also as an impedance element, to simplify impedance matching in the present invention where the pressure of the reaction chamber 44 remarkably fluctuates.

<I. Embodiment 9>

In each of the aforementioned embodiments 1 to 8, the buffer chamber 45 is arranged on the upper portion of the processing chamber 10 and the gases are discharged downward from the gas feeding holes 42 provided on the partition wall 43, as in the dry etching apparatus 400 shown in FIG. 19, for example. In a dry etching apparatus utilizing RF discharge or microwave discharge employing no partition wall 43 as an electrode for discharge, however, a buffer chamber may not be arranged on an upper portion of a processing chamber but may be arranged on a side wall of the processing chamber.

A dry etching apparatus 900 according to an embodiment 9 of the present invention comprising means for forming plasma with microwave discharge and arranging a buffer chamber on a side wall of a processing chamber is now described with reference to FIGS. 34 and 35.

<I-1. Structure of Apparatus>

Figure 34:
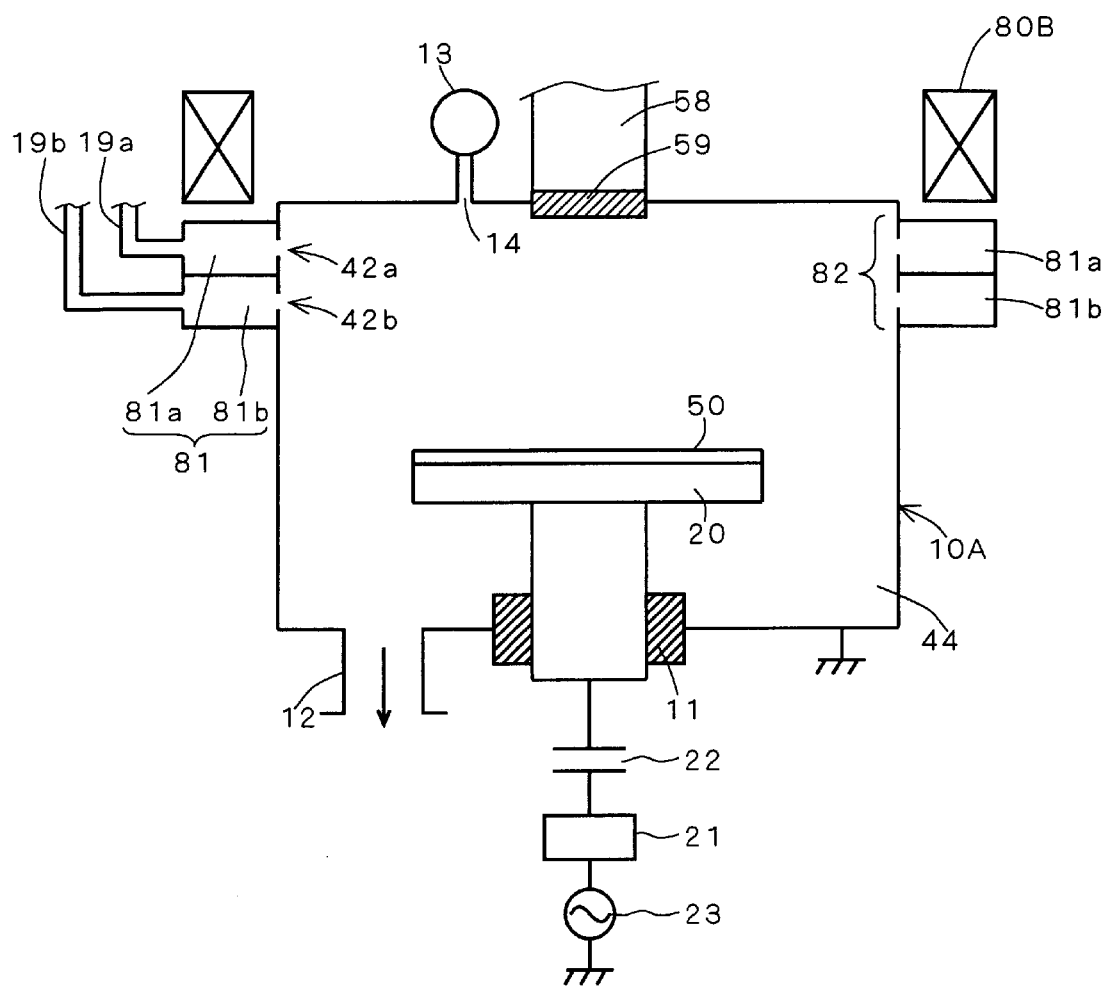
FIG. 34 illustrates the structure of a plasma processing apparatus according to an embodiment 9 of the present invention.

The dry etching apparatus 900 shown in FIG. 34 comprises a processing chamber 10A having side walls partially formed by a partition wall 82 of a buffer chamber 81 and an upper surface partially formed by a dielectric member 58 defining a microwave introduction window and connected with a waveguide 58 covering the dielectric plate 59. A cylindrical magnetic field forming coil 80B applying a perpendicular magnetic field into the processing chamber 10A and generating ECR discharge plasma by interaction with a microwave is set in the vicinity of the upper surface of the processing chamber 10A. Parts identical to those of the dry etching apparatus 400 shown in FIG. 19 are denoted by the same reference numerals, to omit redundant description.

Figure 35:
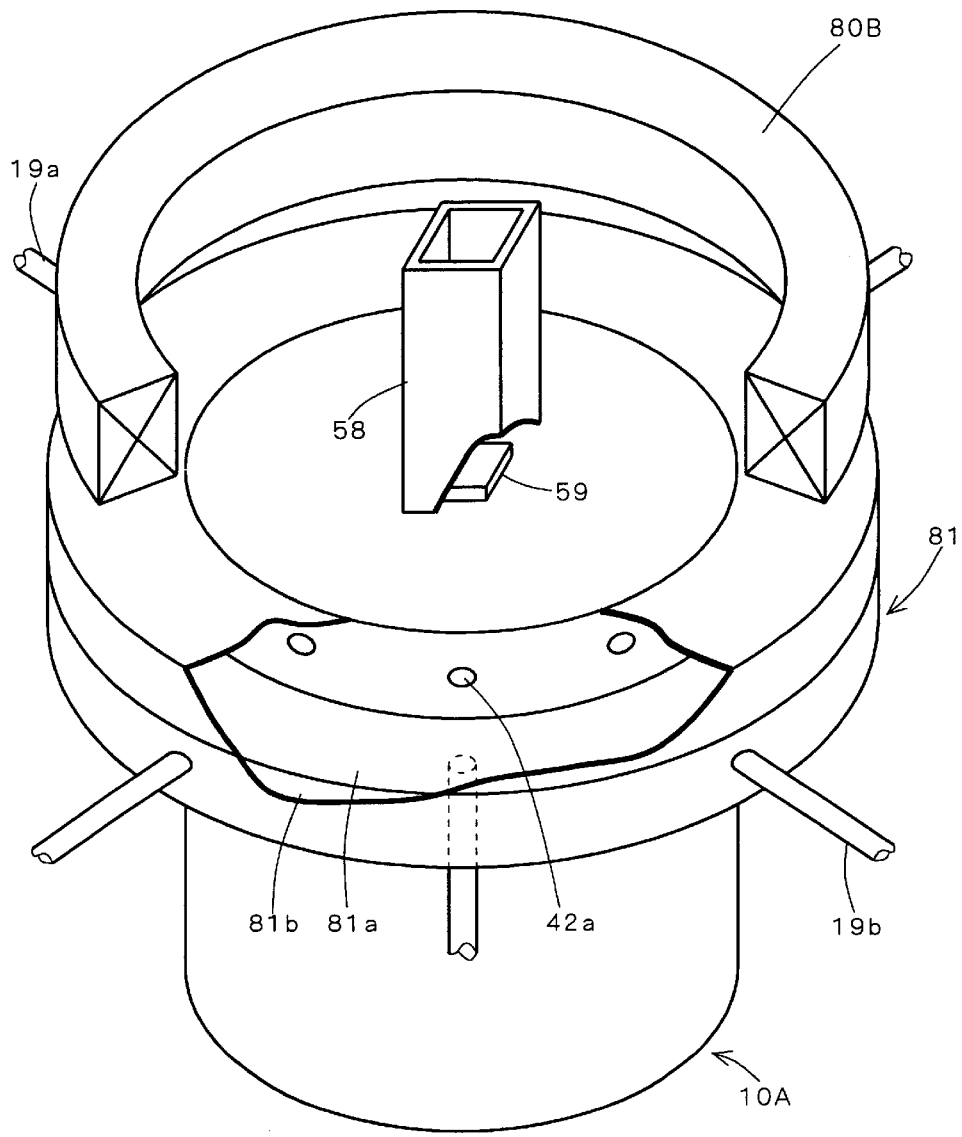
FIG. 35 is a perspective view illustrating the structure of the plasma processing apparatus according to the embodiment 9 of the present invention.

FIG. 35 is a perspective view of the dry etching apparatus 900. As shown in FIG. 35, the buffer chamber 81 is formed by independent buffer chambers 81a and 81b. The buffer chamber 81a is arranged to cover a plurality of gas feeding holes 42a formed along the ring-shaped partition wall 82 partially forming the side wall of the processing chamber 10A, while the buffer chamber 81b is arranged to cover a plurality of gas feeding holes 42b (not shown) formed along the partition wall 82. The buffer chambers 81a and 81b are connected with a plurality of gas pipes 19a and 19b respectively.

The gas pipes 19a and 19b, which are branched from gas pulse supply systems GL1 and GL2 similar to those shown in FIG. 19 and connected, are not so restricted that the gas pipe 19a is connected with the gas pulse supply system GL1.

<I-2. Function/Effect>

When gases are pulsatively introduced into the buffer chambers 81a and 81b respectively in the dry etching apparatus 900 having the aforementioned structure similarly to the embodiments 1 to 8, it follows that the gases are pulsatively introduced into the reaction chamber 44 through the plurality of gas feeding holes 42a and 42b provided on the ring-shaped partition wall 82. When introducing a microwave of 2.45 GHz into the reaction chamber 44 from a microwave power source (not shown) through the waveguide 58 and applying a magnetic field of 875 G into the processing chamber 10A with the magnetic field forming coil 80B, ECR plasma is formed.

The ECR plasma, which can maintain discharge at a degree of vacuum of about 1 mTorr, enables anisotropic etching of a finer pattern.

Gases can be uniformly supplied to a wafer surface in the processing chamber 10A and uniformity of etching can be improved by supplying gases into the buffer chambers 81a and 81b through the plurality of gas pipes 19a and 19b.

<I-3. Modification 1>

While the buffer chamber 81 having the two buffer chambers 81a and 81b can independently introduce two types of gases, the number of independent buffer chambers may be increased by providing vertical partitions in the buffer chambers 81a and 81b and dividing the same, for independently introducing a larger number of types of gases.

The buffer chamber 81 arranged to project from the outer periphery of the processing chamber 10A may alternatively be arranged to project toward the inner part of the processing chamber 10A, and the overall apparatus can be miniaturized in this case.

The means for forming the magnetic field of 875 G in the processing chamber 10A is not restricted to an electromagnetic coil but a permanent magnet may alternatively be employed.

<I-4. Modification 2>

While the microwave is introduced into the processing chamber 10A through the dielectric plate 59 having a magnitude substantially equal to the opening area of the rectangular waveguide 58 in the dry etching apparatus 900, the area of the dielectric plate 59 may be enlarged in order to improve uniformity of the formed plasma.

Figure 36:
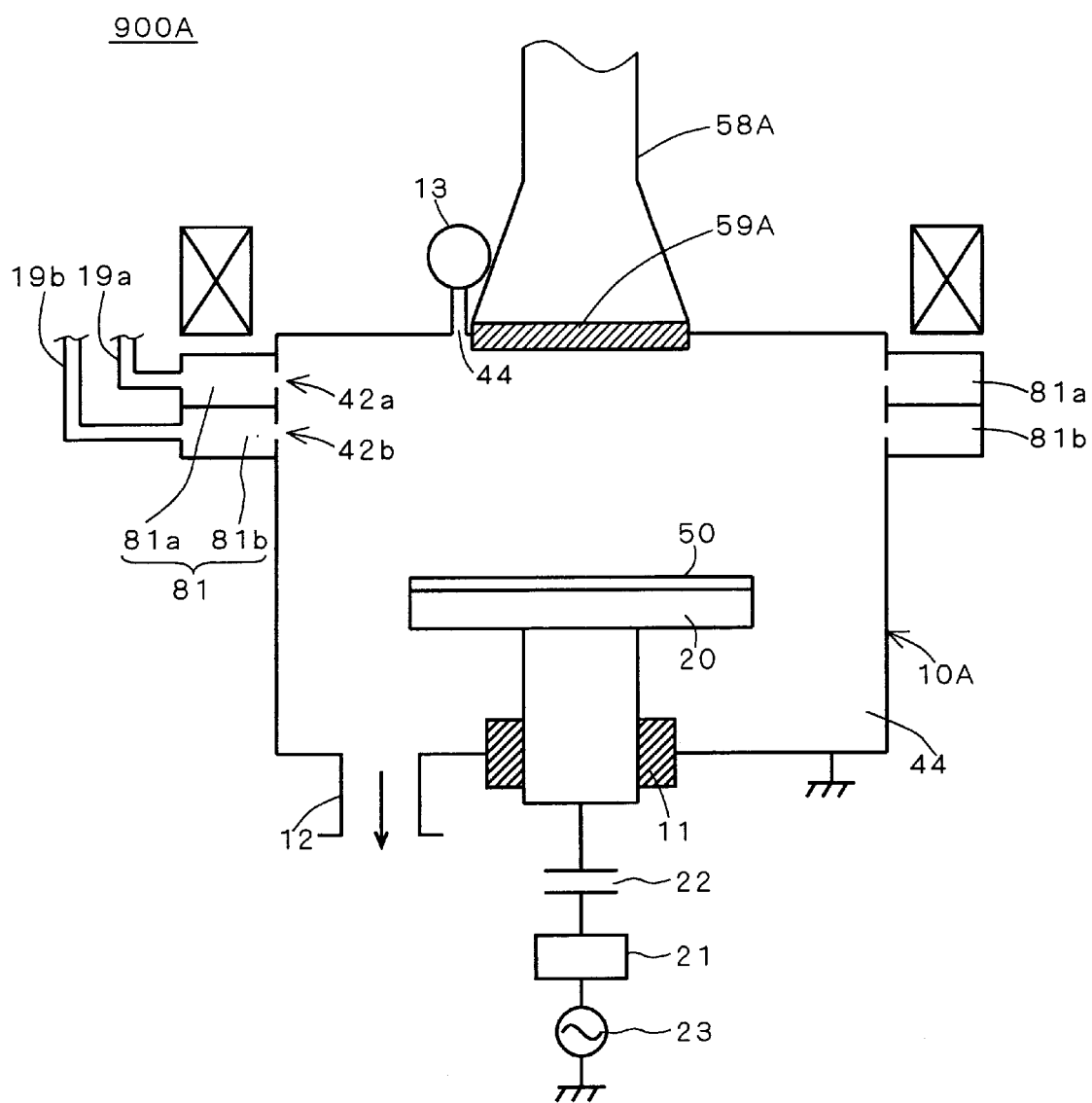
FIG. 36 illustrates the structure of a modification of the plasma processing apparatus according to the embodiment 9 of the present invention.

FIG. 36 shows the structure of a dry etching apparatus 900A including a dielectric plate 59A having a larger area. Parts identical to those of the dry etching apparatus 900 shown in FIG. 34 are denoted by the same reference numerals, to omit redundant description.

As shown in FIG. 36, the area of the dielectric plate 59A is larger than that of the dielectric plate 59, while a waveguide 58A has a tapered sectional shape with a forward end spread toward the dielectric plate 59A to cover the dielectric plate 59A. While a general waveguide has a rectangular sectional shape, uniformity of plasma can be improved by circularizing the sectional shape of the waveguide 58A other than the forward end with a rectangular-circular converter (not shown) on the forward end portion of the waveguide 58A. When employing a waveguide having a circular sectional shape along the overall area, no rectangular-circular converter is necessary, as a matter of course.

<J. Embodiment 10>

While the microwave is directly introduced into the processing chamber, i.e., into the reaction chamber from the waveguide in the aforementioned embodiment 9, the microwave may be temporarily introduced into a chamber called a cavity for improving the strength of an electric field in the reaction chamber.

Figure 37:
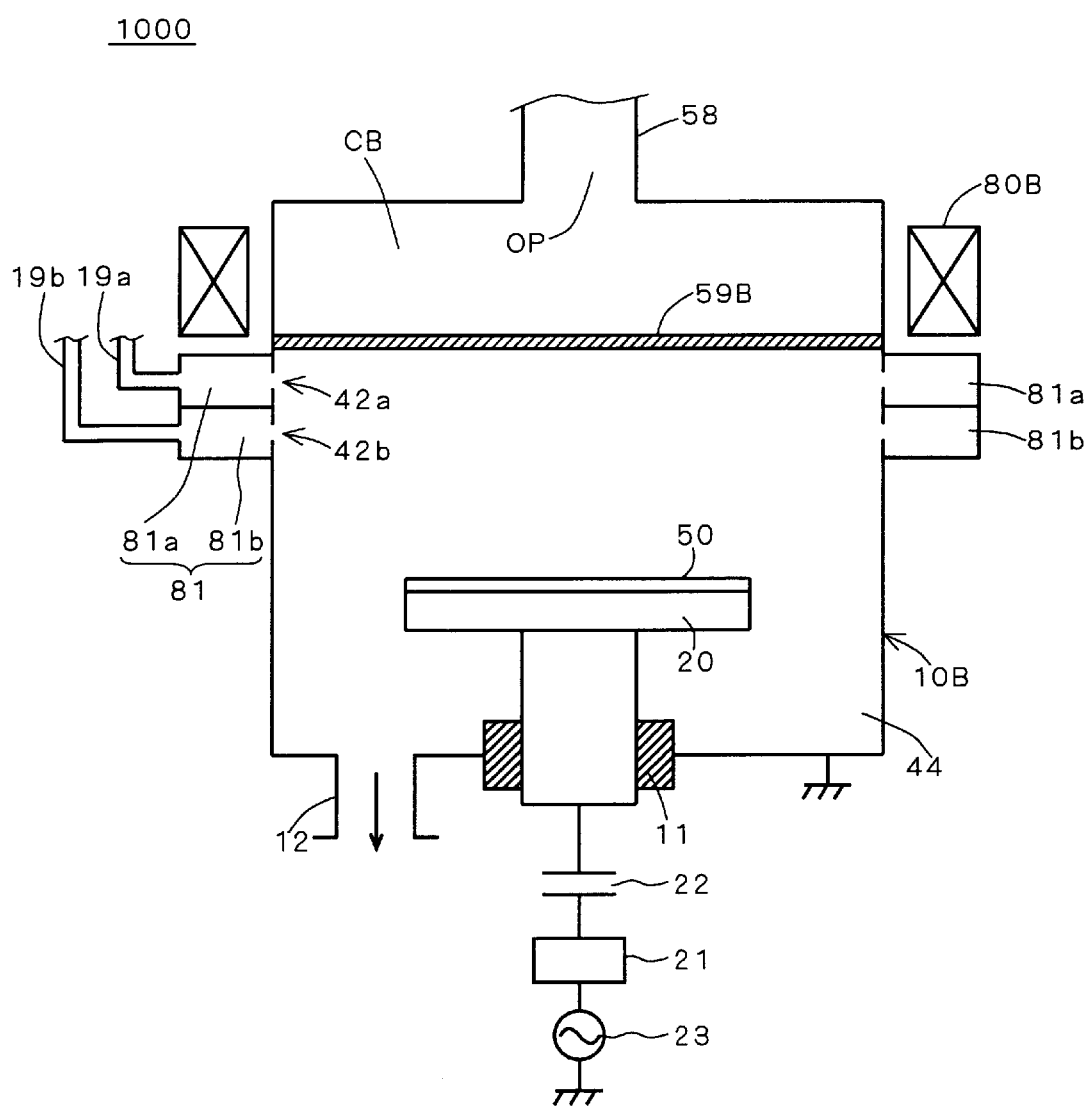
FIG. 37 illustrates the structure of a plasma processing apparatus according to an embodiment 10 of the present invention.

A dry etching apparatus 1000 comprising a cavity according to an embodiment of the present invention is now described with reference to FIGS. 37 and 38.

J-1. Structure of Apparatus>

The dry etching apparatus 1000 shown in FIG. 37 comprises a processing chamber 10B having side walls partially formed by a partition wall 82 of a buffer chamber 81, a space above the buffer chamber 81 partitioned by a flat dielectric plate 59B to define a cavity (cavity resonance chamber) CB and a part below the dielectric plate 59B defining a reaction chamber 44. Part of the upper surface of the cavity CB is provided with an opening OP, which is connected with a waveguide 58.

Parts identical to those of the dry etching apparatus 900 shown in FIG. 34 are denoted by the same reference numerals, to omit redundant description.

Figure 38:
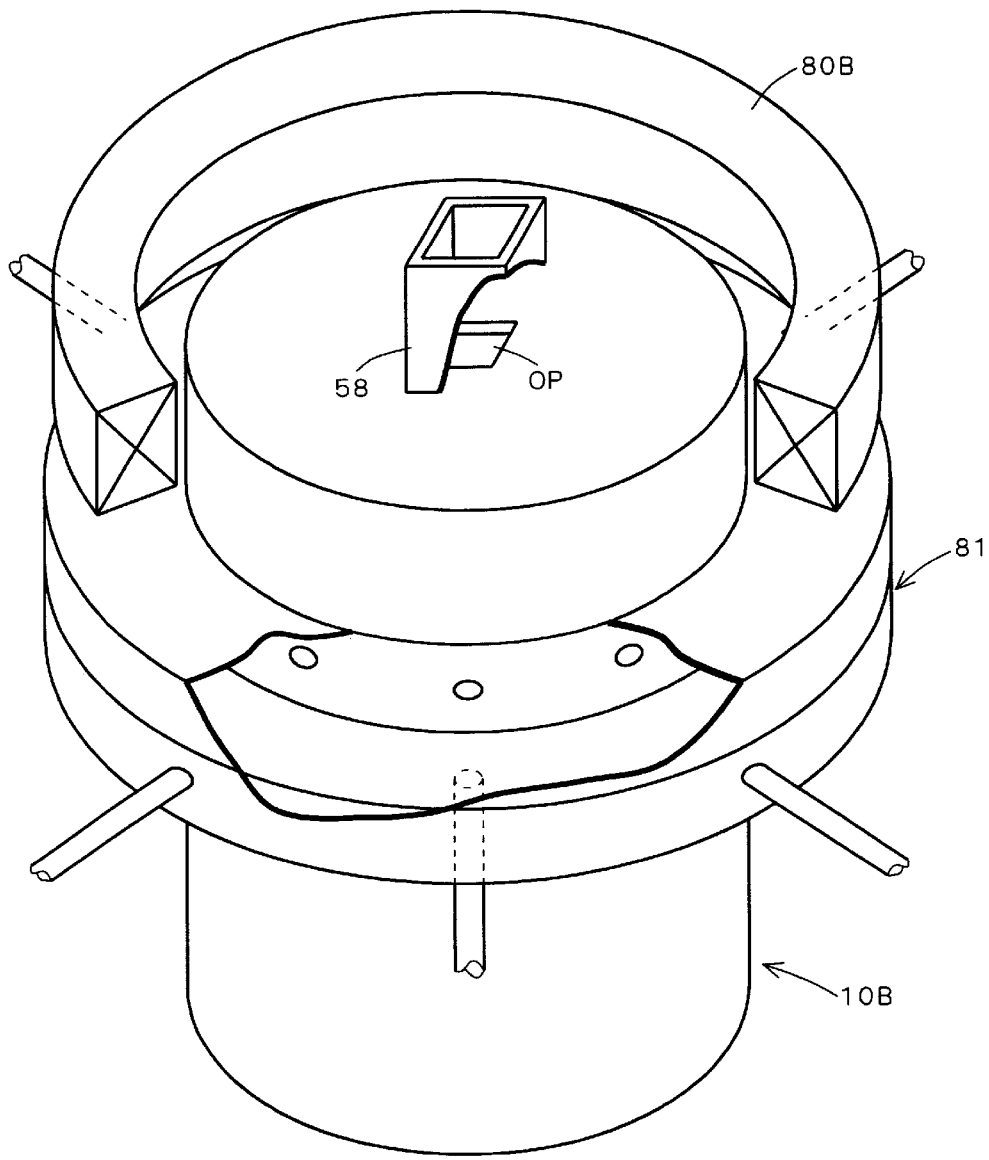
FIG. 38 is a perspective view illustrating the structure of the plasma processing apparatus according to the embodiment 10 of the present invention.

FIG. 38 is a perspective view of the dry etching apparatus 1000. The cavity CB has a cylindrical shape. In general, the shape of the cavity CB is set in a cavity resonance structure resonating with a microwave, in order to obtain homogeneous field strength capable of starting discharge. While the cavity CB may have a cylindrical or rectangular shape, the dimensions of the cavity CB and the reaction chamber 44 are so decided that a TE11 mode of a fundamental wave is excited and at least one crest of the excitation wavelength, i.e., part having high microwave strength is formed above a wafer 50 in the reaction chamber 44 when the cavity CB has a cylindrical shape. While the diameter of the dielectric plate 59B is identical to the inner diameter of the processing chamber 10B in FIG. 37, the effect of cavity resonance can be improved by changing the outer peripheral portion of the dielectric plate 59B to a conductor plate and reducing the diameter of the dielectric plate 59B.

<J-2. Function/Effect>

As hereinabove described, discharge starting can be simplified and the discharge can be stably maintained by introducing the microwave into the cavity CB and increasing the field strength of the microwave in the reaction chamber 44 by cavity resonance.

<J-3. Modification 1>

While the dry etching apparatus 1000 described with reference to FIG. 37 has the cavity CB defined by parting the space above the buffer chamber 81 with the flat dielectric plate 59B, the dielectric plate may have not a flat plate shape but a semispherical shape.

Figure 39:
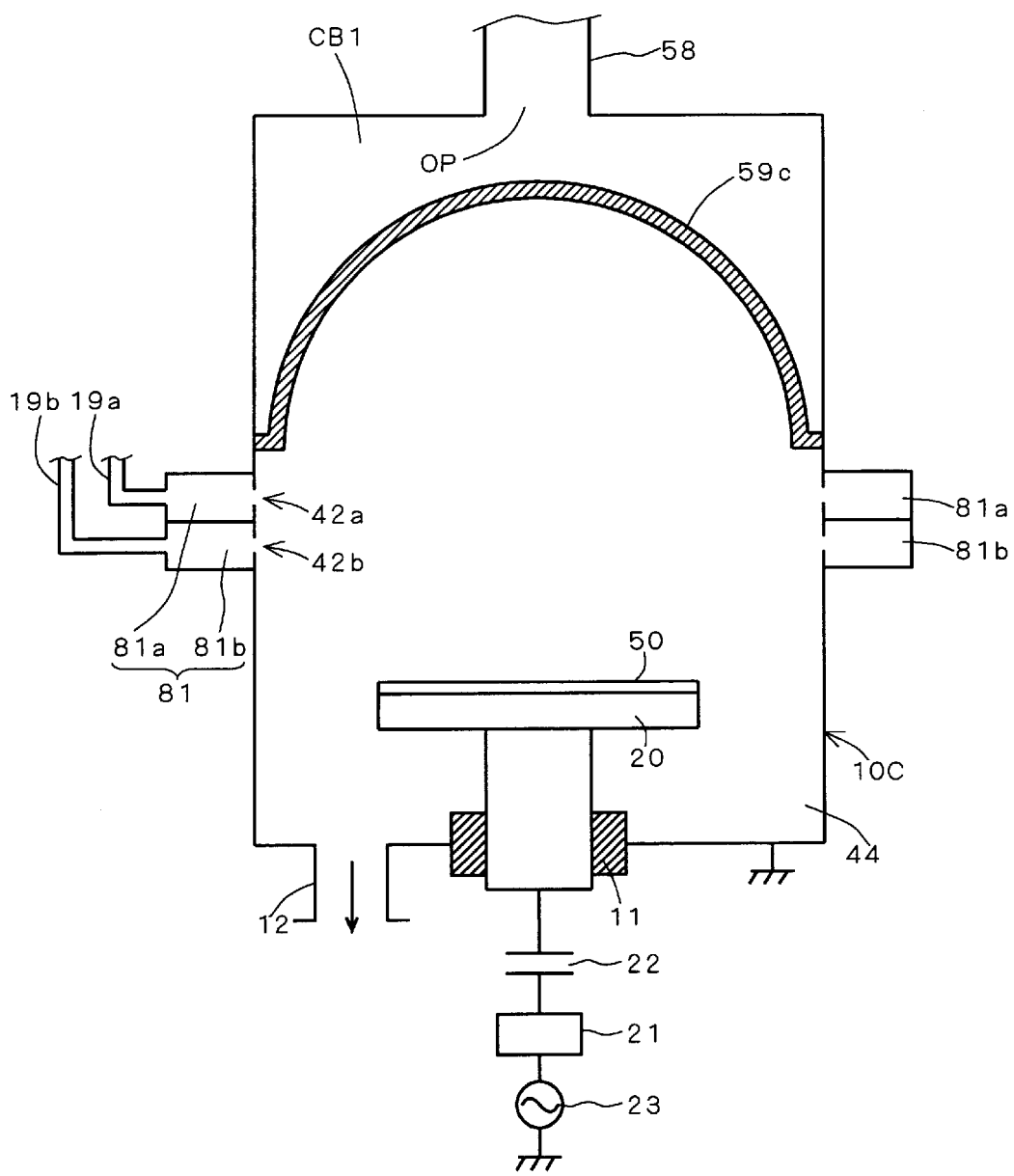
FIGS. 39 and 40 illustrate the structures of modifications of the plasma processing apparatus according to the embodiment 10 of the present invention.

FIG. 39 shows a dry etching apparatus 1100 having such a structure. As shown in FIG. 39, the dry etching apparatus 1100 has such a processing chamber 10C that a semispherical dielectric plate 59C parts a space above a buffer chamber 81 to define a cavity CB1 and a part below the dielectric plate 59C defines a reaction chamber 44. Parts identical to those of the dry etching apparatus 900 shown in FIG. 34 are denoted by the same reference numerals, to omit redundant description.

In the dry etching apparatus 1100, the semispherical dielectric plate 59C can be reduced in thickness as compared with that formed by a flat plate, while a wafer 50 can be approached to a portion close to the dielectric plate 59C and the volume of the reaction 44 can be reduced when a part having high microwave strength is formed in the inner space of the semispherical dielectric plate 59C.

The dry etching apparatus 1100 is a non-ECR apparatus having no magnetic field forming means. Thus, the apparatus 1100 can be miniaturized and the cost therefor can be reduced.

While the dischargeable minimum pressure is increased to exceed about 100 mTorr as compared with the case of employing ECR plasma, uniformity of plasma is excellent for effectively processing a wafer having a large diameter.

<J-4. Modification 2>

Figure 40:
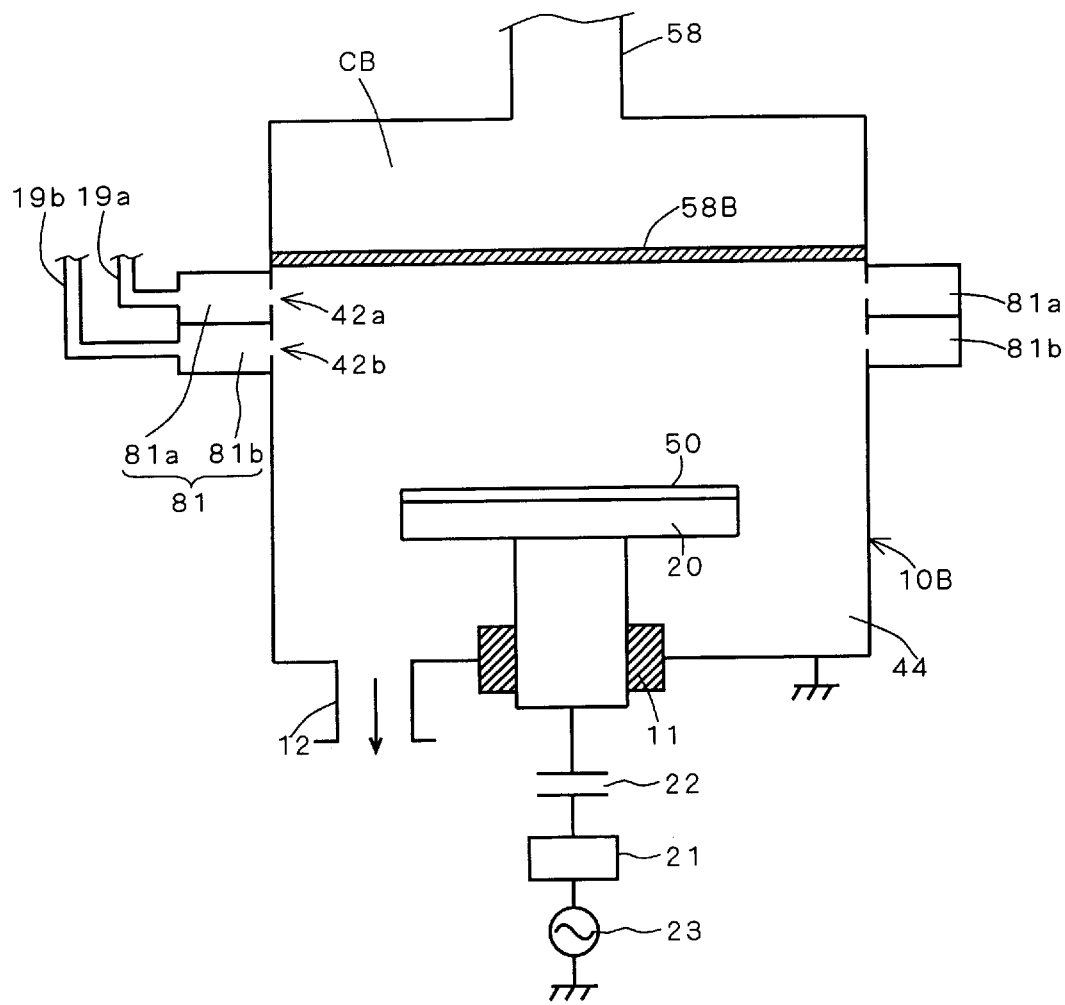

An effect similar to the above can be attained also in a structure deleting the magnetic field forming means from the dry etching apparatus 1000 described with reference to FIG. 37. FIG. 40 shows a dry etching apparatus 1000A having such a structure. This apparatus 1000A is a non-ECR apparatus, and hence the dischargeable minimum pressure is increased as compared with the case of employing ECR plasma to exceed about 100 mTorr, while uniformity of plasma is improved.

<K. Embodiment 11>

In the gas pulse supply systems GL1 and GL2 of the dry etching apparatus 100 described with reference to FIG. 1, for example, change of the gas flow rates resulting from fluctuation of back pressures of the pulse gas valves is apprehended in addition to the aforementioned backflow phenomenon of the gases depending on small difference between the pressures and open/close timings of the valve operations.

If the back pressure of any pulse gas valve increases due to some cause, the amount of the gas introduced into the reaction chamber from this pulse gas valve is increased to consequently increase the pressure of the reaction chamber beyond a prescribed set value. In dry etching, pressure fluctuation during processing causes fluctuation of plasma conditions to change etching reaction.

While the dry etching apparatus 100 operates the gas pressure regulator on the basis of the pressure detected by the pressure detector for regulating the gas pressure, the pulse gas valve performs a high-speed operation of a millisecond level as shown in FIG. 5 and hence there is such a possibility that a time lag occurs in pressure regulation to cause insufficient control.

A structure for preventing a pulse gas valve from back pressure fluctuation and stably pulsatively supplying a gas is now described with reference to FIG. 41.

<K-1. Structure of Apparatus>

Figure 41:
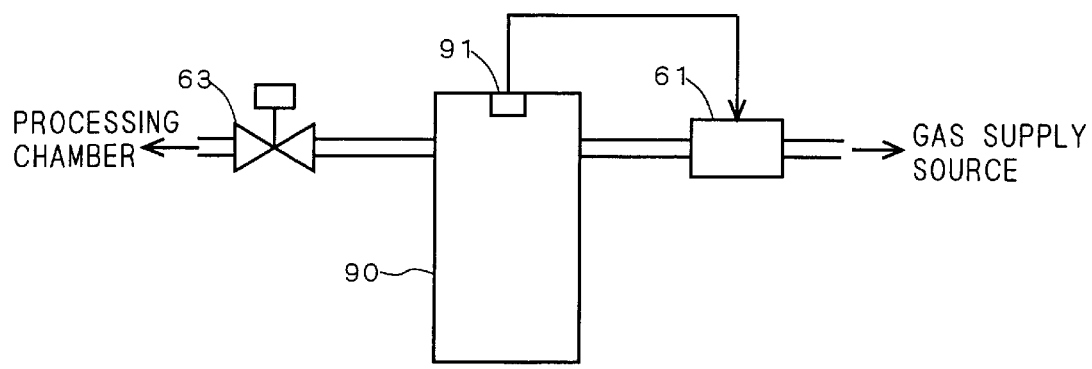
FIG. 41 illustrates the structure of gas supply means of a plasma processing apparatus according to an embodiment 11 of the present invention.

FIG. 41 illustrates a partial structure of a gas pulse supply system, which comprises a reservoir tank (air storage chamber) 90 for preventing back pressure fluctuation provided upstream (gas supply source side) a pulse gas valve 63 and a gas pressure regulator 61 provided further upstream. A mass flow meter may be arranged between the reservoir tank 90 and the gas pressure regulator 61.

The function of the reservoir tank 90 is now described. A gas supplied from a gas supply source (not shown) passes through the gas pressure regulator 61 and is stored in the reservoir tank 90.

At this time, the pressure in the reservoir tank 90 is detected by a pressure detector 91 mounted on the reservoir tank 90 and fed back to the gas pressure regulator 61, which in turn performs pressure regulation so that the pressure in the reservoir tank 90 reaches a prescribed value.

<K-2. Function/Effect>

The reservoir tank 90 is structured to have a sufficiently large volume as compared with the flow rate of the gas flowing through the pulse gas valve 63. In other words, the volume of the reservoir tank 90 is set to about 100 times the gas flow rate necessary for etching. If the pulse gas valve 63 pulsatively feeds the gas at about 10 to 100 sccm, for example, the volume of the reservoir tank 90 is set to exceed several liters. Therefore, the back pressure of the pulse gas valve 63 hardly changes, the flow rate of the gas introduced into a processing chamber from the pulse gas valve 63 can be maintained under prescribed conditions, and dry etching can be stably performed while maintaining the pressure in the processing chamber under prescribed conditions.

<L. Embodiment 12>

As described with reference to the embodiment 1, for example, the pressure of the reaction chamber 44 of the processing chamber 10 remarkably fluctuates as shown in FIG. 3 when pulsatively introducing gases into the processing chamber 10. The impedance of the plasma also remarkably fluctuates in synchronization with this. In general, the impedance matching apparatus 21 mechanically performs an automatic matching operation and hence may be incapable of following the cycle of impedance fluctuation, i.e., the ON/OFF cycle of the pulse gas valves. Therefore, reflection of RF power may be caused by impedance. mismatching to fluctuate the etching conditions or restrict the process conditions, or reflection of RF power may be excessively increased to stop the apparatus by an interlock mechanism.

Even if automatic matching can be performed in coincidence with the ON/OFF cycle of the pulse gas valves, the impedance matching apparatus 21 performs impedance matching by changing its internal control elements for capacitance (C) and inductance (L) by mechanically switching the same or the like and the operation of periodically switching these components at a high speed leads to a malfunction caused by wear of these components or reduction of the life of the impedance matching apparatus 21.

<L-1. Operation>

A method of stably performing impedance matching is now described with reference to FIGS. 42A to 42C.

Figure 42:
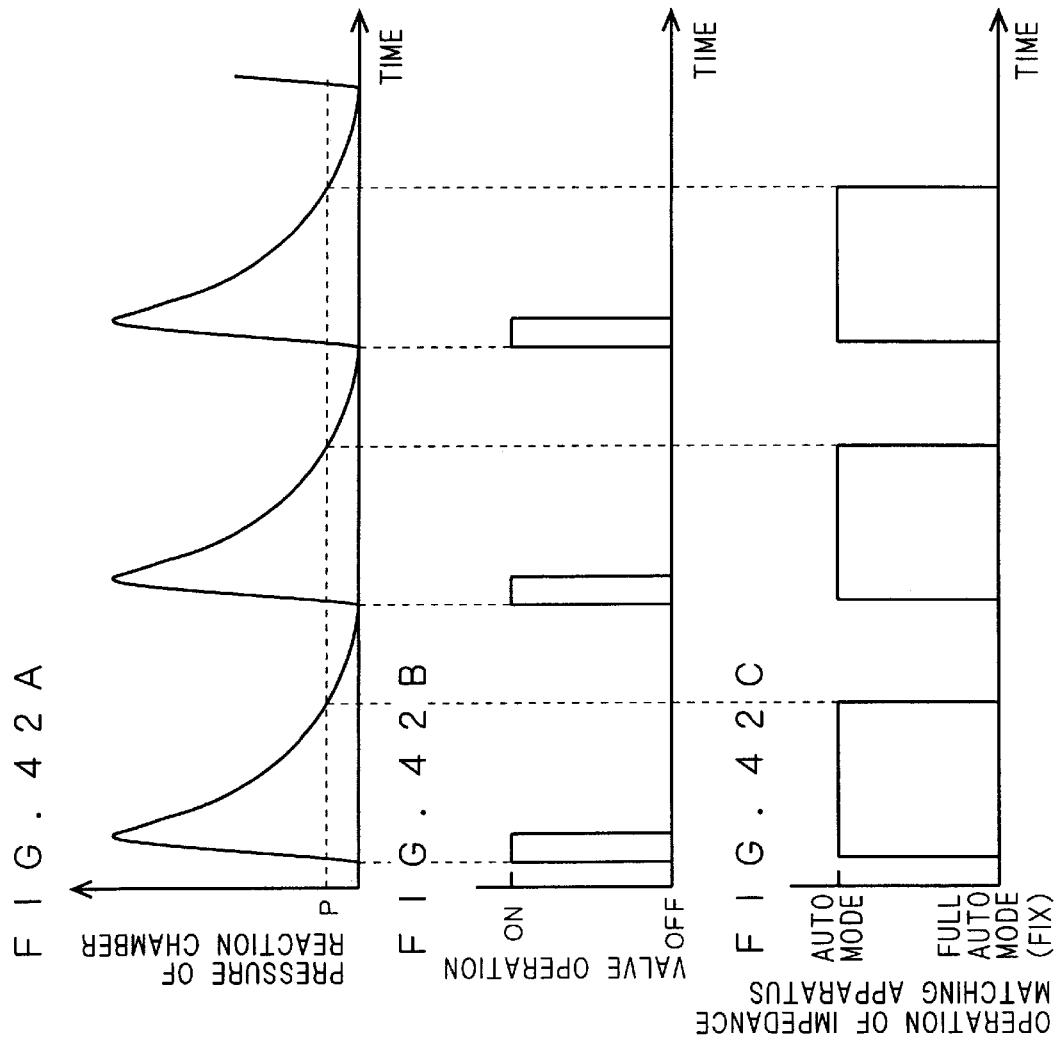
FIGS. 42A to 42C illustrate an impedance matching operation of a plasma processing apparatus according to an embodiment 12 of the present invention.

FIG. 42A shows pressure change of a reaction chamber, FIG. 42B shows an exemplary operation timing for a pulse gas valve, and FIG. 42C shows a control mode of an impedance matching apparatus.

While the impedance matching apparatus is used in an automatic mode (auto mode), the pressure of a reaction chamber 44 is monitored for switching the automatic mode of the impedance matching apparatus to a manual mode in a stage where the pulse gas valve is turned off, introduction of a gas into a processing chamber (i.e., a buffer chamber) is ended and the pressure in the reaction chamber is reduced to about the lower limit for maintaining discharge for stopping the matching operation. In other words, the impedance matching apparatus is switched to the manual mode when the pressure in the reaction chamber reaches a switching pressure P shown by a broken line in FIG. 42A, and C and L are fixed to values corresponding to the impedance of plasma at this point of time.

When the pulse gas valve is turned on and the pressure of the reaction chamber 44 reaches the switching pressure P, the impedance matching apparatus is set in the automatic mode.

<L-2. Function/Effect>

Thus, by performing control of providing a dead time performing no automatic impedance matching, it is possible to such a malfunction that the pressure in the reaction chamber is reduced to cause difficulty in maintenance of discharge and automatic control of the impedance matching apparatus is disabled or impedance change is so quick that the automatic matching operation of the impedance matching apparatus cannot follow but enters an uncontrollable state and control elements for C and L operate up to control limits.

Also when the pulse gas valve is turned on again to increase the pressure in the processing chamber, therefore, the impedance matching operation is readily performed at a high speed to prevent inconvenience in etching.

The control elements for C and L in the impedance matching apparatus are not driven up to the control limits, whereby mechanical operation ranges of the control elements are narrowed, damage is reduced and the life can be extended.

When switching the impedance matching apparatus to the manual mode, the pressure in the processing chamber is reduced also after stoppage of the matching operation and hence reflection of RF power results from impedance mismatching. When performing switching in a region where the gas pressure is low and time change of the pressure is small, etching hardly progresses in a metal wire of aluminum or the like mainly directed to chemical reaction, for example, and reaction products are discharged to cause no problem in etching. The switching pressure P shown by the broken line in FIG. 42A is set to about 2 mTorr, for example.

<L-3. Modification>

While C and L are fixed at values corresponding to the impedance of the plasma at the time when the impedance matching apparatus is switched to the manual mode in the aforementioned method of controlling the impedance matching apparatus, C and L may alternatively be switched to predetermined values when switching the impedance matching apparatus to the manual mode.

By performing such control, stable etching can be implemented while preventing the control elements for C and L in the impedance matching apparatus from damage.

<M. Embodiment 13>

In the dry etching apparatus 100 described with reference to the embodiment 1, for example, RF power applied to the reaction chamber 44 from the RF power source 23 is generally subjected to impedance matching by the impedance matching apparatus 21 and supplied to the plasma with no reflection. In the present invention, however, the gases are pulsatively introduced into the reaction chamber 10 and the pressure of the reaction chamber 44 in the processing chamber 10 remarkably fluctuates at a high speed (second order). The impedance of the plasma also remarkably fluctuates in synchronization with this, and hence the impedance matching apparatus 21 cannot follow the cycle of the impedance fluctuation, i.e., the ON/OFF cycle of the pulse gas valves and reflection of the RF power takes place. Since the impedance fluctuation is a high-speed phenomenon of second order, RF reflection also fluctuates at the same degree of speed and it is difficult to correctly estimate the RF power (=RF output - RF reflection) applied to the plasma.

An RF power measuring system capable of correctly recognizing RF power applied into plasma is now described with reference to FIG. 43.

Figure 43:
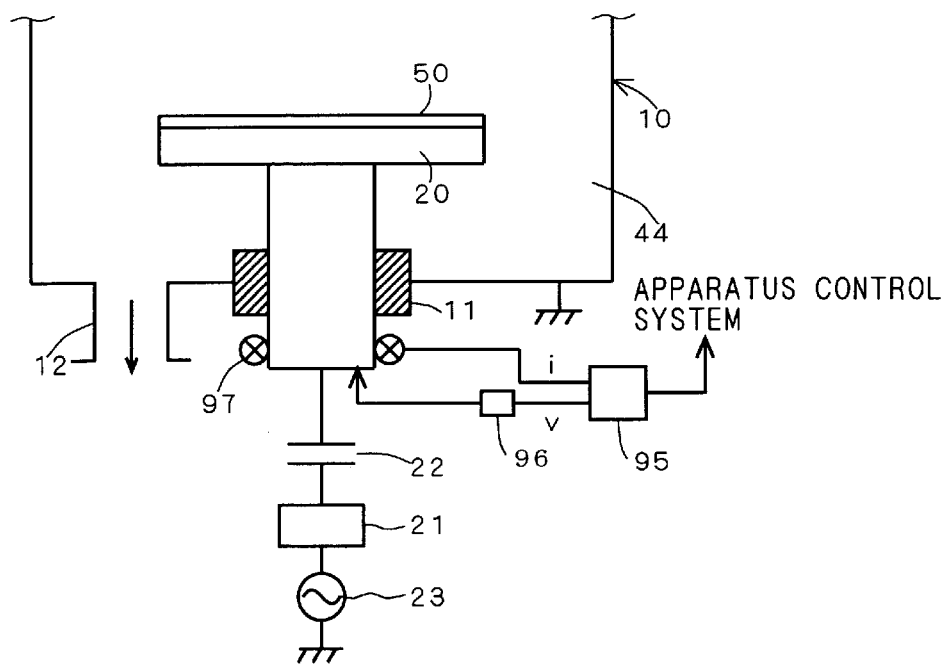
FIG. 43 illustrates RF power measuring means of a plasma processing apparatus according to an embodiment 13 of the present invention.

FIG. 43 is a schematic diagram showing the structure of this system. A current measurer 97 and a voltage measurer 96 are mounted on a high-frequency electrode 20 exposed outside a processing chamber 10. The current measurer 97 and the voltage measurer 96 may alternatively provided in the processing chamber 10. A current i and a voltage v output from the measurers are input in an integral unit 95, to regard a value integrated by the integral unit 95 as RF power applied to plasma. Correct etching can be implemented by supplying this value to a control system of a dry etching apparatus 100 as a control parameter.

The current measurer 97 can be formed by a Rogowskii coil or a CT (current transformer), for example, for measuring an RF current by detecting a magnetic field caused by flow of the RF current.

The voltage measurer 96 is formed by a voltage probe having partial pressure resistance or the like.

<N. Embodiment 14>

As described with reference to the embodiment 1, ending of etching is generally determined through change of emission from active species in the plasma.

While an aluminum alloy film is present as the object of etching, radicals of aluminum are present in the plasma and emit light when making transition to a ground state. The wavelength thereof is 396.2 nm, and the photodetector 70 mounted on the detection window 72 (see FIG. 1) of the processing chamber 10 detects the intensity of this light. When the etching ends and the aluminum alloy film to be etched disappears, the emission intensity of the radicals of aluminum is reduced and hence ending of etching can be determined on the basis of change of the emission intensity such as the amount of change, the rate of change or the like, for example.

In the present invention, however, the gases are pulsatively supplied to the reaction chamber 44 and hence the etching reaction substantially stops when supply of the gases is stopped and the pressure in the reaction chamber 44 is reduced. Therefore, emission from the active species in the plasma is reduced to cause difficulty in determination of ending of etching.

An etching end determination system enabling stable etching end determination with no influence by periodic fluctuation of emission is described with reference to FIGS. 44 to 46.

<N-1. Structure of Apparatus>

Figure 44:
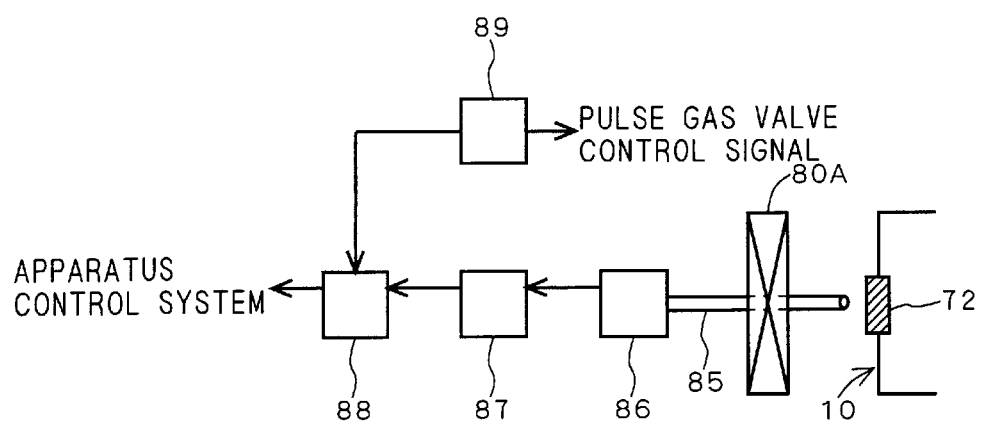
FIG. 44 illustrates a plasma end point determination system of a plasma processing apparatus according to an embodiment 14 of the present invention.

FIG. 44 is a schematic diagram showing the system mounted on the dry etching apparatus 400. An optical fiber 85 is mounted on the detection window 72 of the processing chamber 10, for guiding emission from plasma to a spectroscope 86. The emission from the plasma may alternatively be guided to the spectroscope 86 by an optical system employing a lens, a mirror or the like in place of the optical fiber 85.

An output of the spectroscope 86 is supplied to and amplified by a photomultiplier 87, and supplied to an etching end point determiner 88. An output from the photomultiplier 87 periodically fluctuates as described above.

The etching end point determiner 88 captures emission from plasma on the basis of a pulse signal output from a pulse generator 89 supplying pulse signals to the valve drivers 64a and 64b driving the pulse gas valves 63a and 63b. Therefore, reduction of emission intensity following ending of etching can be detected by adjusting the capture time width with no influence by change of emission intensity from the plasma. Exemplary capture timings are now described with reference to FIGS. 45A, 45B and 46A to 46E.

<N-2. Operation>

Figure 45A:
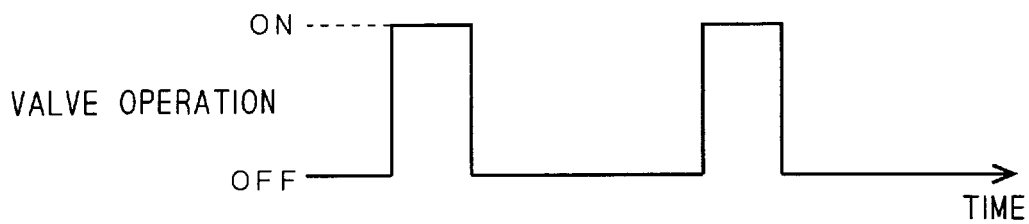
FIGS. 45A, 45B and 46A to 46E are timing charts illustrating a plasma end point determination operation.
Figure 45B:
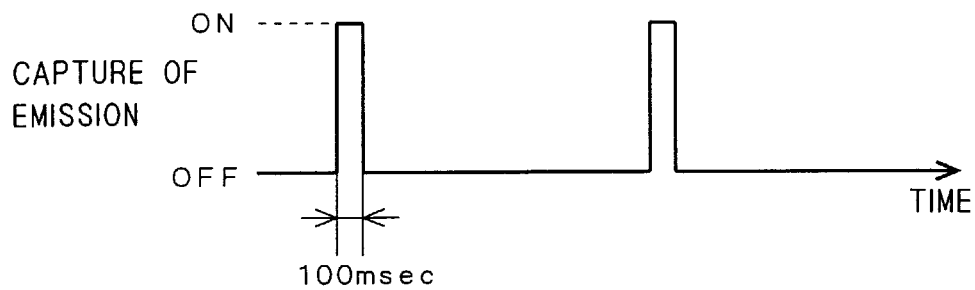

FIG. 45A shows the pulse signal from the pulse generator 89, i.e., an operation timing for the pulse gas valves, and FIG. 45B shows a capture timing of the etching end point determiner 88.

FIG. 44 shows an example capturing emission from the plasma in synchronization with the pulse signal from the pulse generator 89, and the capture time width is set to 100 msec.

The etching end point can be more correctly determined by capturing a signal through a slight delay time from the pulse signal from the pulse generator 89. This example is described with reference to FIGS. 46A to 46E.

Figure 46A:
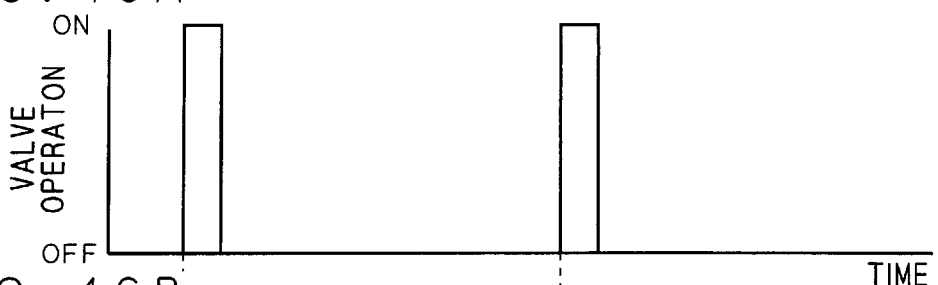
Figure 46B:
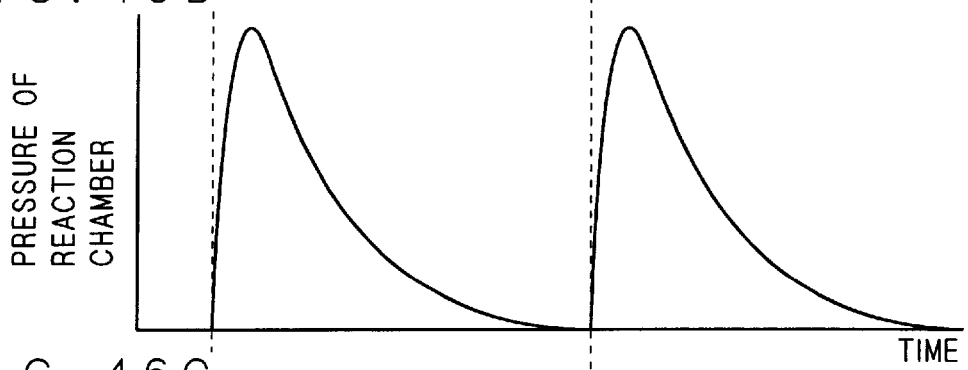
Figure 46C:
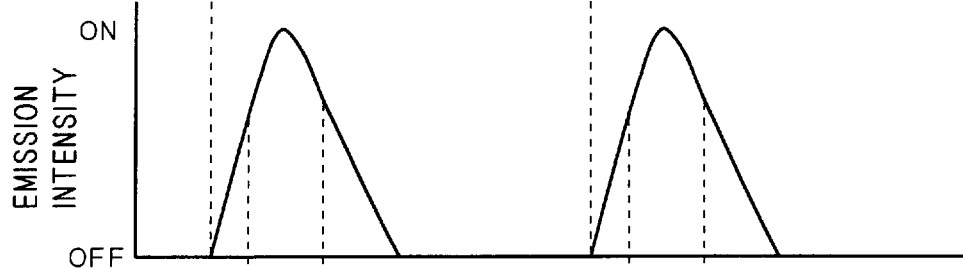
Figure 46D:
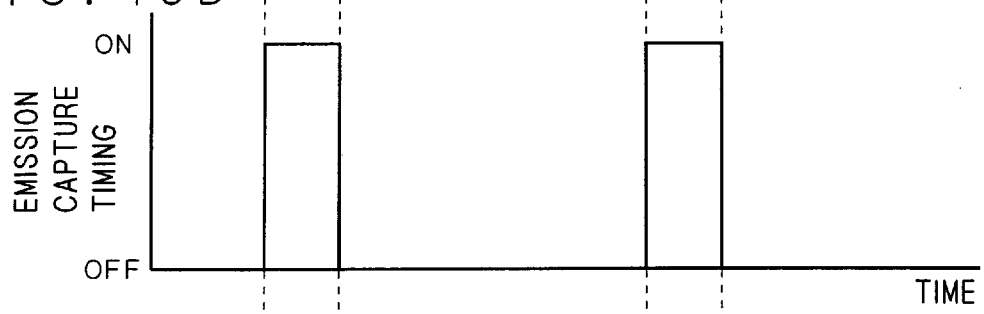
Figure 46E:
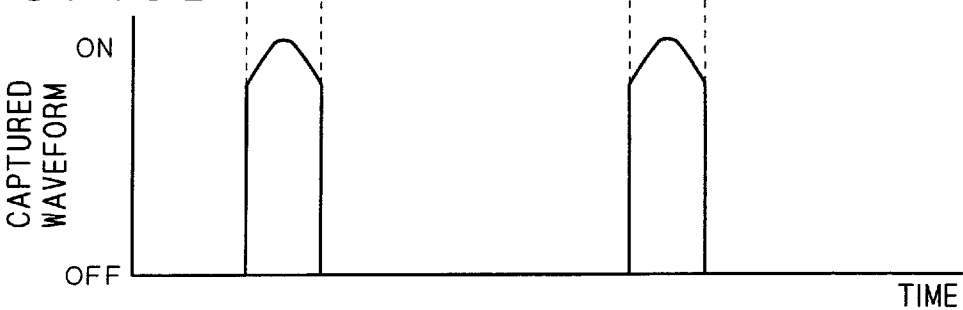

FIG. 46A shows the pulse signal from the pulse generator 89, i.e., an operation timing for the pulse gas valves, FIG. 46B shows the gas pressure in the reaction chamber 44, FIG. 46C shows emission intensity of the plasma, FIG. 46D shows a capture timing of the etching end point determiner 88, and FIG. 46E shows the waveform of the captured emission intensity signal. Etching end determination is performed by calculating a mean time value from an integral value of the emission intensity signal shown in FIG. 46E or detecting a peak value of the signal. The etching end point determiner 88 is formed by a personal computer or the like, and etching end determination can be performed by software data processing.

When there is a time difference between introduction of the etching gases into the processing chamber by turning on the pulse gas valves and actual starting of etching, peaks of the emission intensity deviate from the time when turning on the pulse gas valves, as shown in FIG. 46C.

Therefore, an emission intensity signal close to the peaks of the emission intensity can be obtained as shown in FIG. 46E by capturing the signal in a delay by a prescribed time from the pulse signal from the pulse generator 89 as shown in FIG. 46D, for enabling more correct etching end point determination.

<N-3. Modification>

Etching end point determination by the etching end point determiner 88 is enabled by change of the emission signal intensity from active species in addition to level determination by reduction or increase of the emission signal intensity from the active species described above, and it is also possible to make determination by a differential waveform or a secondary differential waveform of the signal.

While the system shown in FIG. 44 employs a single spectroscope and performs etching end point determination from change of a single type of wavelength, it is also possible to employ a plurality of spectroscopes for making etching end point determination from change of a plurality of wavelengths. If the emission intensity of a certain wavelength increases at an end point of etching, for example, accuracy of end point determination can be improved by obtaining the product with an emission intensity signal having a wavelength reduced at the end point.

While the aforementioned determination method is applied when ON timings of gases are synchronized whether a single type or a plurality of types of gases are employed, a main etching gas may be selected when a plurality of types of gases are employed with different ON timings, for making etching end point determination in synchronization with the ON timing for the gas.

In general, halogen gas such as fluorine or chlorine corresponds to the main etching gas, such that chlorine gas corresponds to it in the case of etching an aluminum wire, for example, and $SF_6$ gas corresponds to it in the case of etching a tungsten wire.

While emission detection means is described with reference to combination of the spectroscope 86 and the photomultiplier 87 in this embodiment, other detection means is also employable. For example, no high-voltage power source necessary for a photomultiplier is required and a low-priced detection system can be constructed by employing an interference filter and an Si photodiode, for example.

While the invention has been shown and described in detail, the foregoing description is in all aspects illustrative and not restrictive. It is therefore understood that numerous modifications and variations can be devised without departing from the scope of the invention.

What is claimed is:

1. A plasma processing apparatus comprising:
a reaction chamber generating a plasma and storing an object for processing said object with said plasma;
a buffer chamber separated from said reaction chamber through a partition wall; and
a gas supply system supplying a gas to said buffer chamber, wherein
said gas supply system has a pulse gas valve pulsatively controlling supply and stoppage of supply of said gas, and
said partition wall has a plurality of gas feeding holes passing said gas therethrough,
for pulsatively supplying said gas from said buffer chamber into said reaction chamber through said plurality of gas feeding holes by operation of said pulse gas valve, generating said plasma in said reaction chamber and processing said object.

2. The plasma processing apparatus according to claim 1, wherein said partition wall is arranged to face a mounting base for mounting said object.

3. The plasma processing apparatus according to claim 2, wherein said partition wall is formed by a conductor, and said plasma is generated by a high frequency applied between said mounting base and said partition wall using as electrodes.

4. The plasma processing apparatus according to claim 3, further comprising magnetic field forming means arranged to form a magnetic field having a component perpendicular to the electric field direction of said high frequency.

5. The plasma processing apparatus according to claim 3, having an automatic impedance matching apparatus connected with a high-frequency power source supplying said high frequency, wherein
said automatic impedance matching apparatus operates to have a dead time performing no impedance matching operation for said high frequency.

6. The plasma processing apparatus according to claim 5, wherein
said dead time is provided in correspondence to a period when the pressure of said reaction chamber is not more than a threshold level.

7. The plasma processing apparatus according to claim 3, having current measuring means and voltage measuring means measuring an output current and an output voltage of a high-frequency power source supplying said high frequency,
for controlling high-frequency power generating said plasma on the basis of an integral value of the product of said output current and said output voltage per unit time.

8. The plasma processing apparatus according to claim 2, further comprising:
a ring-shaped dielectric plate arranged to form part of a reaction chamber side wall perpendicular to said mounting base for mounting said object, and
a high-frequency coil wound on the outer periphery of said dielectric plate, wherein
said plasma is generated by an induction field induced on the inner side of said dielectric plate.

9. The plasma processing apparatus according to claim 8, having an automatic impedance matching apparatus connected with a high-frequency power source supplying said high frequency, wherein
said automatic impedance matching apparatus operates to have a dead time performing no impedance matching operation for said high frequency.

10. The plasma processing apparatus according to claim 9, wherein
said dead time is provided in correspondence to a period when the pressure of said reaction chamber is not more than a threshold level.

11. The plasma processing apparatus according to claim 8, having current measuring means and voltage measuring means measuring an output current and an output voltage of a high-frequency power source supplying said high frequency,
for controlling high-frequency power generating said plasma on the basis of an integral value of the product of said output current and said output voltage per unit time.

12. The plasma processing apparatus according to claim 2, further comprising:
a ring-shaped dielectric plate arranged to form part of a reaction chamber side wall perpendicular to said mounting base for mounting said object, and
a ring-shaped waveguide arranged to cover at least said dielectric plate, wherein
said plasma is generated by a microwave supplied to said waveguide.

13. The plasma processing apparatus according to claim 12, wherein
said waveguide also covers a ring-shaped conductor plate arranged to form part of said reaction chamber side wall along with said dielectric plate.

14. The plasma processing apparatus according to claim 12, wherein
said waveguide also covers part of said reaction chamber side wall along with said dielectric plate.

15. The plasma processing apparatus according to claim 1, wherein
said buffer chamber is formed by a plurality of independent buffer chambers, and
said plurality of independent buffer chambers are arranged to cover previously separated said plurality of gas feeding holes every section.

16. The plasma processing apparatus according to claim 15, wherein
said plurality of gas feeding holes are concentrically arranged in a plurality of lines inclusive of the feeding hole at the center of said partition wall, and
said plurality of independent buffer chambers include:
a first independent buffer chamber arranged to cover alternate ones of said concentric lines of said gas feeding holes, and
a second independent buffer chamber covering said first independent buffer chamber and said plurality of gas feeding holes not covered with said first independent buffer chamber together.

17. The plasma processing apparatus according to claim 15, wherein
said plurality of independent buffer chambers are arranged in one-to-one correspondence to said plurality of gas feeding holes.

18. The plasma processing apparatus according to claim 1, wherein
said buffer chamber is arranged to enclose a reaction chamber side wall perpendicular to a mounting base for mounting said object, and
said partition wall forms part of said reaction chamber side wall.

19. The plasma processing apparatus according to claim 18, further comprising:
   a dielectric plate arranged to form part of a reaction chamber upper wall facing said mounting base for mounting said object, and
   a waveguide arranged to cover at least said dielectric plate, wherein
   said plasma is generated by a microwave supplied to said waveguide.

20. The plasma processing apparatus according to claim 19, further comprising magnetic field forming means arranged to form a magnetic field having a component perpendicular to an electric field direction of said microwave.

21. The plasma processing apparatus according to claim 19, wherein
   reaction chamber upper wall facing said mounting base for mounting said object is formed by a dielectric plate,
   said plasma processing apparatus further comprising a cavity resonance chamber arranged to cover said dielectric plate and having an inlet for a microwave on a position facing said dielectric plate.

22. The plasma processing apparatus according to claim 21, further comprising magnetic field forming means arranged to form a magnetic field having a component perpendicular to an electric field direction of said microwave.

23. The plasma processing apparatus according to claim 18, wherein
   said gas includes a plurality of types of gases, and
   said buffer chamber is arranged in a number responsive to the number of the types of said gases.

24. The plasma processing apparatus according to claim 1, wherein
   said gas supply system further includes an air storage chamber arranged on an upstream position in the vicinity of said pulse gas valve for temporarily storing said gas.

25. The plasma processing apparatus according to claim 24, wherein
   said gas supply system further includes a gas pressure regulator arranged upstream said air storage chamber for regulating the gas pressure on the basis of the gas pressure of said air storage chamber.

26. The plasma processing apparatus according to claim 1, wherein
   said gas includes a plurality of types of gases, and
   said gas supply system is arranged in a plurality of systems in correspondence to said plurality of types of gases,
   said plasma processing apparatus further including gas backflow prevention means downstream of said pulse gas valve every said plurality of gas supply systems.

27. The plasma processing apparatus according to claim 1, wherein
   said gas supply system further includes heating means heating a gas pipe between said pulse gas valve and said buffer chamber.

28. The plasma processing apparatus according to claim 1, further comprising:
   a light transmission window arranged on a reaction chamber side wall perpendicular to a mounting base for mounting said object,
   a photodetector capturing radiation from said plasma through said light transmission window and detecting the intensity of a light of a wavelength, and
   plasma processing end determination means determining ending of plasma processing on the basis of an output from said photodetector, wherein
   said plasma processing end determination means determines ending of said plasma processing in synchronization with at least one of an ON operation of said pulse gas valve and on the basis of a mean value of the intensity of light during a period from a detection start point for the intensity of said light of said wavelength after a lapse of a time from said ON operation.

29. A plasma processing method using a reaction chamber generating a plasma and storing an object for performing processing with said plasma on said object, a buffer chamber separated from said reaction chamber through a partition wall and a gas supply system supplying a gas to said buffer chamber, comprising the steps of:
   supplying said gas from said buffer chamber to said reaction chamber through a plurality of gas feeding holes provided on said partition wall;
   generating said plasma in said reaction chamber and processing said object,
   wherein said step of supplying said gas comprises the step of:
   (a) pulsatively introducing said gas into said buffer chamber so that a pressure fluctuation area of said reaction chamber is between 0.1 mTorr and 200 mTorr.

30. The plasma processing method according to claim 29, wherein said gas is periodically supplied to said buffer chamber at time intervals, and said step (a) includes a step of performing flow rate control of said gas on the basis of an integral value per unit time.

31. The plasma processing method according to claim 29, wherein
   said gas includes a plurality of types of gases,
   said method further comprising a step of:
   (b) continuously introducing at least one type of gas among said plurality of gases into said buffer chamber.

32. The plasma processing method according to claim 29, wherein
   said gas includes a plurality of types of gases, and
   said step (a) includes a step of synchronously starting and stopping introduction of said plurality of types of gases.

33. The plasma processing method according to claim 32, wherein
   said step (a) includes a step of introducing all said plurality of types of gases in the same period.

34. The plasma processing method according to claim 32, wherein
   said step (a) includes a step of introducing said plurality of types of gases in periods varying with said gases.

35. The plasma processing method according to claim 29, wherein said gas includes a plurality of types of gases, and
   said step (a) includes a step of synchronously performing only starting of introduction of said plurality of types of gases.

36. The plasma processing method according to claim 35, wherein
   said step (a) includes a step of introducing all said plurality of types of gases in the same period.

37. The plasma processing method according to claim 35, wherein
said step (a) includes a step of introducing said plurality of types of gases in periods varying with said gases.

38. The plasma processing method according to claim 29, wherein
said gas includes a plurality of types of gases, and
said step (a) includes a step of asynchronously performing starting and stoppage of introduction of said plurality of types of gases.

39. The plasma processing method according to claim 38, wherein
said step (a) includes a step of introducing all said plurality of types of gases in the same period.

40. The plasma processing method according to claim 38, wherein
said step (a) includes a step of introducing said plurality of types of gases in periods varying with said gases.

* * * * *